(12) United States Patent  
Fukuhara et al.

(10) Patent No.: US 7,666,574 B2  
(45) Date of Patent: Feb. 23, 2010

(54) POSITIVE RESIST COMPOSITION AND PATTERN FORMING METHOD

(75) Inventors: Toshiaki Fukuhara, Shizuoka (JP); Shinichi Kanna, Shizuoka (JP); Hiromi Kanda, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/058,327

(22) Filed: Mar. 28, 2008

(65) Prior Publication Data

US 2008/0241746 A1 Oct. 2, 2008

(30) Foreign Application Priority Data

Mar. 28, 2007 (JP) ............................. 2007-085988  
Mar. 24, 2008 (JP) ............................. 2008-076600

(51) Int. Cl.  
*G03F 7/004* (2006.01)  
*G03F 7/30* (2006.01)

(52) U.S. Cl. .................... 430/270.1; 430/326; 430/905; 430/910

(58) Field of Classification Search .............. 430/270.1, 430/326, 905, 910  
See application file for complete search history.

(56) References Cited

U.S. PATENT DOCUMENTS

2004/0063024 A1 4/2004 Khojasteh et al.  
2006/0269871 A1 11/2006 Harada et al.

FOREIGN PATENT DOCUMENTS

| EP | 1367440 A2 | 12/2003 |
| EP | 1598704 A2 | 11/2005 |
| EP | 1764652 A2 | 3/2007 |
| JP | 57-153433 A | 9/1982 |
| JP | 2002-303978 A | 10/2002 |
| WO | WO 2004/068242 A1 | 8/2004 |
| WO | WO 2005/003198 A1 | 1/2005 |

OTHER PUBLICATIONS

B. J. Lin, "Semiconductor Foundry, Lithography, and Partners", Proc. SPIE, Emerging Lithographic Technologies VI, 2002, pp. 11-24, vol. 4688.  
J.A. Hoffnagle, et al., "Liquid Immersion Deep-Ultraviolet Interferometric Lithography", J. Vac. Sci. Techonol. B, Nov./Dec. 1999, pp. 3306-3309, vol. 17, No. 6, American Vacuum Society.  
Hiroshi Ito, et al., "Dissolution/Swelling Behavior of Cycloolefin Polymers in Aqueous Base", Advances in Resist Technology and Processing XVII, 2000, pp. 2-12, Proceedings of SPIE.  
Extended European Search Report dated Aug. 14, 2008.

*Primary Examiner*—John S Chu  
(74) *Attorney, Agent, or Firm*—Sughrue Mion, PLLC

(57) ABSTRACT

A positive photosensitive composition comprises
- (A) a resin that has an acid decomposable repeating unit represented by formula (I) and increases its solubility in an alkali developer by action of an acid;
- (B) a compound generating an acid in irradiation with actinic light or radiation;
- (C) a resin that contains neither fluorine nor silicon and has a repeating unit having the predetermined structure; and
- (D) a solvent,

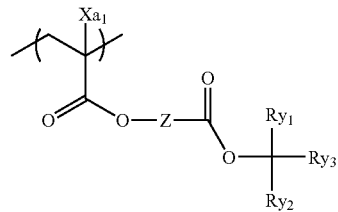

(I)

wherein each symbol represents a predetermined group.

10 Claims, 1 Drawing Sheet

FIG. 1
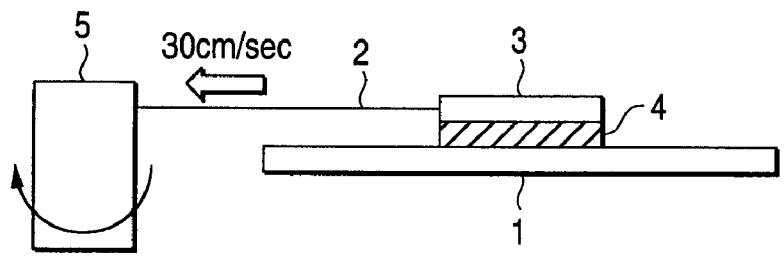
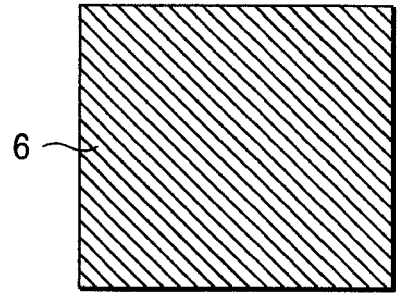
FIG. 2A
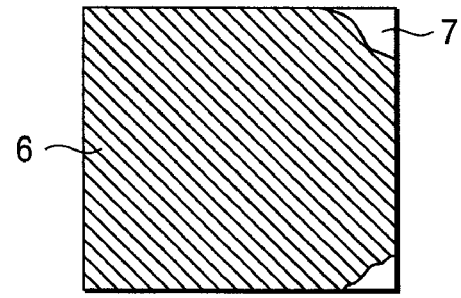
FIG. 2B
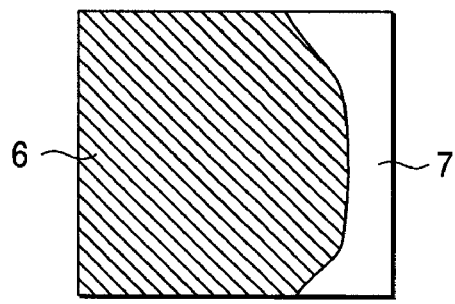
FIG. 2C
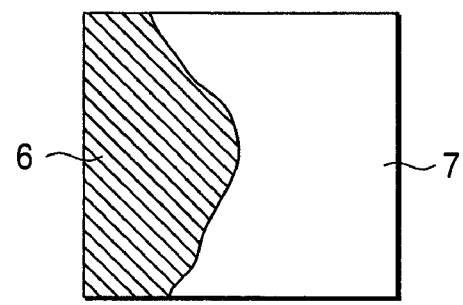
FIG. 2D

POSITIVE RESIST COMPOSITION AND PATTERN FORMING METHOD

BACKGROUND OF THE INVENTION

1. Field of the Invention

The present invention relates to a positive resist composition for use in fabrication steps of semiconductors such as ICs, production of circuit boards for liquid crystals, thermal heads, etc., and lithographic steps of other photoapplications, and a pattern forming method using the composition. In particular, the invention relates to a positive resist composition suited for exposure with an immersion type projection exposure apparatus employing far ultraviolet light having a wavelength of 300 nm or less as an exposure light, and a pattern forming method using the composition.

2. Description of the Related Art

The trend toward miniaturization of semiconductor elements has lead to a decrease in the wavelength of exposure lights and an increase in the numerical aperture (NA) of projection lenses. As a result, an exposure apparatus which has an NA of 0.84 and employs an ArF excimer laser having a wavelength of 193 nm as a light source has been developed. As is generally well known, resolution and focal depth can be expressed by the following equations:

$$(\text{Resolution}) = k_1 \cdot (\lambda/NA)$$

$$(\text{Focal depth}) = \pm k_2 \cdot \lambda/NA^2$$

wherein λ is the wavelength of the exposure light, NA is the numerical aperture of the projection lens, and $k_1$ and $k_2$ are coefficients relating to the process.

For achieving enhanced resolution by further reduction in the wavelength, an exposure apparatus employing an $F_2$ excimer laser having a wavelength of 157 nm as a light source is under investigation. Since materials for the lens to be used in the exposure apparatus and materials for resists are limited strictly, however, it is very difficult to stabilize the manufacturing cost of the apparatus or material or stabilize their quality. There is hence a possibility that an exposure apparatus and a resist having sufficient performance and stability cannot be provided within a required period.

As a technique for enhancing resolution of an optical microscope, a so-called immersion method, that is, a method of filling a liquid with a high refractive index (which may hereinafter be called "immersion liquid") between the projection lens and the sample is known.

This "immersion" has the following effects. Assuming that the wavelength of the exposure light in air is $\lambda_0$, the refractive index of the immersion liquid relative to that of air is n, the convergence half angle of light is θ and $NA_0 = \sin \theta$, the resolution and the focal depth when immersion is performed can be expressed by the following equations:

$$(\text{Resolution}) = k_1 \cdot (\lambda_0/n)/NA_0$$

$$(\text{Focal depth}) = \pm k_2 \cdot (\lambda_0/n)/NA_0^2$$

This means that the immersion produces the same effect as the use of an exposure light having a wavelength of 1/n. In other words, supposing that optical projection systems equal in NA are employed, the focal depth can be made n times larger by the immersion.

This is valid in any pattern profile. The immersion can therefore be used in combination with a super resolution technique such as the phase shift method or off axis illumination method which are being studied now.

Examples of an apparatus which has utilized the above-described effect for the transfer of fine image patterns of semiconductor devices are described in JP-A-57-153433 and the like.

Recent progress in the immersion exposure technique is reported in *The Proceedings of The International Society for Optical Engineering (SPIE Proc.)*, 4688, 11(2002), *J. Vac. Sci. Technol.*, B 17(1999), *The Proceedings of The International Society for Optical Engineering (SPIE Proc.)*, 3999, 2(2000), etc. When an ArF excimer laser is used as a light source, pure water (refractive index at 193 nm: 1.44) is presumed to be most promising as an immersion liquid from the standpoints of safety in handling as well as transmittance and refractive index at 193 nm. A fluorine-containing solution is being studied as an immersion liquid for use in the exposure using an $F_2$ excimer laser as a light source in consideration of balance between transmittance and refractive index at 157 nm. An immersion liquid satisfactory in view of environmental safety and refractive index however has not yet been found. Judging from the degree of the effect of the immersion and the maturity of resist, the immersion exposure technique will be first utilized in ArF exposure apparatuses.

Since the advent of a resist for KrF excimer laser (248 nm), chemical amplification has been employed as an image forming method of a resist for compensating a reduction in the sensitivity caused by light absorption. The image forming method, for example, using positive chemical amplification is a method of exposing a resist to light to cause decomposition of an acid generator in the exposed portions and generate an acid, subjecting the resulting resist to post-exposure bake (PEB) to utilize the acid thus generated as a reaction catalyst to convert an alkali-insoluble group into an alkali-soluble group, and removing the exposed portions by alkali development. As a chemical amplification type resist composition, resist compositions obtained by mixing two or more resins having specific structures are proposed, for example, in WO2005/003198 and JP-A-2002-303978. Although resists for ArF excimer laser using the chemical amplification mechanism are have recently become major resists, they need improvement because pattern collapse occurs when they are exposed to light through a mask with a very fine mask size.

It has been pointed out that when a chemical amplification type resist is exposed to immersion exposure, the resist layer comes into contact with the immersion liquid during exposure, resulting in deterioration of the resist layer or emission, from the resist layer, of components adversely affecting on the immersion liquid. International Publication WO 2004/068242 describes an example of a change in resist performance caused by immersing a resist for ArF exposure in water before and after exposure, while pointing out that this change is a problem in immersion exposure.

In an immersion exposure process, exposure using a scanning type immersion exposure apparatus needs movement of the immersion liquid keeping pace with the movement of a lens. If not, the exposure speed decreases, which may adversely affect on the productivity. When the immersion liquid is water, the resist film is desired to be hydrophobic and have good followability of water.

In addition, it is actually difficult to find an appropriate combination of a resin, photoacid generator, additive and solvent capable of satisfying the integrated performance of a resist. In forming fine patterns with a line width of 100 nm or less, even if the resolution performance is excellent, collapse of line patterns occurs, which may lead to defects during fabrication of a device. There is therefore a demand for over-coming this collapse of patterns and reducing line edge roughness which will otherwise disturb formation of uniform line patterns.

The term "line edge roughness" means that line patterns of a resist and edge of the interface of a substrate are shaped irregularly in a direction vertical to the line direction due to properties of the resist. Such patterns viewed from right above seem to have an edge with concavities and convexities (approximately from ± several nm to ± several tens of nm). Since these concavities and convexities are transferred to the substrate in an etching step, large concavities and convexities may deteriorate electrical properties, resulting in a reduced yield.

SUMMARY OF THE INVENTION

An object of the invention is to provide a positive resist composition causing less line edge roughness due to normal exposure or immersion exposure and excellent in followability of water during immersion exposure; and a pattern forming method using the composition.

<1> A positive photosensitive composition comprising:

(A) a resin that has an acid decomposable repeating unit represented by formula (I) and increases its solubility in an alkali developer by action of an acid;

(B) a compound generating an acid in irradiation with actinic light or radiation;

(C) a resin that contains neither fluorine nor silicon and has at least one repeating unit selected from repeating units represented by formulas (C-I) to (C-III); and (D) a solvent,

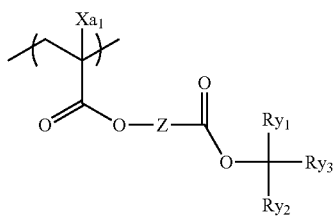
(I)

wherein, in the formula (I), $Xa_1$ represents a hydrogen atom, an alkyl group, a cyano group or a halogen atom, $Ry_1$ to $Ry_3$ each independently represents an alkyl group or a cycloalkyl group, and at least two of $Ry_1$ to $Ry_3$ may be coupled to form a ring structure, and Z represents a divalent linking group,

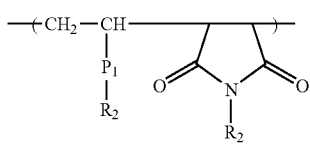
(C-I)

-continued

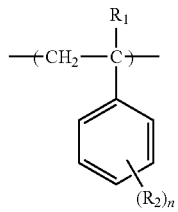
(C-II)

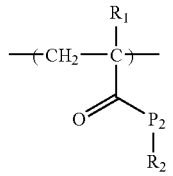
(C-III)

wherein, in the formulas (C-I) to (C-III), $R_1$s each independently represents a hydrogen atom or a methyl group, $R_2$s each independently represents a hydrocarbon group having at least one —$CH_3$ partial structure, $P_1$ represents a single bond or a linking group having an alkylene group, an ether group or two or more thereof, $P_2$ represents a linking group selected from —O—, —NR— (in which R represents a hydrogen atom or an alkyl group) and —$NHSO_2$—, and n stands for an integer from 1 to 4.

<2> A positive resist composition as described above in <1>, wherein Z in the formula (I) is a divalent linear hydrocarbon group or a divalent cyclic hydrocarbon group.

<3> A positive resist composition as described above in <1> or <2>, wherein the resin (A) further has a repeating unit having at least one group selected from a lactone group, a hydroxyl group, a cyano group and an acid group.

<4> A positive resist composition as described above in any one of <1> to <3>, wherein the compound (B) comprises a compound generating an acid represented by formula (BII):

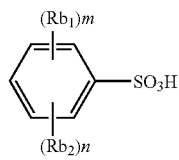
(BII)

wherein, in the formula (BII), $Rb_1$ represents a group having an electron withdrawing group, $Rb_2$ represents an organic group having no electron withdrawing group, m and n each stands for an integer from 0 to 5 with the proviso that m+n≦5, when m stands for 2 or greater, a plurality of $Rb_1$s may be the same or different, and when n stands for 2 or greater, a plurality of $Rb_2$s may be the same or different.

<5> A positive resist composition as described above in <4>, wherein in the formula (BII), m stands for from 1 to 5 and the electron withdrawing group of $Rb_1$ is at least one atom or group selected from a fluorine atom, a fluoroalkyl group, a nitro group, an ester group, and a cyano group.

<6> A positive resist composition as described above in any one of <1> to <5>, wherein the resin (C) further has a repeating unit represented by formula (C):

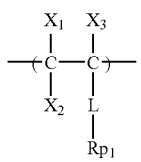

(C)

wherein, in the formula (C), $X_1$, $X_2$ and $X_3$ each independently represents a hydrogen atom, an alkyl group, or a halogen atom, L represents a single bond or a divalent linking group, and $Rp_1$ represents an acid decomposable group.

<7> A positive resist composition as described above in <6>, wherein the repeating unit represented by the formula (C) is a repeating unit represented by formula (C1).

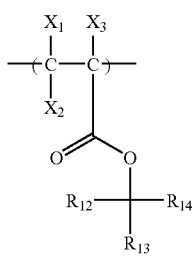

(C1)

wherein, in the formula (C1), $X_1$, $X_2$ and $X_3$ each independently represents a hydrogen atom, an alkyl group, or a halogen atom, and $R_{12}$, $R_{13}$ and $R_{14}$ each independently represents an alkyl group, a cycloalkyl group, an alkenyl group, or an aryl group with the proviso that at least one of $R_{12}$, $R_{13}$ and $R_{14}$ represents an alkyl group, or two of $R_{12}$, $R_{13}$ and $R_{14}$ may be coupled to form a ring.

<8> A positive resist composition as described above in any one of <1> to <7>, for use in exposure to light having a wavelength of 200 nm or less.

<9> A positive resist composition as described above in <4> or <5>, wherein in the formula (BII), the organic group of $Rb_2$ having no electron withdrawing group is a group having an alicyclic group.

<10> A positive resist composition as described above in any one of <1> to <9>, further comprising (E) a basic compound.

<11> A positive resist composition as described above in <10>, which contains at least one of 2,6-diisopropylaniline and tetrabutylammonium hydroxide as the basic compound (E).

<12> A positive resist composition as described above in any one of <1> to <11>, which contains at least one of propylene glycol monomethyl ether acetate, 2-heptanone and γ-butyrolactone as Solvent (D).

<13> A positive resist composition as described above in any one of <1> to <12>, further comprising (F) a surfactant.

<14> A pattern forming method comprising: forming a resist film with a positive resist composition as described above in any one of <1> to <13>; and exposing and developing the resist film.

<15> A pattern forming method as described above in <14>, wherein the resist film is exposed via an immersion liquid.

BRIEF DESCRIPTION OF THE DRAWINGS

FIG. 1 is a schematic view (side surface) relating to evaluation of followability of water; and FIG. 2A are 2D are schematic views (upper view) relating to evaluation of followability of water.

DETAILED DESCRIPTION OF THE INVENTION

The present invention will hereinafter be described specifically.

In this specification, when a group (atomic group) is indicated without specifying whether it is substituted or unsubstituted, the group embraces both of a group having no substituents and a group having a substituent. For example, the term "alkyl group" embraces not only an alkyl group having no substituent (unsubstituted alkyl group) but also an alkyl group having a substituent (substituted alkyl group).

(A) Resin that Increases its Solubility in an Alkali Developer by Action of an Acid The resin to be used in the positive photosensitive composition of the invention which increases its solubility in an alkali developer by action of an acid is a resin (which may be called "resin of Component (A)" having an acid decomposable repeating unit represented by the following formula (I):

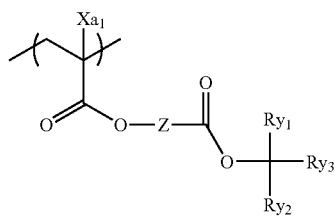

(I)

wherein, in the formula (I), $Xa_1$ represents a hydrogen atom, an alkyl group, a cyano group or a halogen atom, $Ry_1$ to $Ry_3$ each independently represents an alkyl group or a cycloalkyl group or at least two of $Ry_1$ to $R_{y3}$ may be coupled to form a monocyclic or polycyclic hydrocarbon structure, and Z represents a divalent linking group.

In the formula (I), the alkyl group of $Xa_1$ may be substituted with a hydroxyl group, halogen atom or the like. $Xa_1$ is preferably a hydrogen atom or a methyl group.

The alkyl group of $Ry_1$ to $Ry_3$ may be either a linear alkyl group or a branched alkyl group. It may have a substituent. Examples of the substituent which it may have include fluorine atom, chlorine atom, bromine atom, hydroxyl group, and cyano group. The linear or branched alkyl group is preferably a $C_{1-8}$ alkyl group, more preferably a $C_{1-4}$ alkyl group. Examples include methyl group, ethyl group, propyl group, isopropyl group, butyl group, isobutyl group and t-butyl group, with methyl and ethyl groups being preferred.

Examples of the cycloalkyl group of $Ry_1$ to $Ry_3$ include monocyclic $C_{3-8}$ cycloalkyl groups and polycyclic $C_{7-14}$ cycloalkyl groups. They may have a substituent. Preferred examples of the monocyclic cycloalkyl group include cyclopentyl group, cyclohexyl group and cyclopropyl group. Preferred examples of the polycyclic cycloalkyl group include adamantyl group, norbornane group, tetracyclododecanyl group, tricyclodecanyl group and diamantyl group.

The monocyclic hydrocarbon structure formed by coupling of at least two of $Ry_1$ to $Ry_3$ is preferably a cyclopentyl group or a cyclohexyl group. The polycyclic hydrocarbon structure formed by coupling of at least two of $Ry_1$ to $Ry_3$ is preferably an adamantyl group, a norbornyl group or a tetracyclododecanyl group.

Z is preferably a divalent linear hydrocarbon group or a divalent cyclic hydrocarbon group. It may have a substituent. Examples of the substituent which it may have include fluorine atom, chlorine atom, bromine atom, hydroxyl group, and cyano group. Z is preferably a divalent $C_{1-20}$ linking group, more preferably a linear $C_{1-4}$ alkylene group, or a cyclic $C_{5-20}$ alkylene group, or a combination of them. Examples of the linear $C_{1-4}$ alkylene group include methylene group, ethylene group, propylene group, and butylene group. It may be linear or branched. It is preferably a methylene group. Examples of the cyclic $C_{5-20}$ alkylene group include monocyclic alkylene groups such as cyclopentylene group and cyclohexylene group and polycyclic alkylene groups such as norbornylene group and adamantylene group, with adamantylene group being preferred.

A polymerizable compound for forming the repeating unit represented by the formula (I) can easily be synthesized by a known method. For example, it can be synthesized in accordance with a similar method to that described in JP-A-2005-331918 by reacting an alcohol with a carboxylic acid halogenide compound under basic conditions and then reacting the reaction product with a carboxylic acid compound under basic conditions as shown by the following reaction scheme:

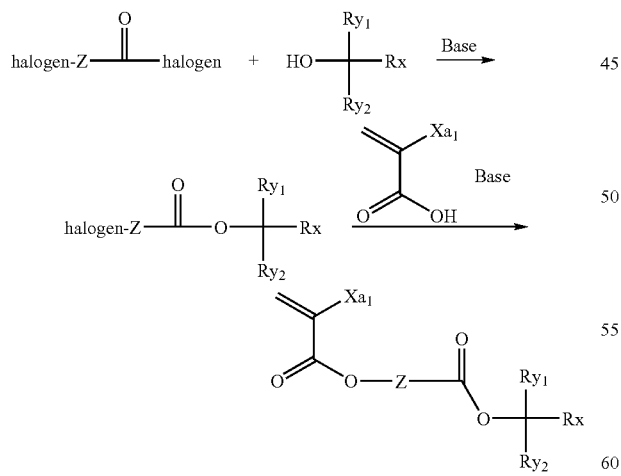

Preferred specific examples of the repeating unit represented by the formula (I) are shown below, but the present invention is not limited to them. In the formula, $Xa_1$ represents a hydrogen atom, an alkyl group, a cyano group or a halogen atom.

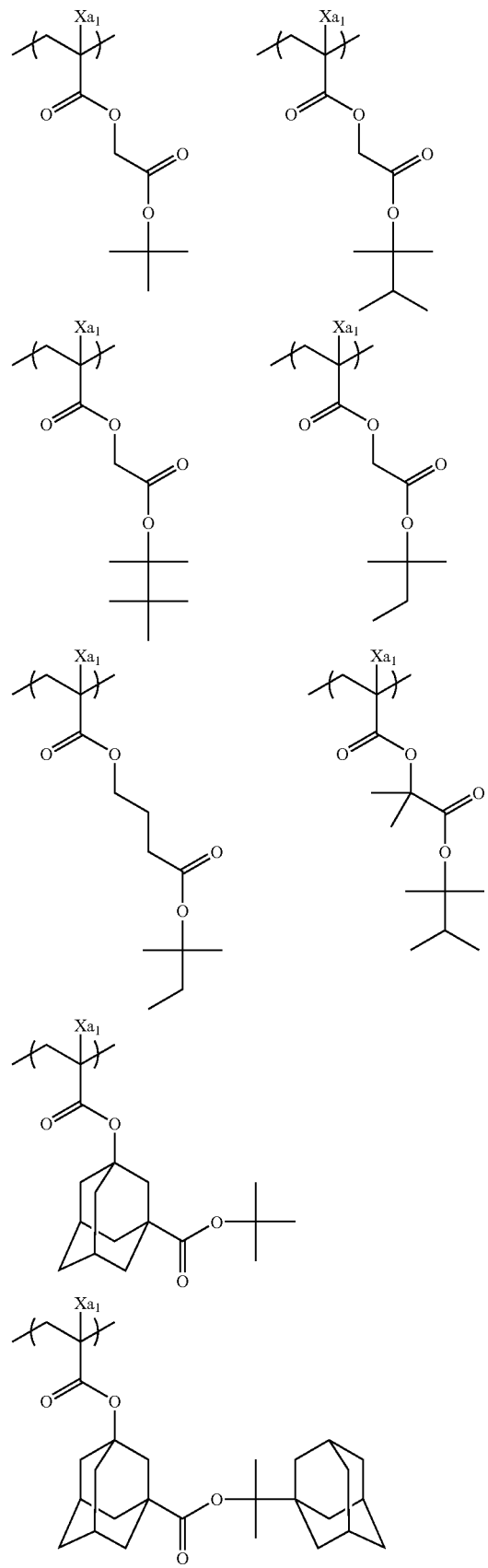

-continued
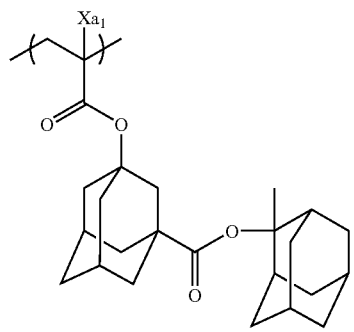
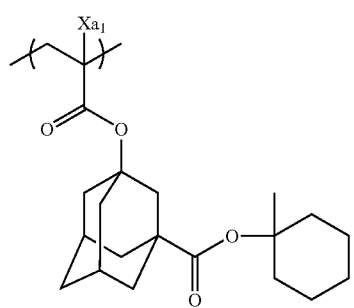
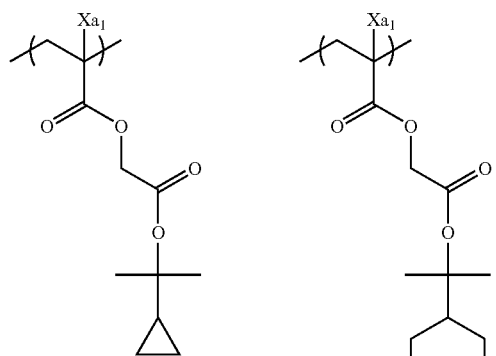
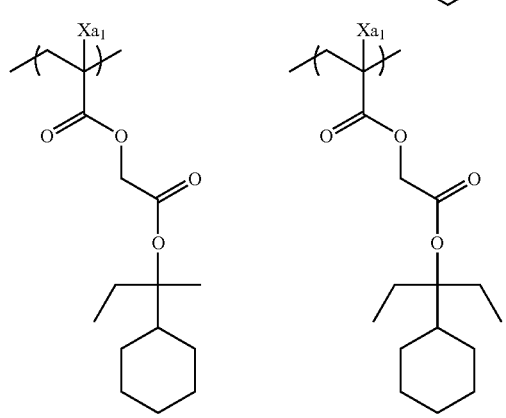
-continued
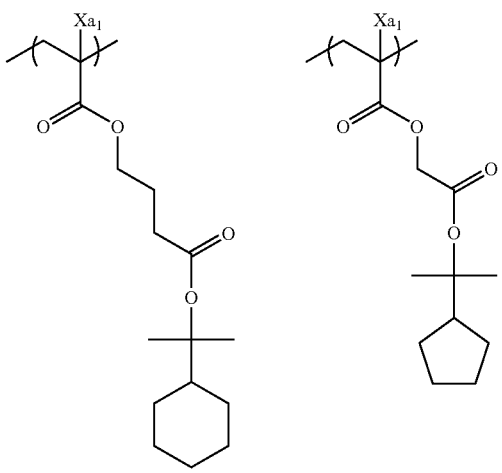
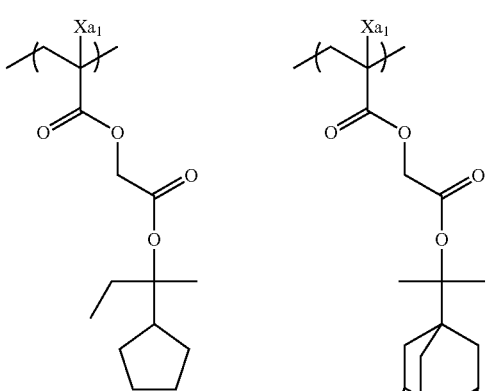
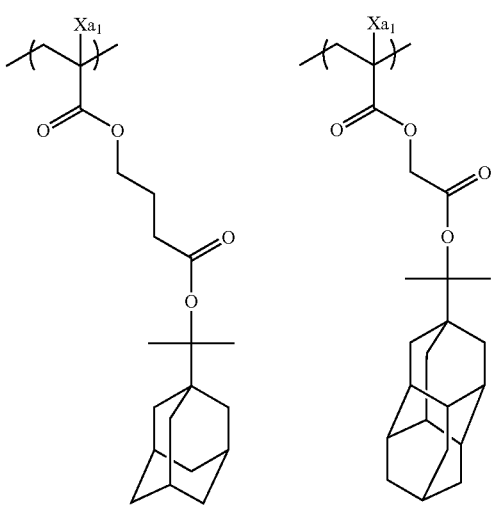

-continued
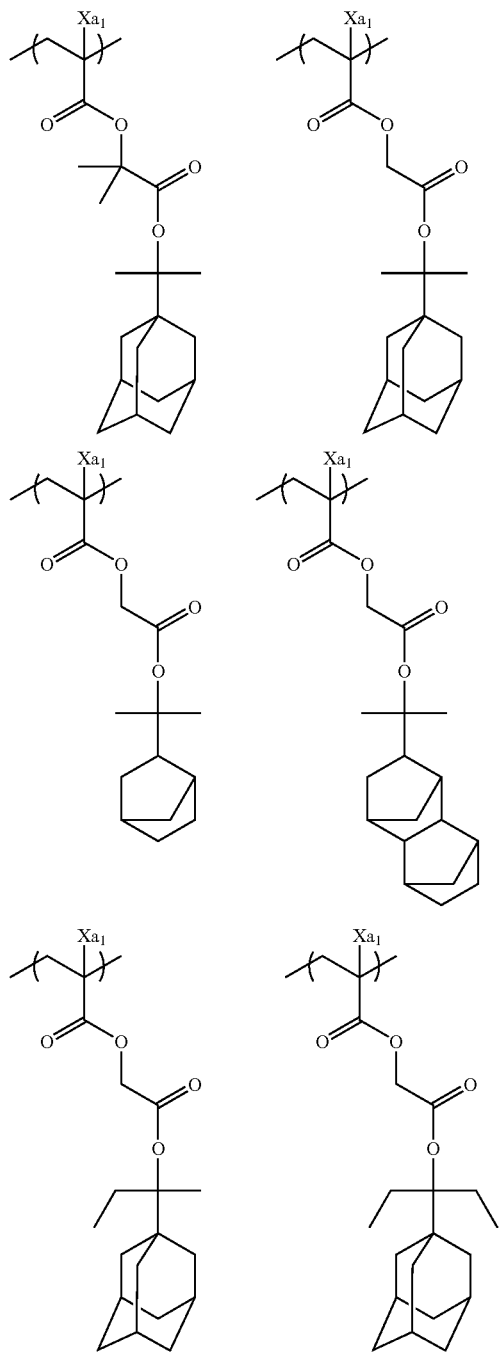
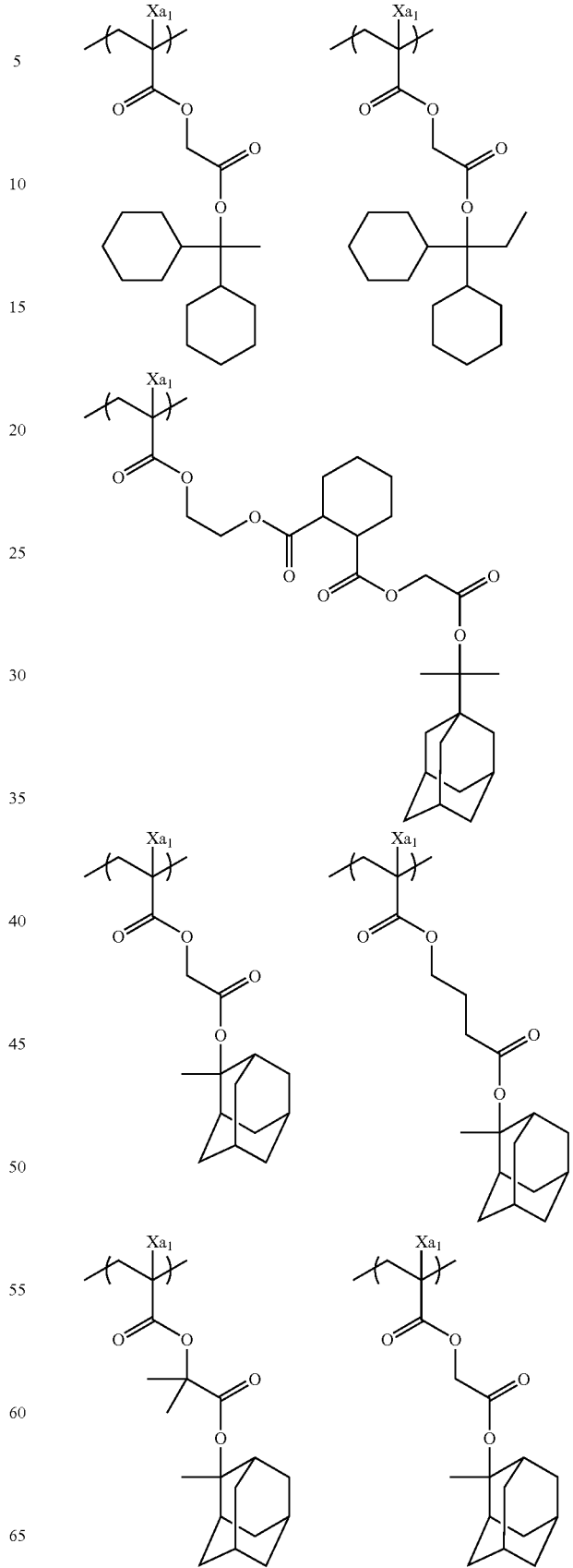

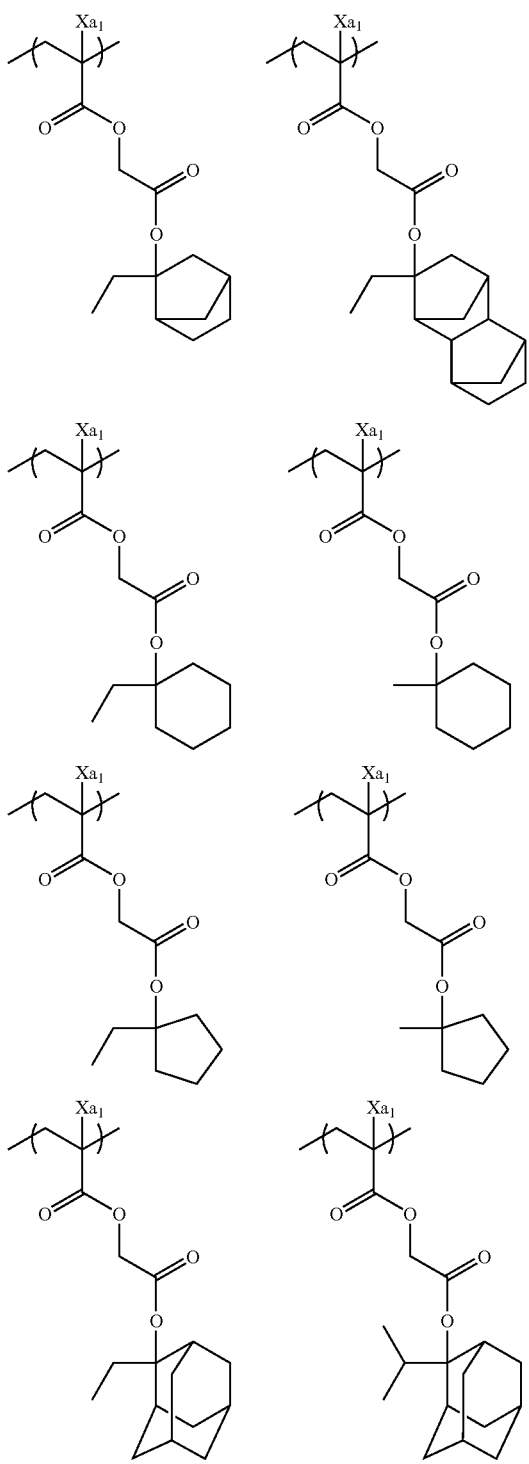

The repeating unit represented by the formula (I) decomposes by the action of an acid and produces a carboxyl group. As a result, it increases solubility of the resin in an alkali developer.

The resin of Component (A) may have, in addition to the acid decomposable repeating unit represented by the formula (I), another acid decomposable repeating unit.

An acid decomposable repeating unit other than the acid decomposable repeating unit represented by the formula (I) is preferably a repeating unit represented by the following formula (II):

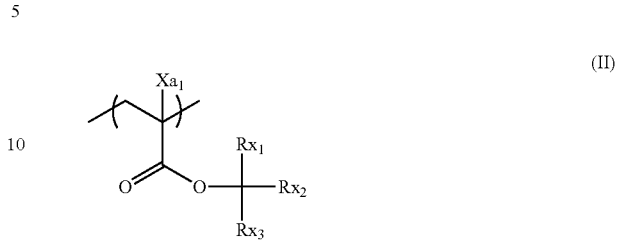

(II)

In the formula (II),

Xa$_1$ represents a hydrogen atom, an alkyl group, a cyano group, or a halogen atom and is similar to Xa$_1$ in the formula (I).

Rx$_1$ to Rx$_3$ each independently represents an alkyl group or a cycloalkyl group. At least two of Rx$_1$ to Rx$_3$ may be coupled to form a cycloalkyl group.

As the alkyl group of Rx$_1$ to Rx$_3$, linear or branched C$_{1-4}$ groups such as methyl group, ethyl group, n-propyl group, isopropyl group, n-butyl group, isobutyl group, and t-butyl group are preferred.

As the cycloalkyl group of Rx$_1$ to Rx$_3$, monocyclic cycloalkyl groups such as cyclopentyl and cyclohexyl and polycyclic cycloalkyl groups such as norbornyl group, tetracyclodecanyl group, tetracyclododecanyl group, and adamantyl group are preferred.

As the cycloalkyl group formed by coupling of at least two of Rx$_1$ to Rx$_3$, monocyclic cycloalkyl groups such as cyclopentyl group and cyclohexyl group and polycyclic cycloalkyl groups such as norbornyl group, tetracyclodecanyl group, tetracyclododecanyl group and adamantyl group are preferred.

These groups given as Rx$_1$ to Rx$_3$ may have a substituent further. Examples of the substituent which they may have include fluorine atom, chlorine atom, bromine atom, hydroxyl group, and cyano group.

As a preferred mode of Rx$_1$ to Rx$_3$, Rx$_1$ represents a methyl group or an ethyl group and Rx$_2$ and Rx$_3$ are coupled to form the above-described monocyclic or polycyclic cycloalkyl group.

The following are specific examples of the preferable repeating unit having an acid decomposable group, but the present invention is not limited to them.

(Rx represents H, CH$_3$ or CH$_2$OH and Rxa and Rxb each represents a C$_{1-4}$ alkyl group)

1

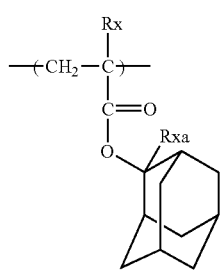

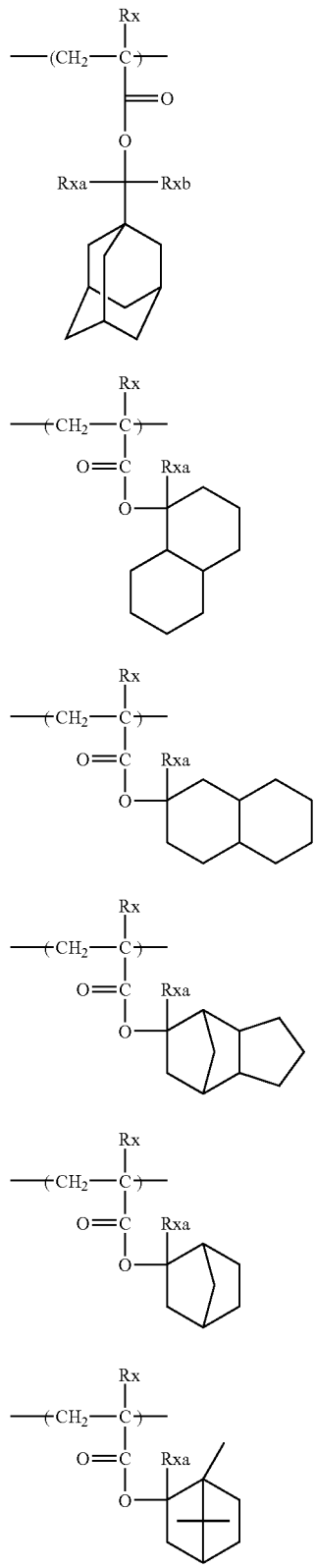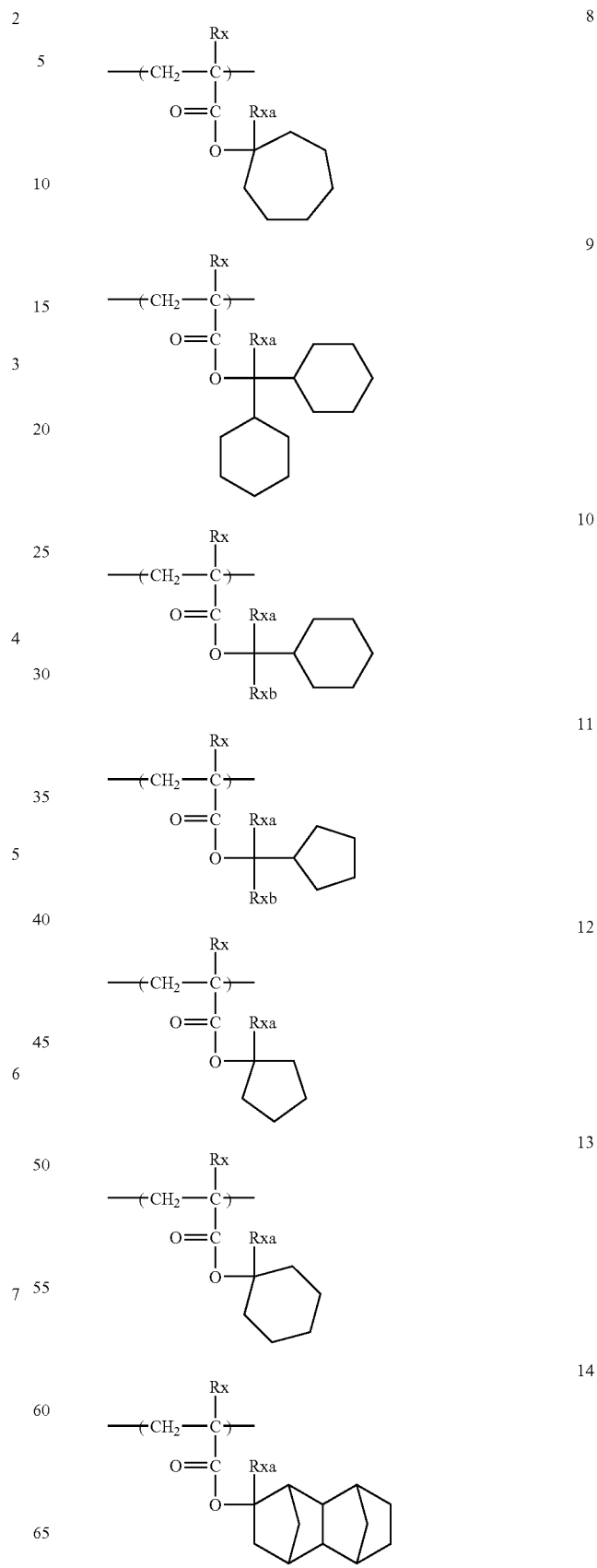

-continued

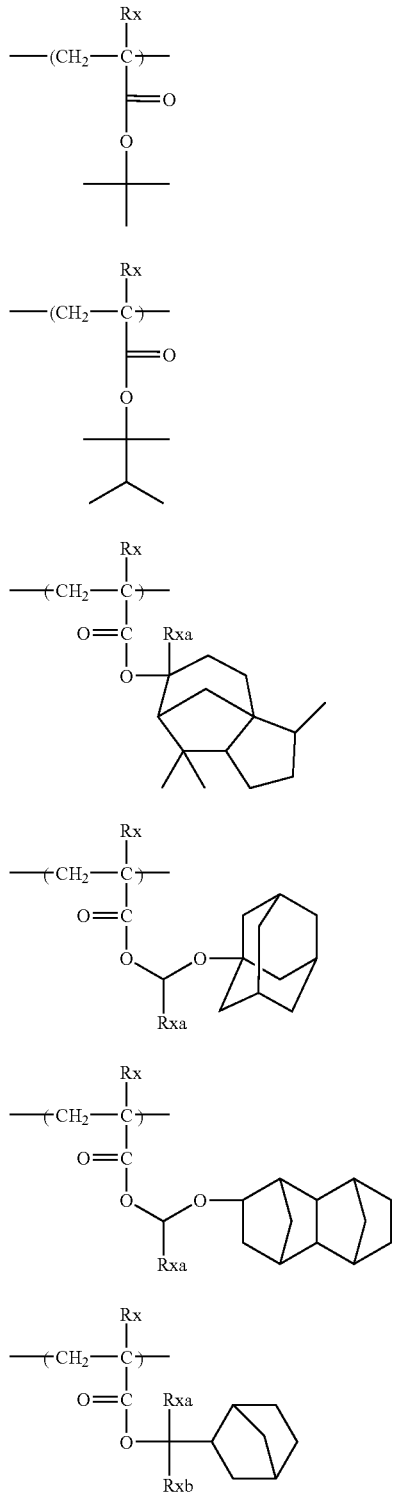

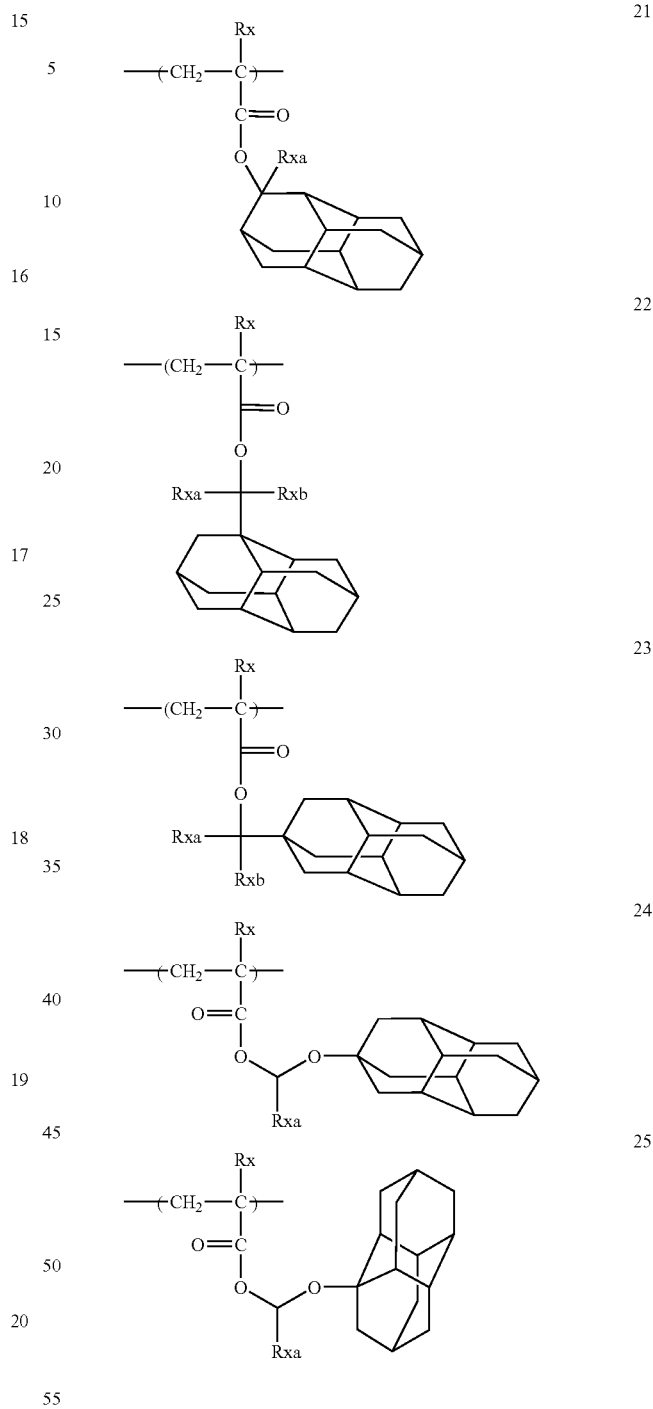

The repeating unit represented by the formula (II) is preferably Repeating units 1, 2, 10, 11, 12, 13, and 14 in the above specific examples.

When the acid-decomposable-group-containing repeating unit represented by the formula (I) is used in combination with another acid-decomposable-group-containing repeating unit (preferably, the repeating unit represented by the formula (II)), a molar ratio of the acid-decomposable-group-containing repeating unit represented by the formula (I): the another acid-decomposable-group-containing repeating unit is from 90:10 to 10:90, more preferably from 80:20 to 20:80.

The total content of the acid-decomposable-group-containing repeating unit in the resin of Component (A) is preferably from 20 to 50 mol %, more preferably from 25 to 45 mol % based on all the repeating units in the polymer.

The resin of Component (A) preferably has a repeating unit having at least one group selected from a lactone group, a hydroxyl group, a cyano group, and an alkali soluble group.

The resin of Component (A) preferably has a repeating unit having a lactone structure.

Although the lactone structure is not limited at all, a 5- to 7-membered ring lactone structure is preferred, with a 5- to 7-membered ring lactone structure cyclocondensed with another cyclic structure to form a bicyclo structure or spiro structure is preferred. The resin having a repeating unit having a lactone structure represented by any one of the following formulas (LC1-1) to (LC1-16) is more preferred. The lactone structure may be bonded directly to the main chain. Preferred lactone structures include (LC1-1), (LC1-4), (LC1-5), (LC1-6), (LC1-13), and (LC1-14). Use of a specific lactone structure reduces line edge roughness and development defects.

LC1-1

LC1-2

LC1-3
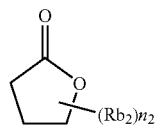

LC1-4
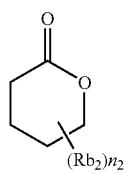

LC1-5
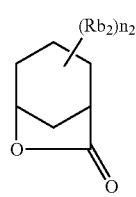

-continued

LC1-6
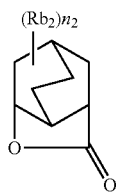

LC1-7
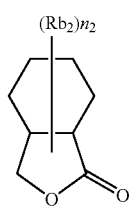

LC1-8
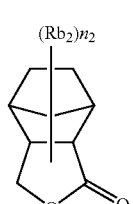

LC1-9
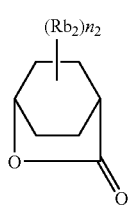

LC1-10
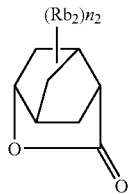

LC1-11
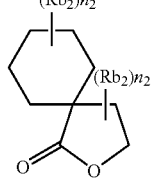

LC1-12
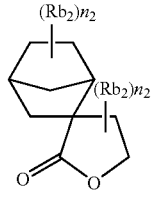

-continued

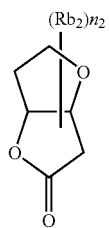
LC1-13

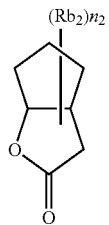
LC1-14

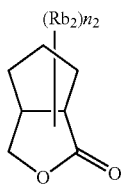
LC1-15

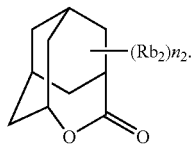
LC1-16

The lactone structure portion may have a substituent ($Rb_2$) or may have no substituent. Preferred examples of the substituent ($Rb_2$) include $C_{1-8}$ alkyl groups, $C_{4-7}$ cycloalkyl groups, $C_{1-8}$ alkoxy groups, $C_{1-8}$ alkoxycarbonyl groups, carboxyl group, halogen atoms, hydroxyl group, cyano group, and acid decomposable groups. More preferred examples include $C_{1-4}$ alkyl groups, cyano group, and acid decomposable groups. In the above formulas, n2 stands for an integer from 0 to 4. When n2 is 2 or greater, a plurality of $Rb_2$s may be the same or different, or the plurality of $Rb_2$s may be coupled to form a ring.

Examples of the repeating unit having a lactone structure represented by any one of the formulas (LC1-1) to (LC1-16) include repeating units represented by the following formula (AI):

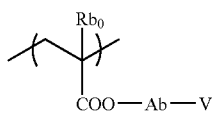

(AI)

In the formula (AI), $Rb_0$ represents a hydrogen atom, a halogen atom or a $C_{1-4}$ alkyl group. Preferred examples of the substituent which the alkyl group of $Rb_0$ may have include hydroxyl group and halogen atoms.

Examples of the halogen atom of $Rb_0$ include fluorine atom, chlorine atom, bromine atom, and iodine atom. $Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, or a divalent linking group comprising a combination thereof. It is preferably a single bond or a divalent linking group represented by $-Ab_1-CO_2-$. $Ab_1-$ is a linear or branched alkylene group, or a monocyclic or polycyclic cycloalkylene group, preferably a methylene group, an ethylene group, a cyclohexylene group, an adamantylene group, or a norbornylene group.

V represents a group having a structure represented by any one of formulas (LC-1) to (LC-16).

The repeating unit having a lactone structure typically has optical isomers. Any of these optical isomers may be used. The optical isomers may be used either singly or in combination. When one optical isomer is used mainly, it has preferably an optical impurity (ee) of 90 or greater, more preferably 95 or greater.

The content of the repeating unit having a lactone structure is preferably from 15 to 60 mol %, more preferably from 20 to 50 mol %, still more preferably from 30 to 50 mol % based on all the repeating units in the polymer.

The following are specific examples of the repeating unit with a lactone structure, but the present invention is not limited to them.

(Rx represents H, $CH_3$, $CH_2OH$, or $CF_3$)

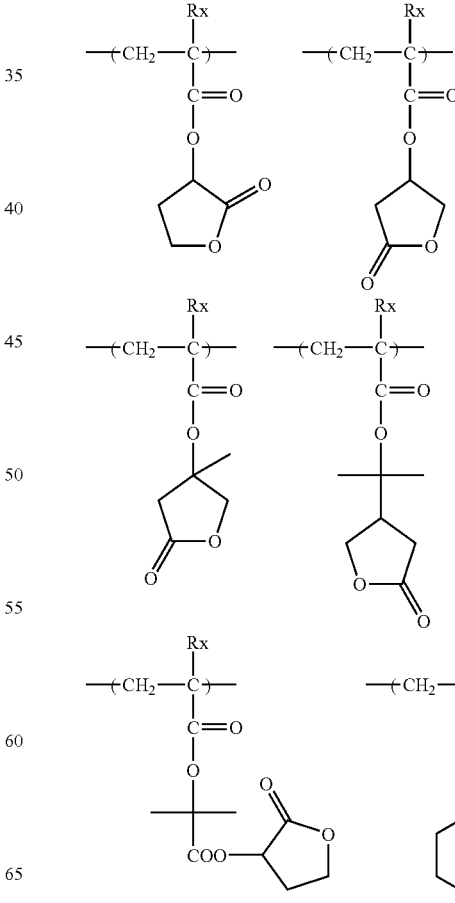

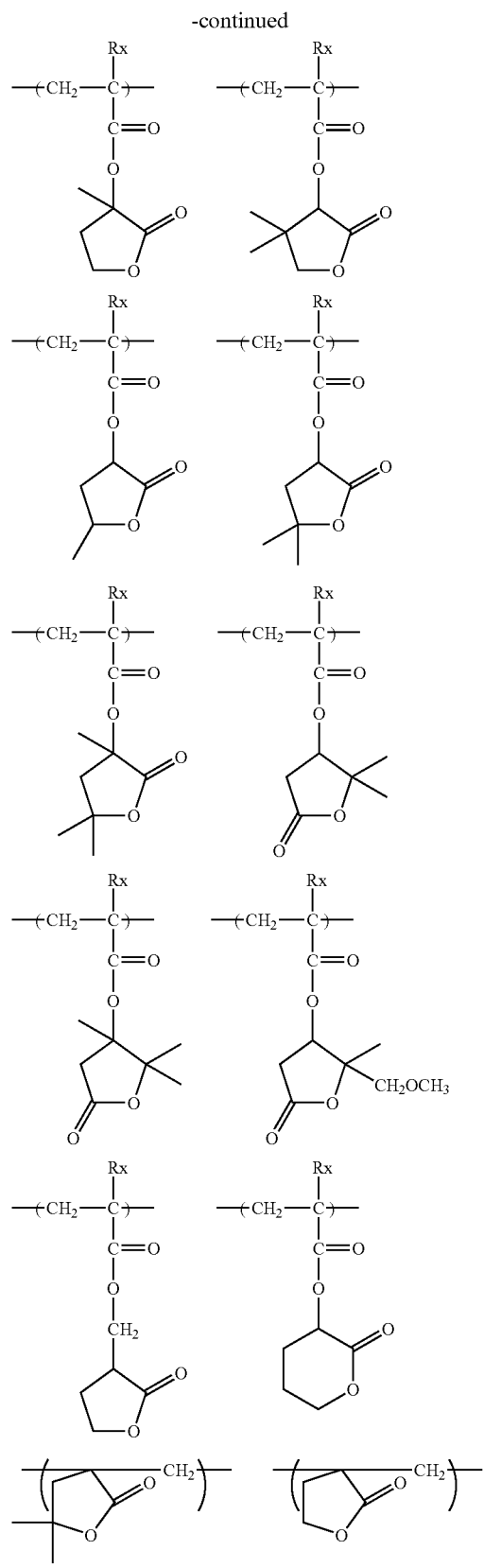
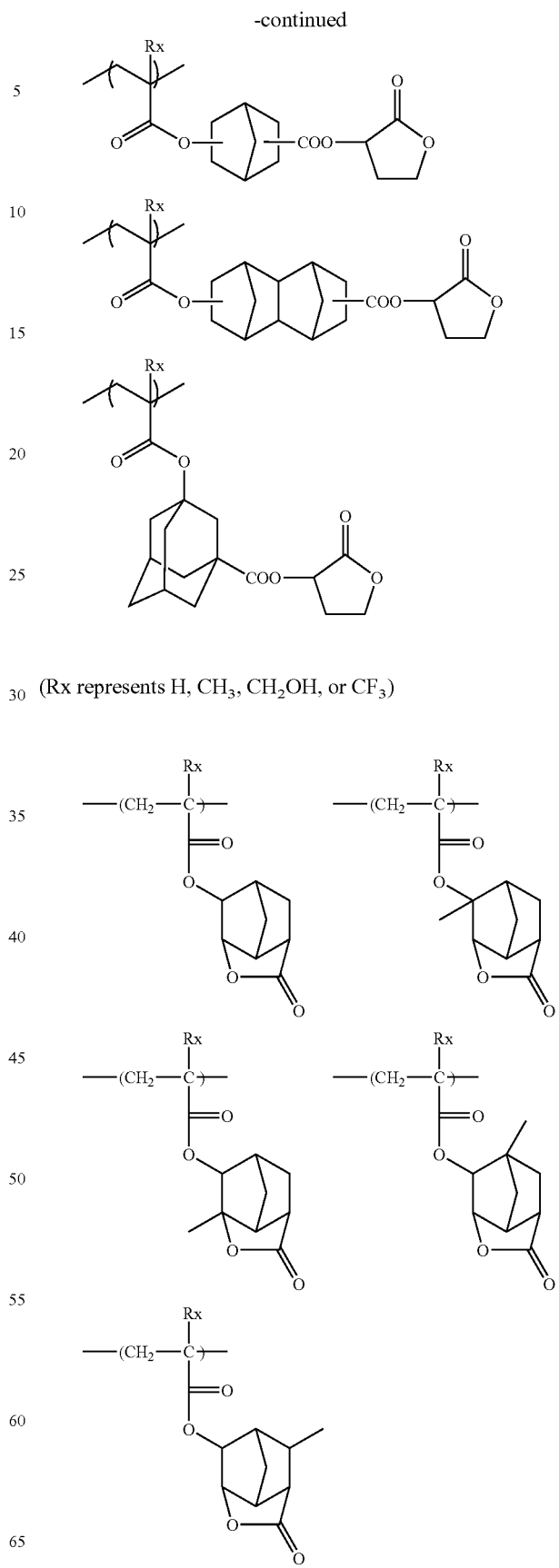
(Rx represents H, CH$_3$, CH$_2$OH, or CF$_3$)

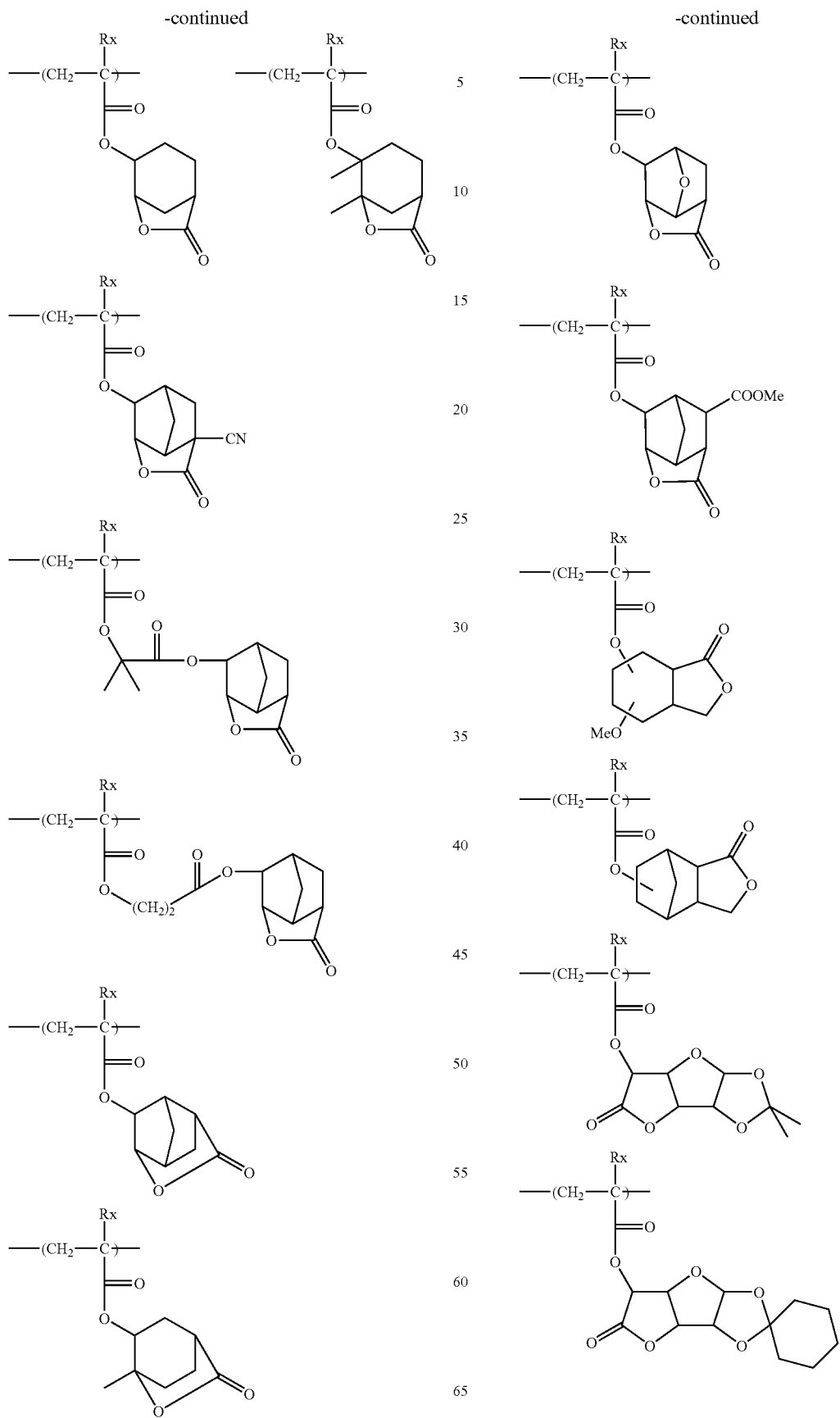

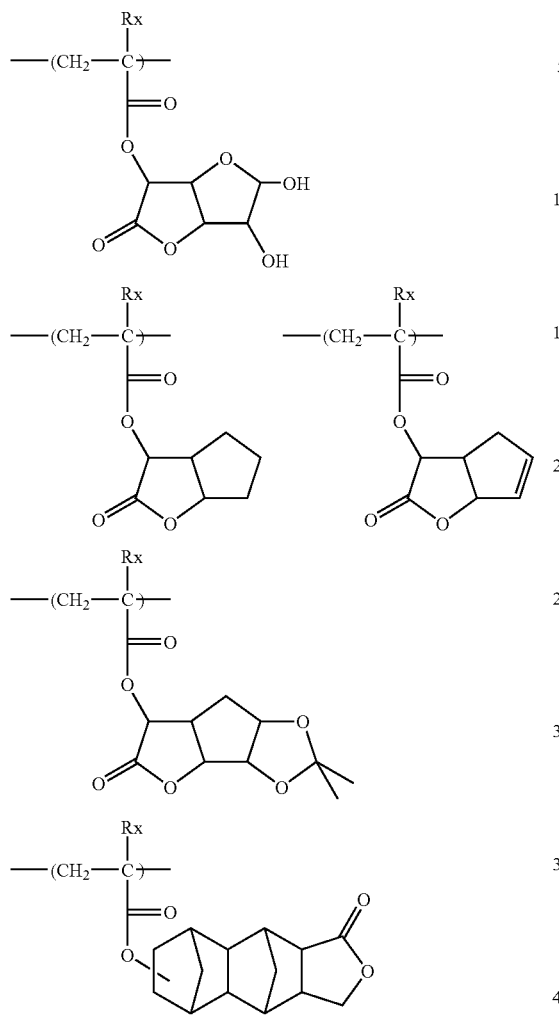
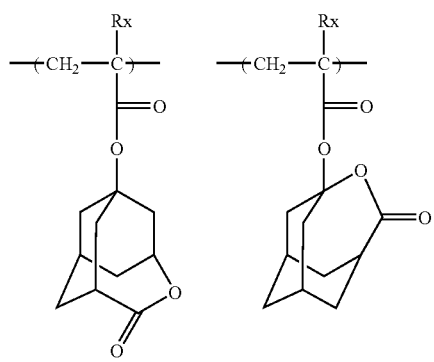
(Rx represents H, CH₃, CH₂OH, or CF₃)
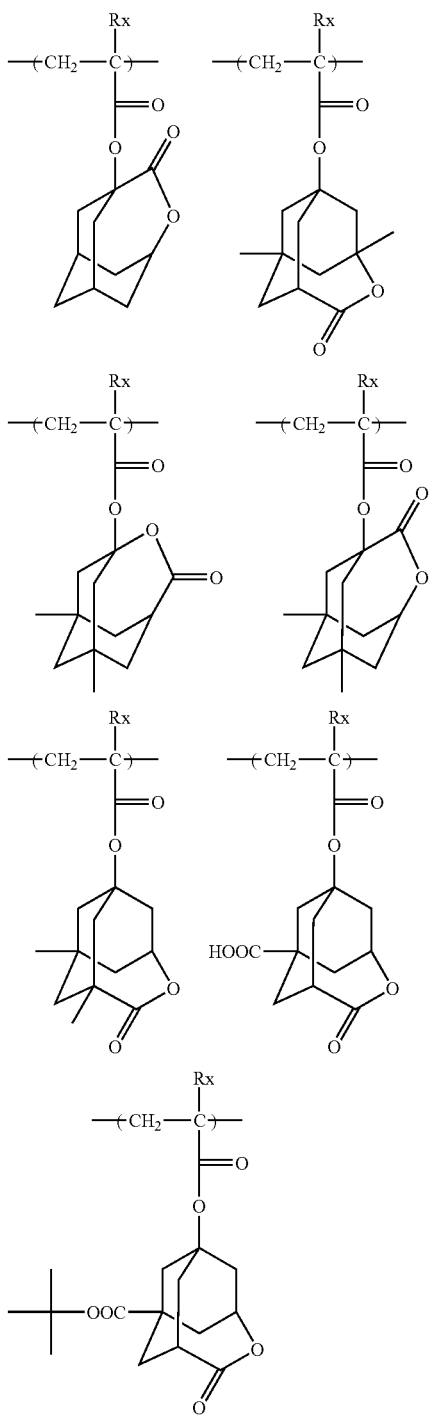

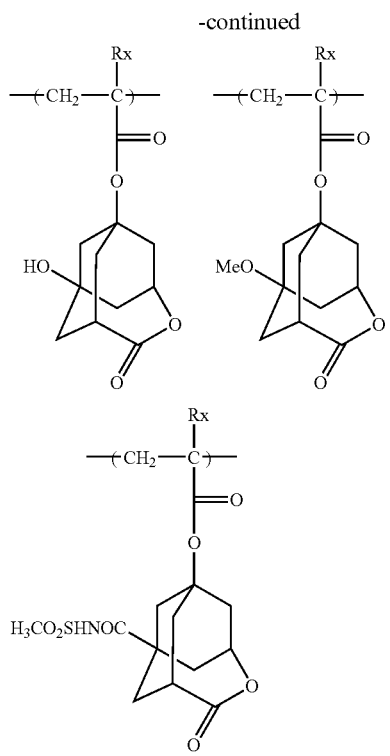
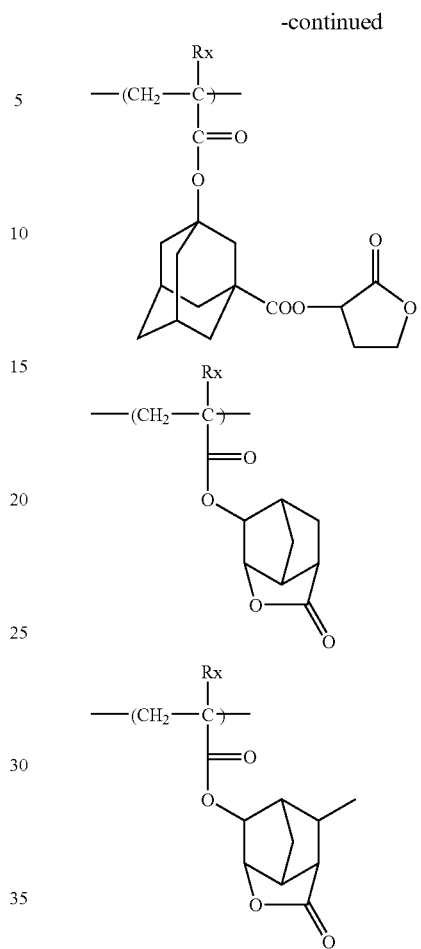
As the repeating unit having a lactone structure, the following repeating units are especially preferred. Selection of the optimum lactone structure improves pattern profile and coarseness/fineness dependence.
(Rx represents H, CH₃, CH₂OH, or CF₃)
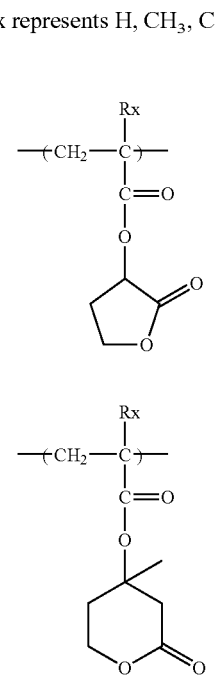
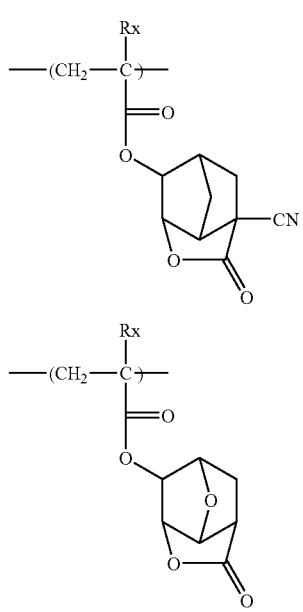

-continued

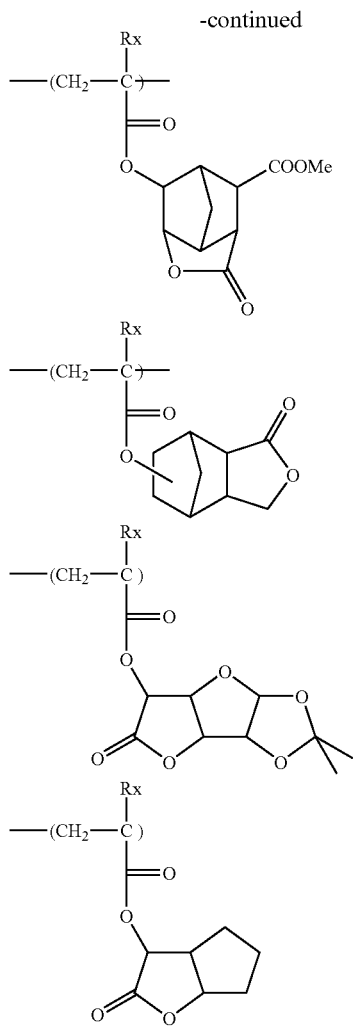

The resin of Component (A) preferably has a hydroxyl- or cyano-containing repeating unit. The resin having such a repeating unit has improved adhesion to substrates and affinity for developers. The hydroxyl- or cyano-containing repeating unit is preferably a repeating unit with an alicyclic hydrocarbon structure substituted with a hydroxyl or cyano group. The alicyclic hydrocarbon structure of the alicyclic hydrocarbon structure substituted with a hydroxyl or cyano group is preferably an adamantyl group, a diamantyl group or a norbornane group.

The preferred alicyclic hydrocarbon structure substituted with a hydroxyl or cyano group is preferably a partial structure represented by any one of the following formulas (VIIa) to (VIId):

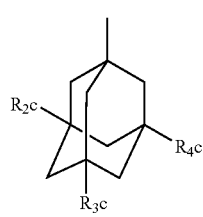
(VIIa)

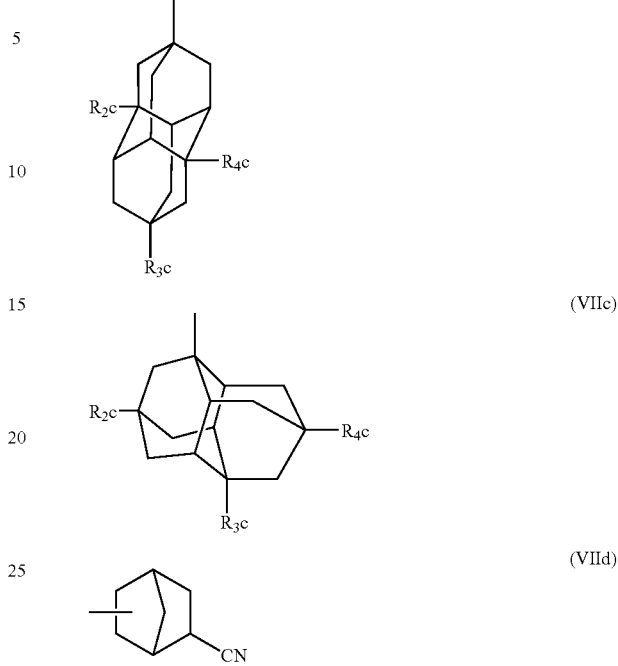

In the formulas (VIIa) to (VIIc), $R_2c$ to $R_4c$ each independently represents a hydrogen atom, a hydroxyl group, or a cyano group, with the proviso that at least one of $R_2c$ to $R_4c$ represents a hydroxyl group or a cyano group. Preferably, one or two of $R_2c$ to $R_4c$ is a hydroxyl group and remaining one(s) is a hydrogen atom. More preferably, in the formula (VIIa), two of $R_2c$ to $R_4c$ each represents a hydroxyl group, while the remaining one represents a hydrogen atom.

Examples of the repeating units with partial structures represented by the formulas (VIIa) to (VIId) include repeating units represented by the following formulas (AIIa) to (AIId), respectively.

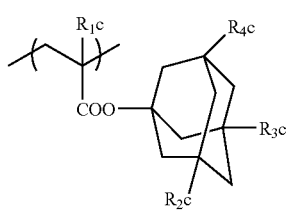
(AIIa)

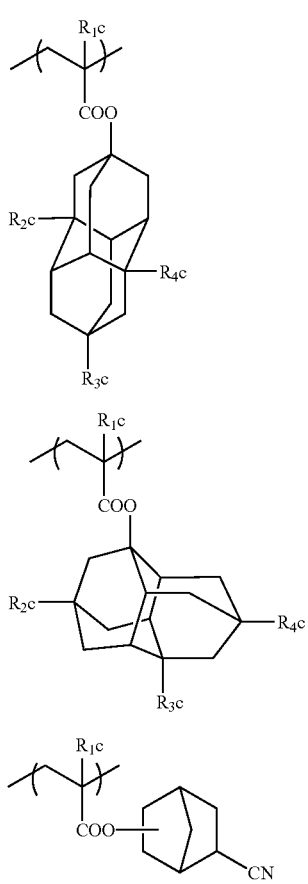

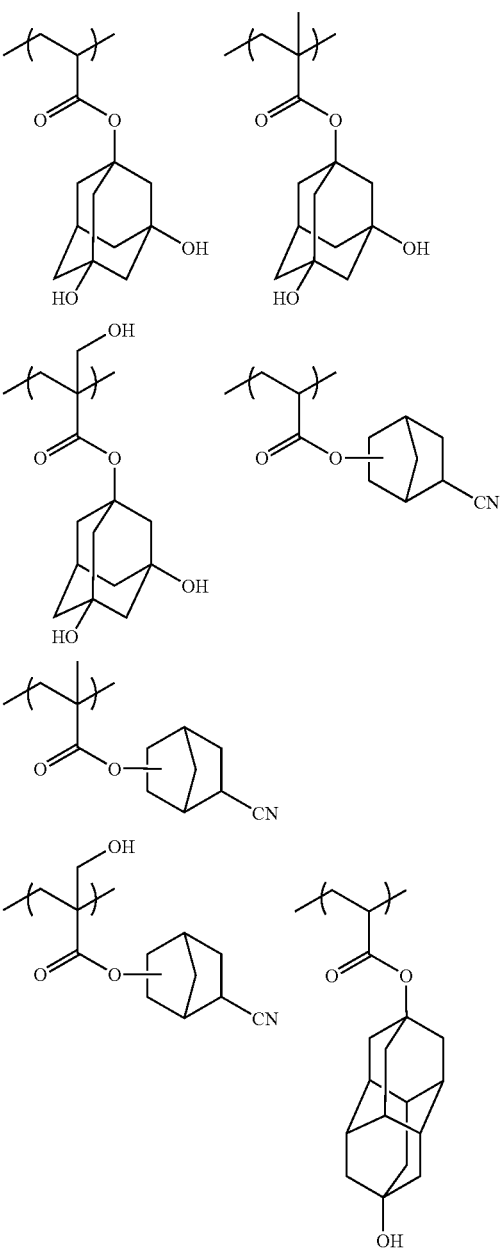

In the formulas (AIIa) to (AIIb), $R_1c$ represents a hydrogen atom, a methyl group, a trifluoromethyl group, or a hydroxymethyl group, and $R_2c$ to $R_4c$ have the same meanings as $R_2c$ to $R_4c$ in the formulas (VIIa) to (VIId).

The content of the repeating unit with an alicyclic hydrocarbon structure substituted with a hydroxyl or cyano group is preferably from 5 to 40 mol %, more preferably from 5 to 30 mol %, still more preferably from 10 to 25 mol % based on all the repeating units in the polymer.

The following are specific examples of the hydroxyl- or cyano-containing repeating unit, but the present invention is not limited to them.

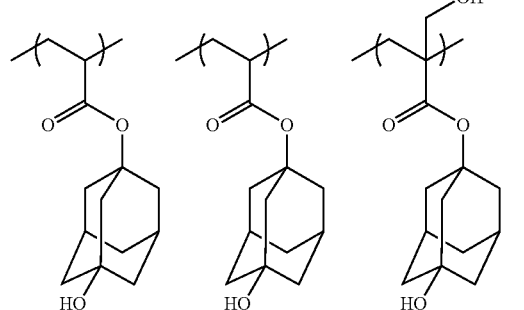

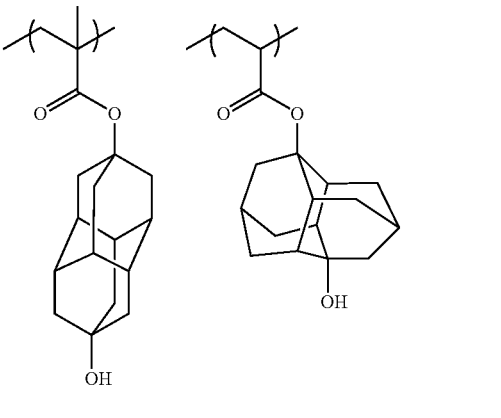

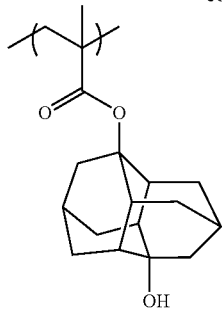

The resin of Component (A) preferably has a repeating unit with an alkali soluble group. Examples of the alkali soluble group include carboxyl group, sulfonamide group, sulfonylimide group, bissulfonylimide group, and aliphatic alcohols (for example, hexafluoroisopropanol group) substituted, at the a position thereof, an electron withdrawing group. The resin having a carboxyl-containing repeating unit is more preferred. When the resin has the repeating unit with an alkali soluble group, resolution at the time of formation of contact holes is enhanced. As the repeating unit with an alkali soluble group, any of repeating units having an alkali soluble group bonded directly to the main chain of the resin such as repeating units by acrylic acid or methacrylic acid, repeating units having an alkali soluble group bonded to the main chain of the resin via a linking group, and repeating units having an alkali soluble group introduced into the end of the polymer chain at the time of polymerization by using an alkali-soluble-group-containing polymerization initiator or chain transfer agent is preferred. The linking group may have a monocyclic or polycyclic hydrocarbon structure. The repeating unit by acrylic acid or methacrylic acid is especially preferred.

The content of the repeating unit with an alkali soluble group is preferably from 1 to 20 mol %, more preferably from 3 to 15 mol %, still more preferably from 5 to 10 mol % based on the total repeating units in the polymer.

The following are specific examples of the repeating unit with an alkali soluble group, but the present invention is not limited to them.

(Rx represents H, CH$_3$, CF$_3$, or CH$_2$OH)

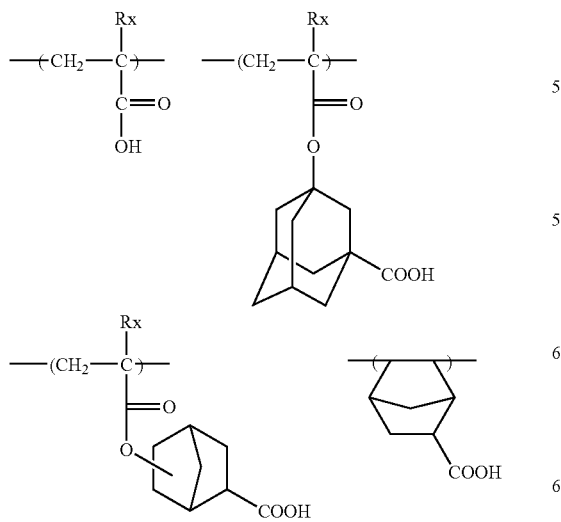

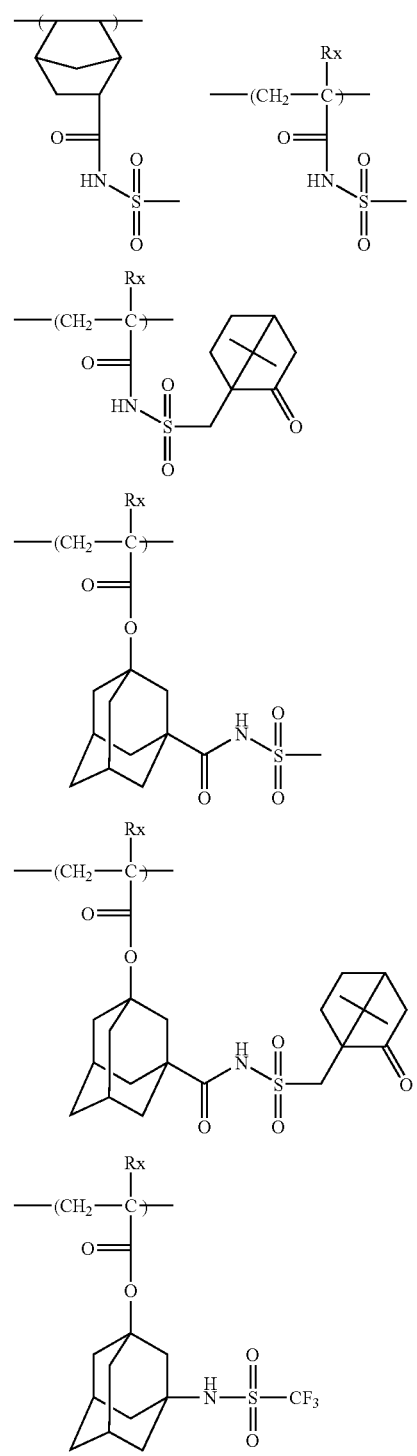

-continued

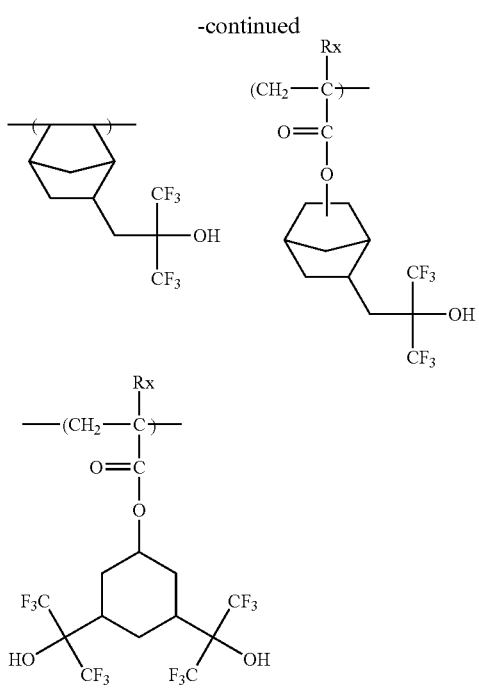

As the repeating unit with at least one group selected from a lactone group, a hydroxyl group, a cyano group, and alkali soluble groups, repeating units having at least two groups selected from a lactone group, a hydroxyl group, a cyano group, and alkali soluble groups are more preferred, with repeating units having both a cyano group and a lactone group being still more preferred. Repeating units having a lactone structure of LCI-4 substituted with a cyano group are especially preferred.

The resin of Component (A) may further have a repeating unit having an alicyclic hydrocarbon structure and showing no acid decomposability. By using the resin having such a repeating unit, release of low molecular components from a resist film to an immersion liquid can be reduced during immersion exposure. Examples of such a repeating unit include 1-adamantyl(meth)acrylate, diamantyl(meth)acrylate, tricyclodecanyl(meth)acrylate and cyclohexyl(meth)acrylate.

The resin of Component (A) may have various repeating structural units, in addition to the above-described repeating structural units, in order to adjust dry etching resistance, suitability for a standard developer, adhesion to substrates, resist profile, and properties generally required of resist such as resolution, heat resistance and sensitivity.

Examples of such repeating structural units include, but not limited to, repeating units corresponding to the following monomers.

Addition of such a repeating unit enables fine adjustment of the performance necessary for the resin of Component (A), particularly (1) solubility in a coating solvent, (2) film forming property (glass transition point), (3) alkali development property, (4) film loss (selection of hydrophilic, hydrophobic or alkali soluble group), (5) adhesion to an unexposed portion of a substrate, (6) dry etching resistance, and the like.

Examples of such a monomer include compounds having an addition polymerizable unsaturated bond selected from acrylates, methacrylates, acrylamides, methacrylamides, allyl compounds, vinyl ethers, and vinyl esters.

In addition, an addition polymerizable unsaturated compound copolymerizable with a monomer corresponding to the above-described repeating structural unit may be copolymerized therewith.

In the resin of Component (A), the molar ratio of the repeating structural units contained in the resin is determined as needed so as to control the dry etching resistance, suitability for standard developer, adhesion to substrate, and resist profile of the resist, and performances generally required of the resist, such as resolution, heat resistance and sensitivity.

When the positive photosensitive composition of the present invention is for used in ArF exposure, the resin of Component (A) is preferably free of an aromatic group from the viewpoint of transparency to ArF light.

As the resin of Component (A), resins whose repeating units are composed only of (meth)acrylate repeating units are preferred. In this case, any of resins whose repeating units are all methacrylate repeating units, resins whose repeating units are all acrylate repeating units, and resins whose repeating units are composed only of methacrylate repeating units and acrylate repeating units is usable. It is preferred that the resin contains acrylate repeating units in an amount of 50 mol % or less based on all the repeating units, and is more preferred that the resin is a copolymer containing from 20 to 50 mol % of (meth)acrylate repeating units having an acid decomposable group, from 20 to 50 mol % of (meth)acrylate repeating units having a lactone structure, from 5 to 30 mol % of (meth)acrylate repeating units having an alicyclic hydrocarbon structure substituted with a hydroxyl or cyano group, and from 0 to 20 mol % of other (meth)acrylate repeating units.

The resin of Component (A) can be synthesized by the conventional process (for example, radical polymerization). Examples of the common synthesis process include simultaneous polymerization process of dissolving monomer species and an initiator in a solvent and heating the resulting solution; and dropwise addition polymerization process of adding a solution of monomer species and an initiator dropwise to a heated solvent over from 1 to 10 hours. Of these, the dropwise addition polymerization is preferred. Examples of the reaction solvent include ethers such as tetrahydrofuran, 1,4-dioxane and diisopropyl ether, ketones such as methyl ethyl ketone and methyl isobutyl ketone, ester solvent such as ethyl acetate, amide solvents such as dimethylformamide and dimethylacetamide, and solvents, which will be described later, for dissolving the composition of the invention therein such as propylene glycol monomethyl ether acetate, propylene glycol monomethyl ether and cyclohexanone. Polymerization using the same solvents as those used for the positive photosensitive composition of the invention is more preferred. This makes it possible to inhibit generation of particles during storage.

The polymerization reaction is performed preferably in an inert gas atmosphere such as nitrogen or argon. Polymerization is started using, as a polymerization initiator, a commercially available radical initiator (such as azo initiator or peroxide). As the radical initiator, azo initiators are preferred, with azo initiators having an ester group, a cyano group or a carboxyl group being more preferred. Preferred examples of the initiator include azobisisobutyronitrile, azobidimethylvaleronitrile and dimethyl 2,2'-azobis(2-methylpropionate). If desired, the initiator may be added further or added in portions. After completion of the reaction, the reaction mixture is charged in a solvent and the desired polymer is collected, for example, by a method employed for collecting powders or solids. The reaction concentration is from 5 to 50 mass %, preferably from 10 to 30 mass %. The reaction temperature is typically from 10 to 150° C., preferably from 30 to 120° C., more preferably from 60 to 100° C.

The resin of Component (A) has a weight average molecular weight of preferably from 1,000 to 200,000, more preferably from 3,000 to 20,000, most preferably from 5,000 to 15,000 as determined by GPC relative to polystyrene. Adjustment of the weight average molecular weight to from 1,000 to 200,000 makes it possible to prevent deterioration of heat resistance or dry etching resistance and at the same time prevent deterioration of developability and deterioration of film forming property which will otherwise occur due to thickening.

Dispersity (molecular weight distribution) is typically from 1 to 5, preferably from 1 to 3, more preferably from 1 to 2. When the molecular weight distribution is smaller, resolution and resist shape are excellent, the resist pattern has smooth side walls and the roughness property is excellent.

When the resin of Component (A) is used for a positive photosensitive composition to be exposed to KrF excimer laser light, electron beam, X-ray or high energy beam (such as EUV) having a wavelength of 50 nm or less, the resin of Component (A) has preferably a repeating unit represented by the formula (I) and a repeating unit having a hydroxystyrene structure. Examples of the repeating unit having a hydroxystyrene include o-, m- and p-hydroxystyrene and/or hydroxystyrene protected with an acid decomposable group. As the hydroxystyrene repeating unit protected with an acid decomposable group, 1-alkoxyethoxystyrene and t-butylcarbonyloxystyrene are preferred.

The resin may have, in addition to the repeating unit represented by the formula (I) and the repeating unit having a hydroxystyrene structure, a repeating unit represented by the formula (II).

Specific examples of the resin to be used in the invention and having both the repeating unit having a hydroxystyrene structure and the repeating unit represented by the formula (I) will next be shown, but the present invention is not limited to them. In these specific examples, $Xa_1$ represents a hydrogen atom, an alkyl group, a cyano group or a halogen atom.

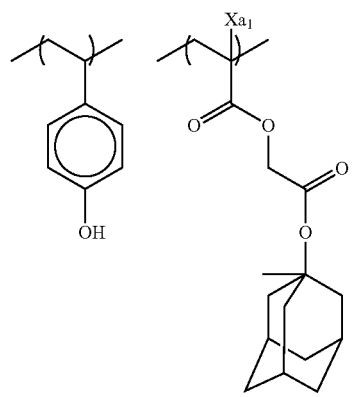

-continued

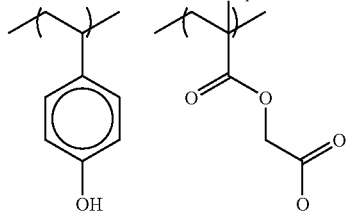

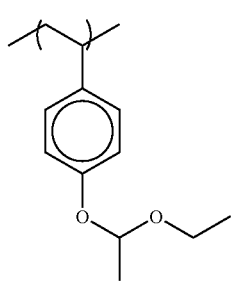

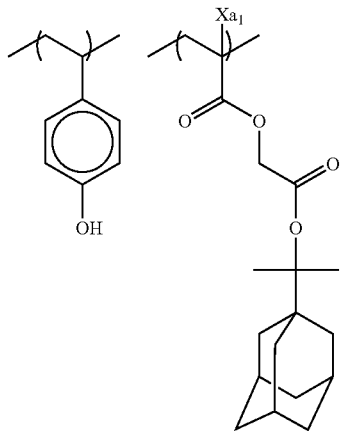

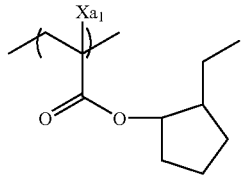

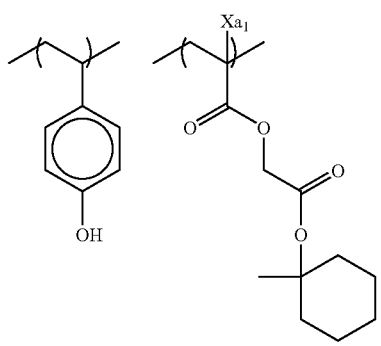

-continued

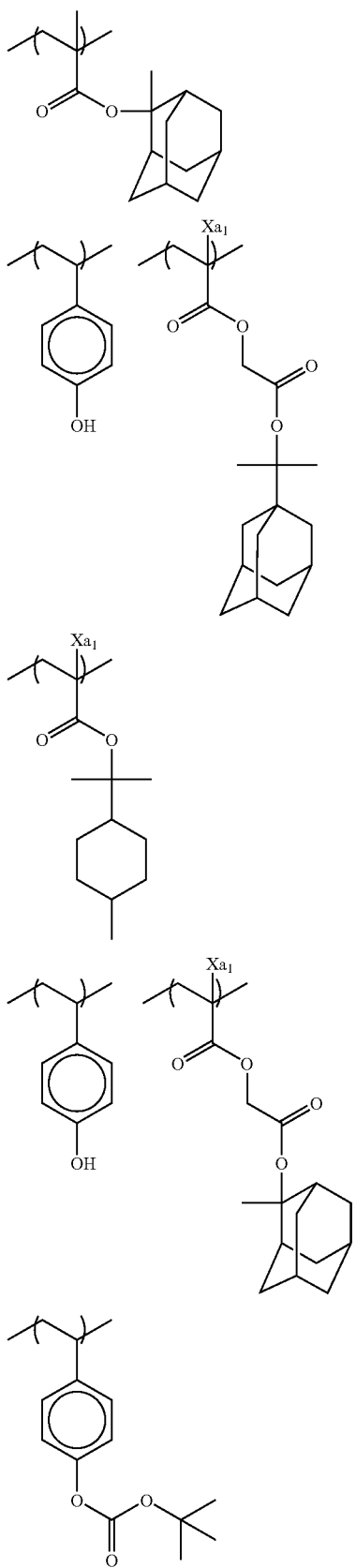

The amount of the resin of Component (A) is preferably from 50 to 99.9 mass %, more preferably from 60 to 99.0 mass % in the total solids of the positive photosensitive composition of the invention.

In the invention, the resins of Component (A) may be used either singly or in combination.

(B) Compound which Generates an Acid Upon Irradiation with Actinic Light or Radiation The positive photosensitive composition of the invention contains a compound (which may be called "acid generator" or "compound of Component (B)") which generates an acid upon irradiation with actinic light or radiation.

Examples of the compound which decomposes to generate an acid upon irradiation with actinic light or radiation include diazonium salts, phosphonium salts, sulfonium salts, iodonium salts, imidosulfonate, oxime sulfonate and o-nitrobenzyl sulfonate.

In addition, compounds obtained by introducing into the polymer main chain or side chain thereof, these groups or compounds which generate an acid upon irradiation with actinic light or radiation, for example, compounds described in U.S. Pat. No. 3,849,137, German Patent 3914407, JP-A-63-26653, JP-A-55-164824, JP-A-62-69263, JP-A-63-146038, JP-A-63-163452, JP-A-62-153853 and JP-A-63-146029 are also usable.

Further, compounds described, for example, in U.S. Pat. No. 3,779,778 and European Patent 126,712 and generating an acid upon irradiation with light are also usable.

As the acid generator, those having a non-nucleophilic anion are preferred. Preferred examples include sulfonate anion, carboxylate anion, bis(alkylsulfonyl)amide anion, tris(alkylsulfonyl)methide anion, $BF_4^-$, $PF_6^-$ and $SbF_6^-$. Of these, organic anions having a carbon atom are preferred.

Preferred examples of the non-nucleophilic anion include organic anions represented by the following formulas AN1 to AN4.

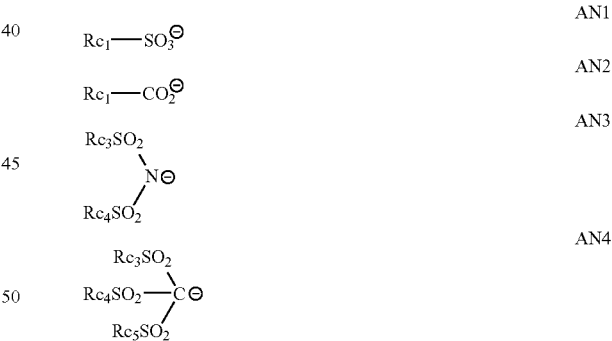

$Rc_1$ represents an organic group.

Examples of the organic groups as $Rc_1$ include $C_{1-30}$ groups. Preferred examples include alkyl groups which may be substituted and aryl groups which may be substituted, and a plurality of these groups linked via a linking group such as single bond, —O—, —$CO_2$—, —S—, —$SO_3$—, or —$SO_2$N ($Rd_1$).

$Rd_1$ represents a hydrogen atom or an alkyl group, or may form a ring structure with the alkyl group or aryl group to which $Rd_1$ is bonded.

As the organic group of $Rc_1$, alkyl groups substituted, at the 1-position thereof, with a fluorine atom or a fluoroalkyl group and a phenyl group substituted with a fluorine atom or fluoroalkyl group are preferred. Having a fluorine atom or fluoroalkyl group leads to a rise in the acidity of an acid generated by exposure to light, and improvement in sensitivity. When $Rc_1$ has 5 or more carbon atoms, at least one of the carbon atoms is preferably substituted with a hydrogen atom. More preferably, the number of hydrogen atoms is greater than that of fluorine atoms. An acid generator not containing a perfluoroalkyl group having 5 or greater carbon atoms has reduced ecotoxicity.

It is also preferred that $Rc_1$ is a group represented by the following formula.

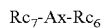

$Rc_6$ represents a perfluoroalkylene group or a phenylene group substituted with from 3 to 5 fluorine atoms and/or from 1 to 3 fluoroalkyl groups.

Ax represents a linking group (preferably, a single bond, —O—, —$CO_2$—, —S—, —$SO_3$—, or $SO_2N(Rd_1)$- in which $Rd_1$ represents a hydrogen atom or an alkyl group, or may be coupled with $Rc_7$ to form a ring structure).

$Rc_7$ represents a hydrogen atom, a fluorine atom, a linear, branched, monocyclic or polycyclic alkyl group which may be substituted, or an aryl group which may be substituted. The alkyl group or aryl group which may be substituted preferably does not contain a fluorine atom as the substituent.

$Rc_3$, $Rc_4$ and $Rc_5$ each represents an organic group.

The organic groups of $Rc_3$, $Rc_4$ and $Rc_5$ are preferably organic groups similar to those given as preferred examples of the organic group of $Rc_1$.

$Rc_3$ and $Rc_4$ may be coupled to form a ring. Examples of the group formed by the coupling of $Rc_3$ and $Rc_4$ include alkylene groups and arylene groups, with a $C_{2-4}$ perfluoroalkylene group is preferred. Coupling of $Rc_3$ and $Rc_4$ to form a ring is preferred because it raises the acidity of an acid generated by exposure to light and improves the sensitivity.

As the acid generator to be used in the invention, compounds which generate an acid represented by the formula (BII) are preferred.

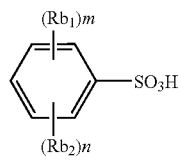

wherein, in the formula (BII), $Rb_1$ represents a group having an electron withdrawing group, $Rb_2$ represents an organic group having no electron withdrawing group, m and n each stands for an integer from 0 to 5, with the proviso that $m+n \leq 5$, when m stands for 2 or greater, a plurality of $Rb_1$ may be the same or different and when n stands for 2 or greater, a plurality of $Rb_1$ may be the same or different.

In the formula, m stands for preferably an integer from 1 to 5, more preferably an integer from 2 to 5. Presence of the electron withdrawing group raises the acidity of an acid generated by exposure to actinic light and improves the sensitivity.

The group, as $Rb_1$, having an electron withdrawing group is a group having at least one electron withdrawing group and is preferably a group with 10 or less carbon atoms. The group having an electron withdrawing group may be an electron withdrawing group itself.

The electron withdrawing group is preferably a fluorine atom, a fluoroalkyl group, a nitro group, an ester group or a cyano group, more preferably a fluorine atom.

The organic group, as $Rb_2$, having no electron withdrawing group is preferably a $C_{1-20}$, more preferably $C_{4-20}$, still more preferably $C_{4-15}$ organic group. Preferred examples of the organic group include alkyl groups, alkoxy groups, alkylthio groups, acyl groups, acyloxy groups, acylamino groups, alkylsulfonyloxy groups, and alkylsulfonylamino groups. The organic group may have, in the alkyl chain thereof, a hetero-atom-containing linking group. Preferred examples of the hetero-atom-containing linking group include —C(=O)O—, —C(=O)—, —$SO_2$—, —$SO_3$—, —$SO_2N(A2)$-, —O— and —S—. Two or more of these groups may be used in combination. In the above formula, A2 is a hydrogen atom or an alkyl group which may be substituted. When two or more groups are used in combination, they are preferably combined via a heteroatom-free linking group such as alkylene group or arylene group.

These groups may have another substituent. Preferred examples of the another substituent include hydroxyl group, carboxyl group, sulfo group and formyl group.

In the formula (BII), it is preferred that m stands for an integer from 1 to 5, n stands for an integer from 1 to 5, $m+n \leq 5$, and $Rb_1$ and $Rb_2$ each has a $C_{4-20}$ alkyl structure. Having a $C_{4-20}$ alkyl structure enables suppression of diffusivity of an acid generated by exposure to actinic light and improvement of exposure latitude.

In the formula (BII), $Rb_1$ and $Rb_2$ each has preferably an alicyclic group. In particular, the organic group of $Rb_2$ having no electron withdrawing group is preferably a group having an alicyclic group.

The following are specific examples of the acid represented by the formula (BII).

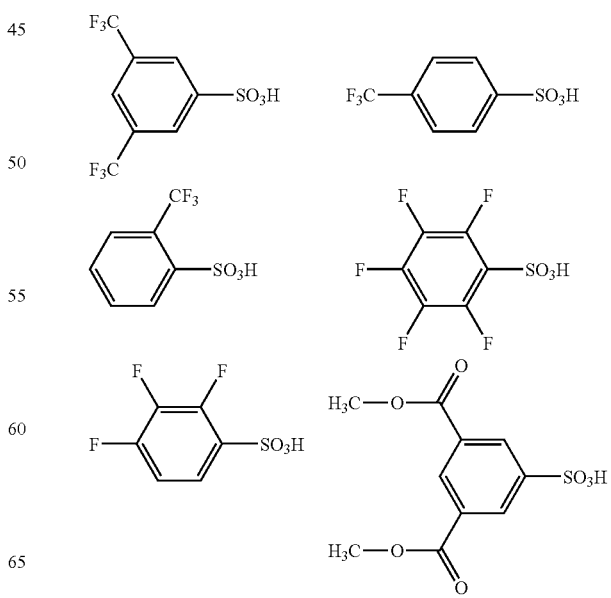

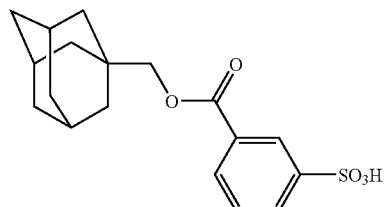
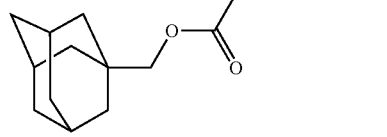
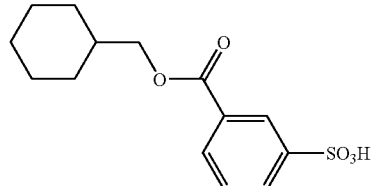
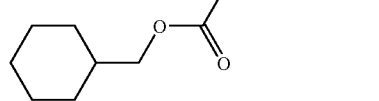
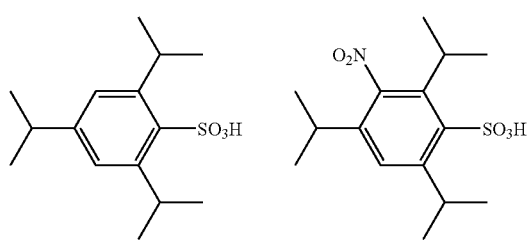
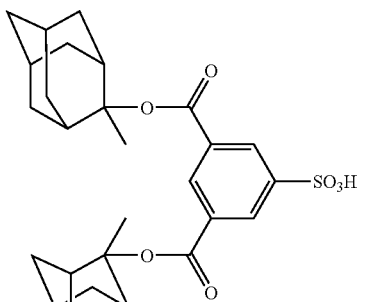
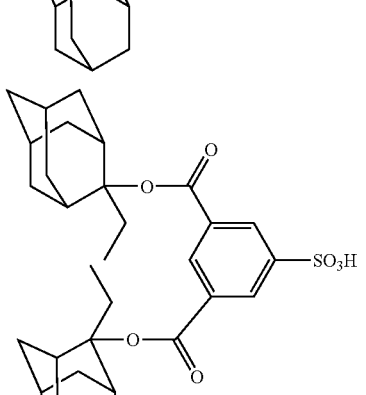
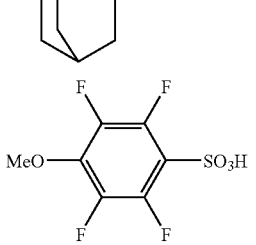
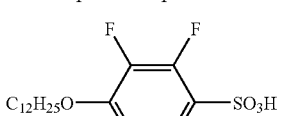
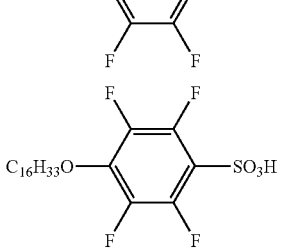
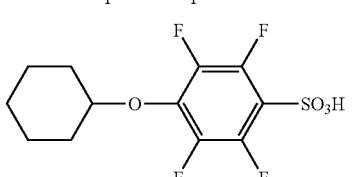
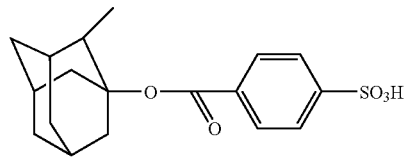
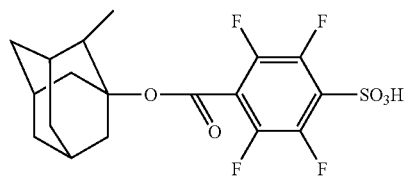
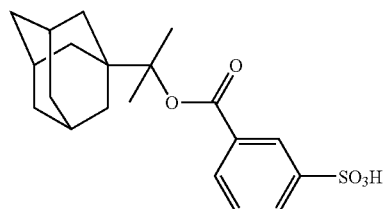
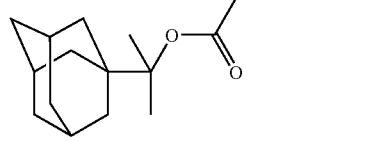
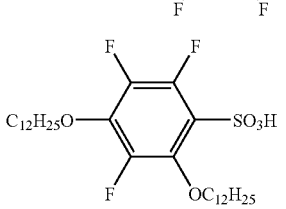

-continued

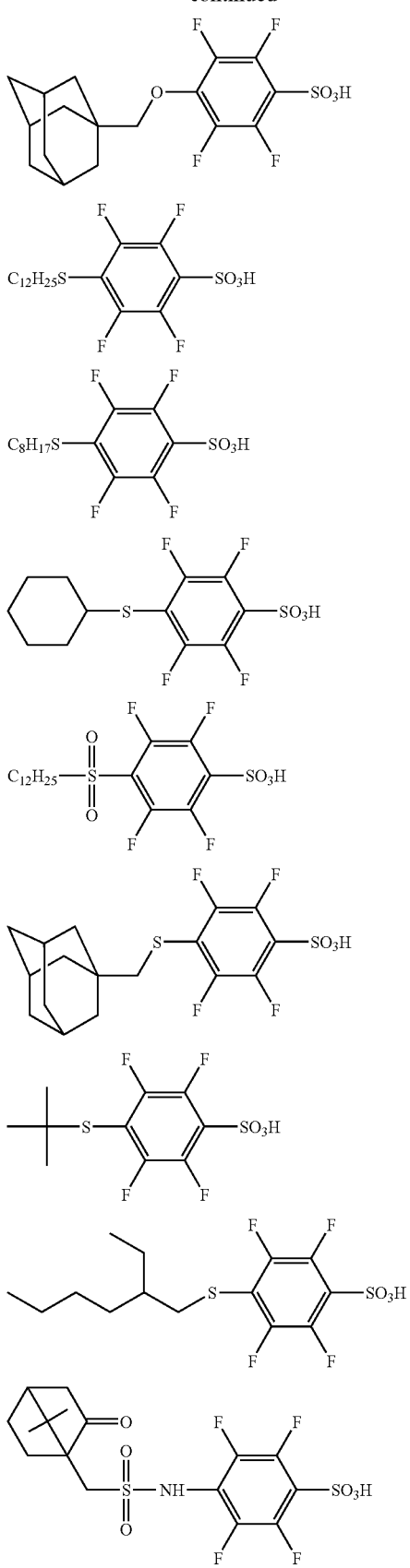

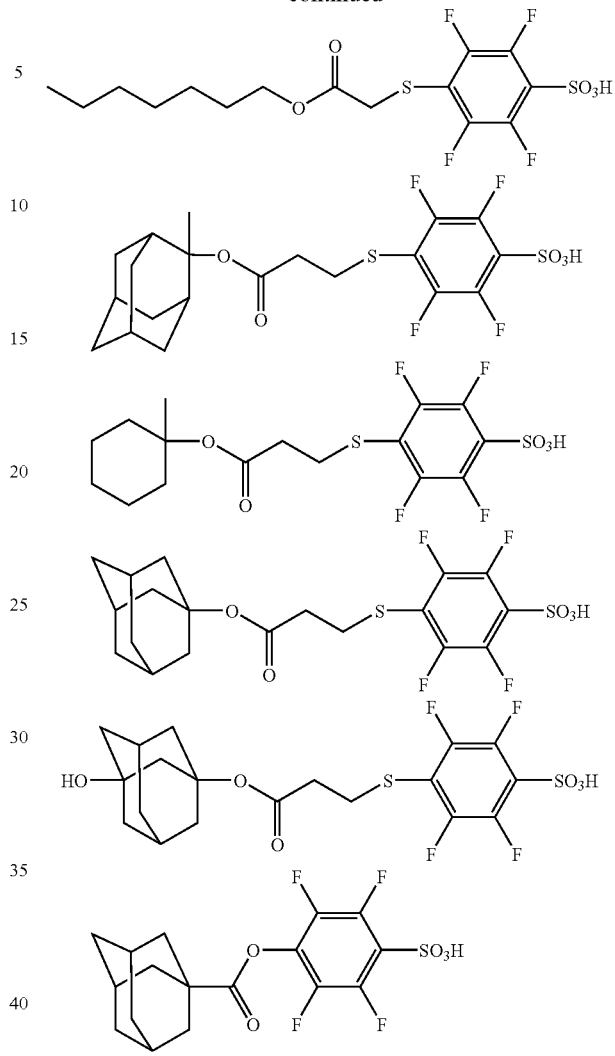

Examples of the compound generating an acid represented by the formula (BII) in irradiation with actinic light or radiation include diazonium salts, phosphonium salts, sulfonium salts, iodonium salts, imidosulfonate, oxime sulfonate and o-nitrobenzyl sulfonate.

Of the compounds which decompose and generate an acid upon irradiation with actinic light or radiation, compounds represented by the following formulas (ZIa) and (ZIIa) are preferred.

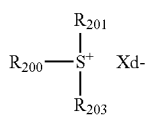

ZIa

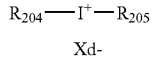

ZIIa

In the formula (ZIa), $R_{201}$, $R_{202}$, and $R_{203}$ each independently has an organic group.

Xd⁻ represents an anion of the acid represented by the formula (BII).

Specific examples of the organic group as $R_{201}$, $R_{202}$, and $R_{203}$ include groups corresponding to Compounds (ZI-1a), (ZI-2a) and (ZI-3a) which will be described later.

The organic group may be a compound having a plurality of structures represented by formula (ZIa). For example, the compound may have a structure such that at least one of $R_{201}$ to $R_{203}$ of a compound represented by the formula (ZIa) is bonded to at least one of $R_{201}$ to $R_{203}$ of another compound represented by the formula (ZIa).

Compounds (ZI-1a), (ZI-2a) and (ZI-3a) described below can be given as more preferred examples of Component (ZIa).

Compound (ZI-1a) is an arylsulfonium compound having an aryl group as at least one of $R_{201}$ to $R_{203}$ in the formula (ZIa), that is, a compound having an arylsulfonium as a cation.

In the arylsulfonium compound, all of $R_{201}$ to $R_{203}$ may be an aryl group or some of $R_{201}$ to $R_{203}$ may be an aryl group with the remaining being an alkyl group.

Examples of the arylsulfonium compound include triarylsulfonium compounds, diarylalkylsulfonium compounds, and aryldialkylsulfonium compounds.

The aryl group of the arylsulfonium compound is preferably an aryl group such as phenyl group or naphthyl group, or a heteroaryl group such as indole residue or pyrrole residue, more preferably a phenyl group or indole residue. When the arylsulfonium compound has two or more aryl groups, these two or more aryl groups may be the same of different.

The alkyl group which the arylsulfonium compound has if necessary is preferably a linear, branched or cyclic $C_{1-15}$ alkyl group and examples thereof include methyl group, ethyl group, propyl group, n-butyl group, sec-butyl group, t-butyl group, cyclopropyl group, cyclobutyl group and cyclohexyl group.

The aryl group or alkyl group of $R_{201}$ to $R_{203}$ may have, as the substituent, an alkyl group (for example, $C_{1-15}$ alkyl group), an aryl group (for example, $C_{6-14}$ aryl group), alkoxy group (for example, a $C_{1-15}$ alkoxy group), a halogen atom, a hydroxyl group, or a phenylthio group. The substituent is preferably a linear, branched or cyclic $C_{1-12}$ alkyl group or a linear, branched or cyclic $C_{1-12}$ alkoxy group, most preferably a $C_{1-4}$ alkyl group or a $C_{1-4}$ alkoxy group. The substituent may be substituted to any one of three $R_{201}$ to $R_{203}$ or may be substituted to all of them. When $R_{201}$ to $R_{203}$ each represents an aryl group, the substituent is preferably substituted at the p-position of the aryl group.

Preferred examples of the arylsulfonium cation include triphenylsulfonium cation which may be substituted, naphthyltetrahydrothiophenium cation which may be substituted and phenyltetrahydrothiophenium cation which may be substituted.

Compound (ZI-2a) will be described next.

Compound (ZI-2a) is a compound of the formula (ZIa) in which $R_{201}$ to $R_{203}$ in formula (ZIa) each independently represents an organic group containing no aromatic ring. The term "aromatic ring" as used herein embraces even an aromatic ring containing a heteroatom.

The organic group, as $R_{201}$ to $R_{203}$, containing no aromatic ring has typically from 1 to 30 carbon atoms, preferably from 1 to 20 carbon atoms.

$R_{201}$ to $R_{203}$ each independently and preferably represents an alkyl group, a 2-oxoalkyl group, an alkoxycarbonylmethyl group, an allyl group, or a vinyl group, more preferably a linear, branched or cyclic 2-oxoalkyl group or an alkoxycarbonylmethyl group, most preferably a linear or branched 2-oxoalkyl group.

The alkyl group as $R_{201}$ to $R_{203}$ may be any of linear, branched or cyclic and is preferably a linear or branched $C_{1-10}$ alkyl group (such as methyl group, ethyl group, propyl group, butyl group or pentyl group) or a cyclic $C_{3-10}$ alkyl group (such as cyclopentyl group, cyclohexyl group or norbornyl group).

The 2-oxoalkyl group as $R_{201}$ to $R_{203}$ may be any of linear, branched or cyclic and is preferably a group having >C=O at the 2-position of the alkyl group.

The alkoxy group of the alkoxycarbonylmethyl group as $R_{201}$ to $R_{203}$ is preferably a $C_{1-5}$ alkoxy group (such as methoxy group, ethoxy group, propoxy group, butoxy group or pentoxy group).

$R_{201}$ to $R_{203}$ may be substituted further with a halogen atom, an alkoxy group (for example, a $C_{1-5}$ alkoxy group), a hydroxyl group, a cyano group or a nitro group.

Two of $R_{201}$ to $R_{203}$ may be coupled to form a ring structure, and the ring may contain therein an oxygen atom, a sulfur atom, an ester bond, an amide bond or a carbonyl group. Examples of the group formed by coupling of two of $R_{201}$ to $R_{203}$ include alkylene groups (such as butylene group and pentylene group).

Compound (ZI-3a) is a compound represented by the following formula (ZI-3a) and having a phenacylsulfonium salt structure.

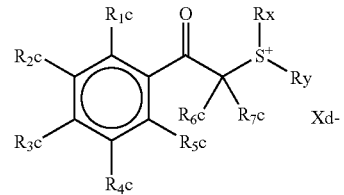

(ZI-3a)

$R_{1c}$ to $R_{5c}$ each independently represents a hydrogen atom, an alkyl group, an alkoxy group, or a halogen atom.

$R_{6c}$ and $R_{7c}$ each represents a hydrogen atom or an alkyl group.

$R_x$ and $R_y$ each independently represents an alkyl group, a 2-oxoalkyl group, an alkoxycarbonylmethyl group, an allyl group, or a vinyl group.

At least any two of $R_{1c}$ to $R_{5c}$, or $R_x$ and $R_y$ may be coupled to form a ring structure and the ring structure may contain an oxygen atom, a sulfur atom, an ester bond or an amide bond.

Xd⁻ represents an anion of an acid represented by the formula (BII).

The alkyl group as $R_{1c}$ to $R_{5c}$ may be any of linear, branched or cyclic alkyl groups, for example, $C_{1-20}$ alkyl groups. Preferred examples thereof include linear or branched $C_{1-12}$ alkyl groups (such as methyl group, ethyl group, linear or branched propyl group, linear or branched butyl group, and linear or branched pentyl group) and cyclic $C_{3-8}$ alkyl groups (such as cyclopentyl group and cyclohexyl group).

The alkoxy group as $R_{1c}$ to $R_{5c}$ may be any of linear, branched or cyclic alkoxy groups, for example, $C_{1-10}$ alkoxy groups. Preferred examples include linear or branched $C_{1-5}$ alkoxy groups (such as methoxy group, ethoxy group, linear or branched propoxy group, linear or branched butoxy group, and linear or branched pentoxy group) and cyclic $C_{3-8}$ alkoxy groups (such as cyclopentyloxy group and cyclohexyloxy group).

Preferably, any one of $R_{1c}$ to $R_{5c}$ is a linear, branched, or cyclic alkyl group or a linear, branched, or cyclic alkoxy group. More preferably, the sum of carbon atoms of from $R_{1c}$ to $R_{5c}$ is from 2 to 15. This enables improvement of solubility in a solvent and prevention of generation of particles during storage.

Examples of the alkyl group as $R_x$ and $R_y$ are similar to those of the alkyl group as $R_{1c}$ to $R_{5c}$.

Examples of the 2-oxoalkyl group include the alkyl groups which are given as $R_{1c}$ to $R_{5c}$ and have >C=O at the 2-position thereof.

Examples of the alkoxy group of the alkoxycarbonylmethyl group are similar to those of the alkoxy group as $R_{1c}$ to $R_{5c}$.

Examples of the group formed by coupling of $R_x$ and $R_y$ include butylene group and pentylene group.

$R_x$ and $R_y$ are each preferably an alkyl group having 4 or more carbon atoms, more preferably 6 or more carbon atoms, still more preferably 8 or more carbon atoms.

In formula (ZIIa), $R_{204}$ and $R_{205}$ each independently represents an aryl group which may be substituted or an alkyl group which may be substituted.

The aryl group of $R_{204}$ or $R_{205}$ is preferably a phenyl group or a naphthyl group, more preferably a phenyl group.

The alkyl group as $R_{204}$ or $R_{205}$ is preferably any of linear, branched or cyclic alkyl groups. Preferred examples include linear or branched $C_{1-10}$ alkyl groups (such as methyl group, ethyl group, propyl group, butyl group, and pentyl group) and cyclic $C_{3-10}$ alkyl groups (such as cyclopentyl group, cyclohexyl group, and norbornyl group).

Examples of the substituent which $R_{204}$ or $R_{205}$ may have include alkyl groups (such as $C_{1-15}$ alkyl groups), aryl groups (such as $C_{6-15}$ aryl groups), alkoxy groups (such as $C_{1-15}$ alkoxy groups), halogen atoms, hydroxyl group and phenylthio group.

Further preferred examples of the compounds which decompose and generate an acid upon irradiation with actinic light or radiation include compounds represented by the following formulas (ZIIIa) and (ZIVa).

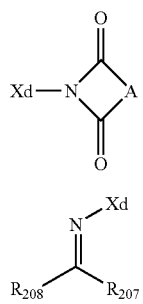

ZIIIa

ZIVa

In the formulas (ZIIIa) and (ZIVa),

Xd represents a monovalent group obtained by removal of a hydrogen atom from the acid represented by the formula (BII).

$R_{207}$ and $R_{208}$ each represents a substituted or unsubstituted alkyl group, a substituted or unsubstituted aryl group, or an electron withdrawing group. $R_{207}$ is preferably a substituted or unsubstituted aryl group.

$R_{208}$ is preferably an electron withdrawing group, more preferably a cyano group or fluoroalkyl group.

A represents a substituted or unsubstituted alkylene group, a substituted or unsubstituted alkenylene group, or a substituted or unsubstituted arylene group.

Of the compounds which decompose and generate an acid upon irradiation with actinic light or radiation, compounds represented by the formulas (ZIa) to (ZIIa) are more preferred, of which compounds represented by the formula (ZIa) are still more preferred and compounds represented by the formulas (ZI-1a) to (ZI-3a) are most preferred.

Especially preferred examples of Component (B) will next be shown, but the present invention is not limited to them.

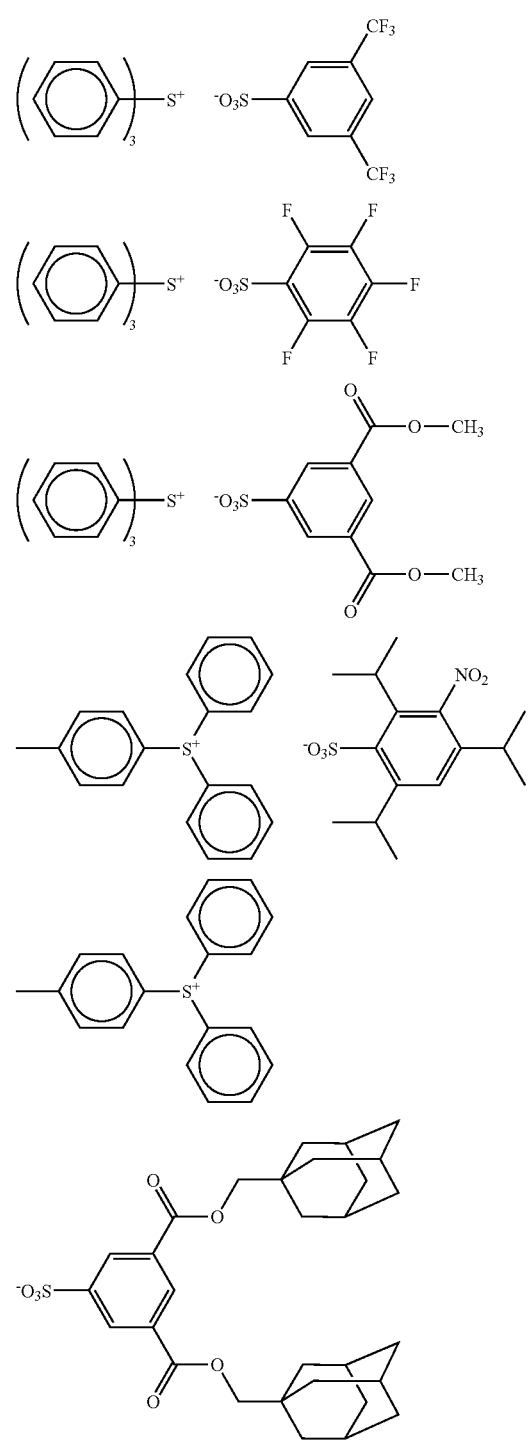

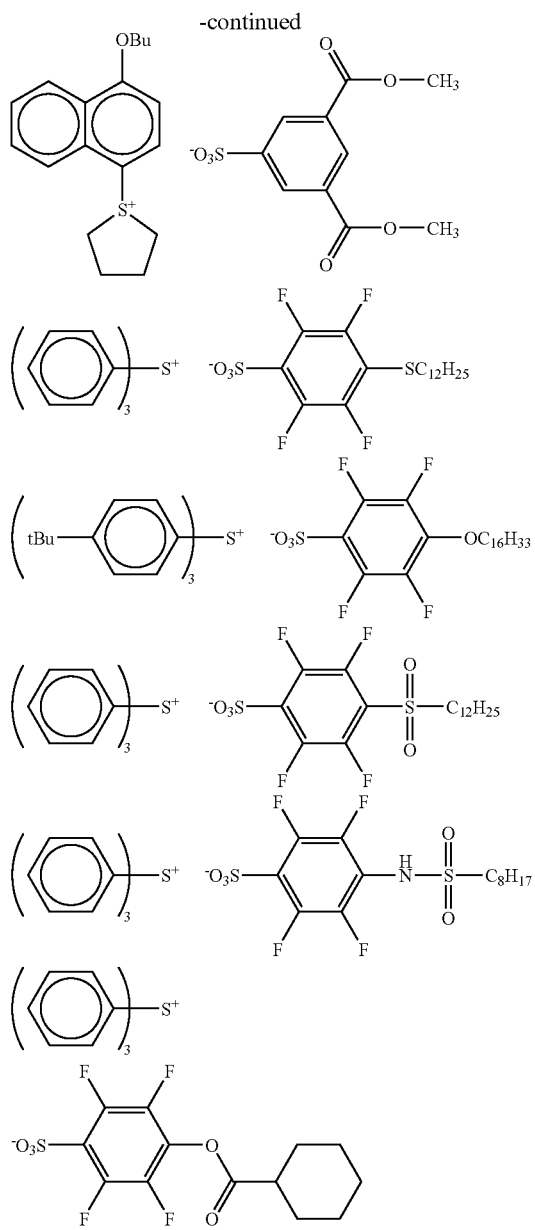
Examples of another preferred acid generator include, but not limited to, following compounds.
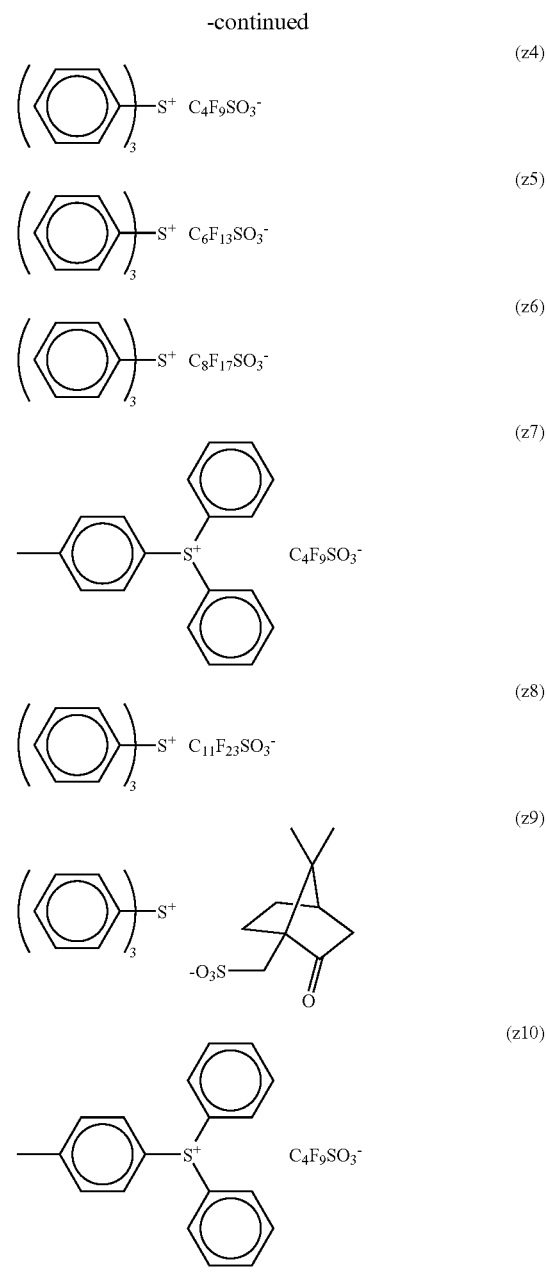

-continued
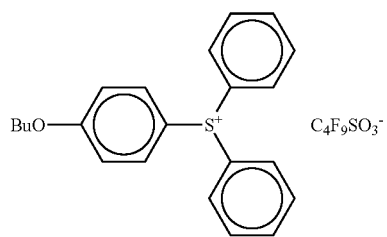
(z13)
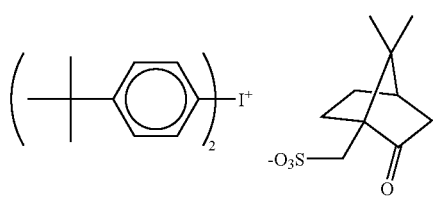
(z14)
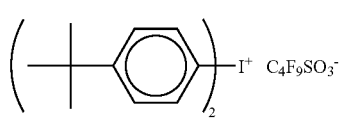
(z15)
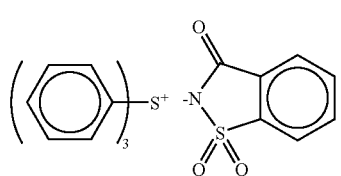
(z16)
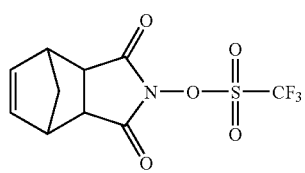
(z17)
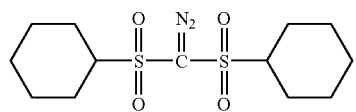
(z18)
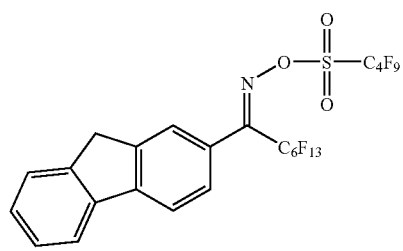
(z19)
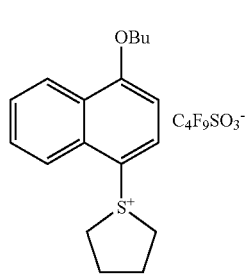
(z20)
-continued
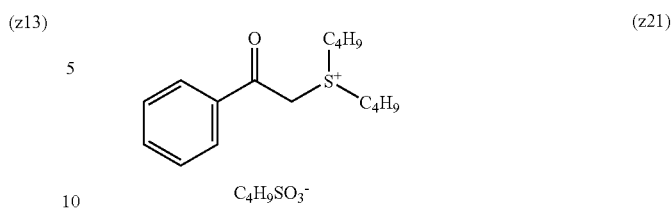
(z21)
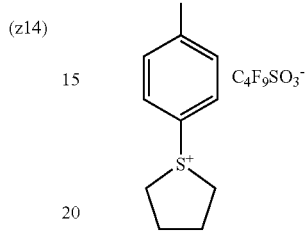
(z22)
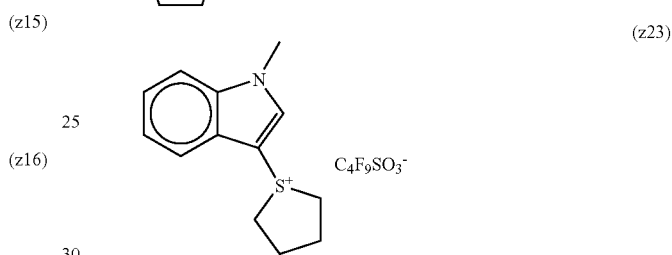
(z23)
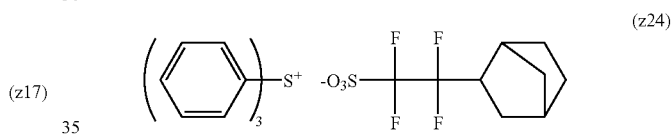
(z24)
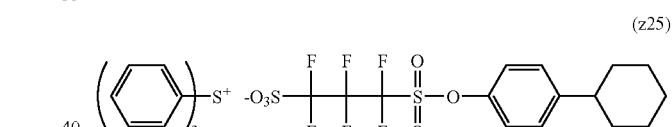
(z25)
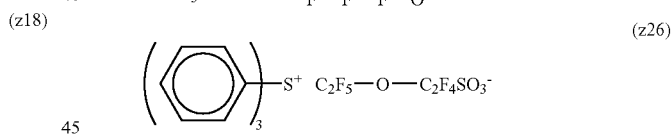
(z26)
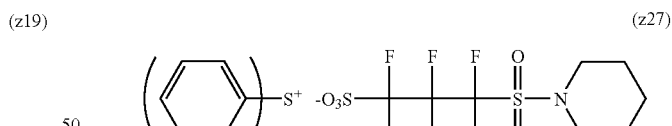
(z27)
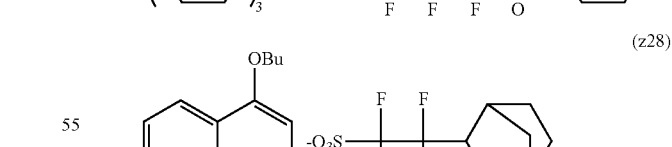
(z28)

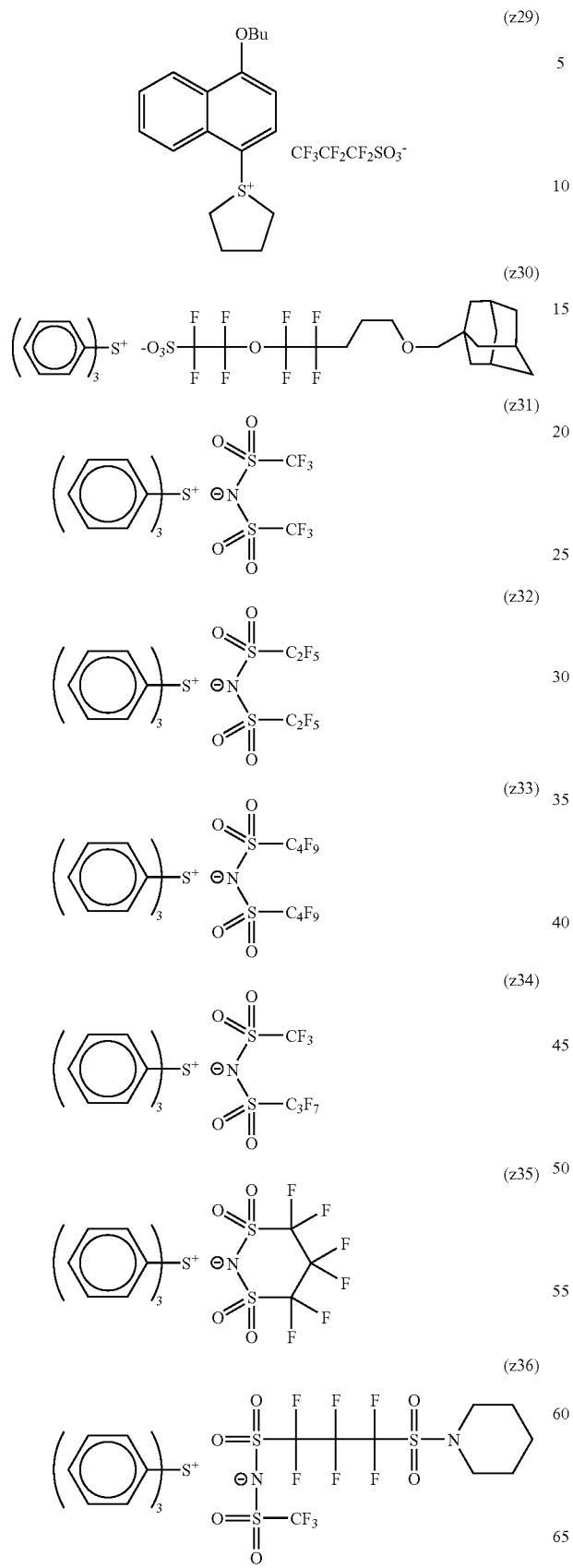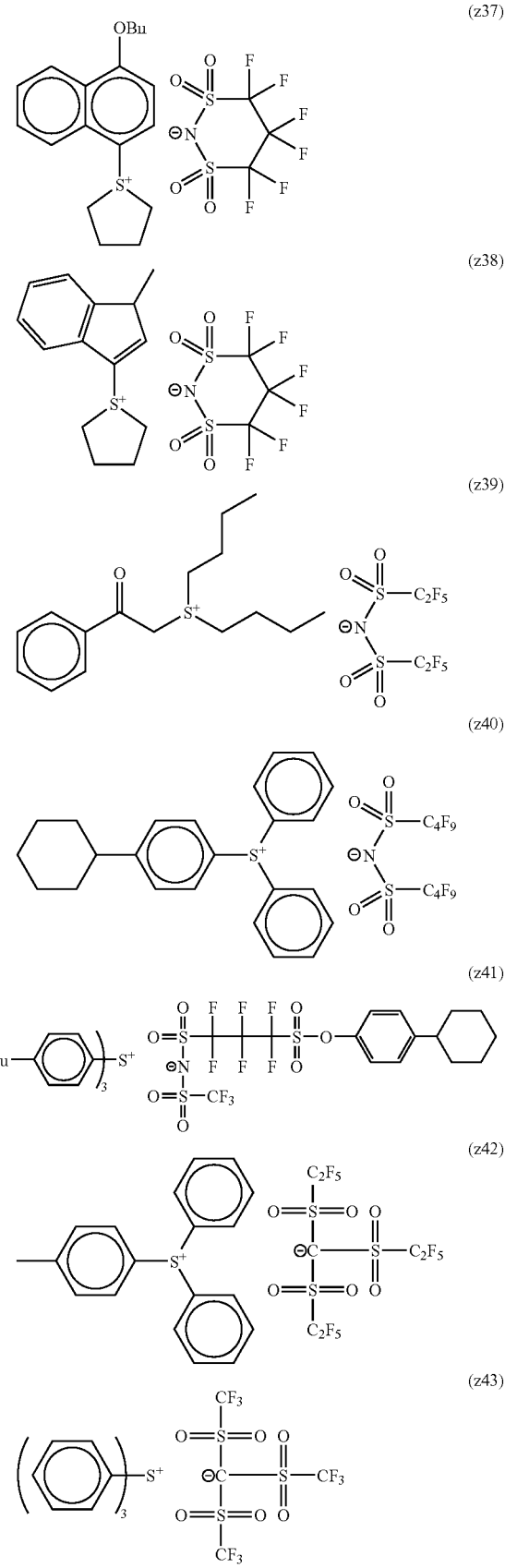

-continued

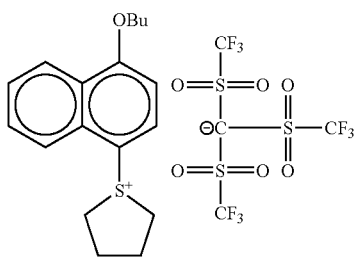
(z44)

The compounds as Component (B) may be used either singly or in combination. When two or more of them are used in combination, it is preferred to use compounds differing in the total number of atoms excluding hydrogen atoms by 2 or more and generating two organic acids.

The content of the compound as Component (B) in the composition is preferably from 0.1 to 20 mass %, more preferably from 1 to 10 mass %, still more preferably from 3 to 8 mass %, especially preferably from 4 to 7 mass %, based on the total solid content of the resist composition.

(C) Resin Containing Neither Fluorine Nor Silicon and Having a Repeating Unit Selected from Repeating Units Represented by the Following Formulas (C-I) to (C-III)

The photosensitive composition of the invention has Resin (C) (which may hereinafter be called "hydrophobic resin (HR)") containing neither fluorine nor silicon and having a repeating unit selected from repeating units represented by the following formulas (C-I) to (C-III).

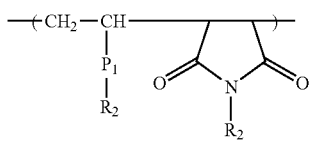
(C-I)

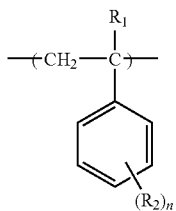
(C-II)

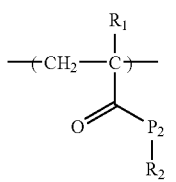
(C-III)

In the formulas (C-I) to (C-III), $R_1$s each independently represents a hydrogen atom or a methyl group, $R_2$s each independently represents a hydrocarbon group with at least one —$CH_3$ partial structure (that is, methyl group), $P_1$ represents a single bond or a linking group having an alkylene group, an ether group or two or more of them, $P_2$ represents a linking group selected from —O—, —NR— (in which R represents a hydrogen atom or an alkyl group) and —$NHSO_2$—, and n stands for an integer from 1 to 4.

These repeating units may be used either singly or in combination.

Preferred examples of the hydrocarbon group having one or more —$CH_3$ partial structures (that is, methyl group) as $R_2$ in the formulas (C-I) to (C-III) include alkyl groups, alkyloxy groups, alkyl-substituted cycloalkyl groups, alkenyl groups, alkyl-substituted alkenyl groups, alkyl-substituted cycloalkenyl groups, alkyl-substituted aryl groups, and alkyl-substituted aralkyl groups each having one or more —$CH_3$ partial structures, of which the alkyl groups and alkyl-substituted cycloalkyl groups are preferred. The hydrocarbon group, of $R_2$, having one or more —$CH_3$ partial structures has more preferably two or more —$CH_3$ partial structures.

The alkyl group, of $R_2$, having at least one —$CH_3$ partial structure is preferably a branched $C_{3-20}$ alkyl group. Preferred alkyl groups include isopropyl group, isobutyl group, t-butyl group, 3-pentyl group, 2-methyl-3-butyl group, 3-hexyl group, 2-methyl-3-pentyl group, 3-methyl-4-hexyl group, 3,5-dimethyl-4-pentyl group, isooctyl group, 2,4,4-trimethylpentyl group, 2-ethylhexyl group, 2,6-dimethylheptyl group, 1,5-dimethyl-3-heptyl group and 2,3,5,7-tetramethyl-4-heptyl group. Of these, more preferred are isobutyl group, t-butyl group, 2-methyl-3-butyl group, 2-methyl-3-pentyl group, 3-methyl-4-hexyl group, 3,5-dimethyl-4-pentyl group, 2,4,4-trimethylpentyl group, 2-ethylhexyl group, 2,6-dimethylheptyl group, 1,5-dimethyl-3-heptyl group and 2,3,5,7-tetramethyl-4-heptyl group.

As the alkyl group, of $R_2$, having a —$CH_3$ partial structure, linear $C_{1-20}$ alkyl groups are preferred. Specific examples of the preferred alkyl group include methyl group, ethyl group, propyl group, butyl group, pentyl group, hexyl group, heptyl group, octyl group and nonyl group.

Examples of the alkyloxy group, of $R_2$, having at least one —$CH_3$ partial structure include groups in which an ether group has been bonded to an alkyl group having at least two —$CH_3$ partial structures.

The cycloalkyl group of $R_2$ may be either monocyclic or polycyclic. Specific examples include groups having a monocyclo, bicyclo, tricyclo or tetracyclo structure having 5 or more carbon atoms. The number of carbon atoms is preferably from 6 to 30, especially preferably from 7 to 25.

Preferred examples of the cycloalkyl group include adamantyl group, noradamantyl group, decalin residue, tricyclodecanyl group, tetracyclododecanyl group, norbornyl group, cedrol group, cyclopentyl group, cyclohexyl group, cycloheptyl group, cyclooctyl group, cyclodecanyl group, and cyclododecanyl group. More preferred are adamantyl group, norbornyl group, cyclohexyl group, cyclopentyl group, tetracyclododecanyl group and tricyclodecanyl group, with norbornyl group, cyclopentyl group and cyclohexyl group being more preferred.

The alkenyl group of $R_2$ is preferably a linear or branched $C_{1-20}$ alkenyl group, more preferably a branched alkenyl group.

The aryl group of $R_2$ is preferably a $C_{6-20}$ aryl group such as phenyl group and naphtyl group, with phenyl group being preferred.

The aralkyl group of $R_2$ is preferably a $C_{7-12}$ aralkyl group, for example, benzyl group, phenetyl group and naphthylmethyl group.

Specific examples of the hydrocarbon structure, of $R_2$, having at least two —$CH_3$ partial structures in the formulas (C-I) and (C-II) include isopropyl group, isobutyl group, t-butyl group, 3-pentyl group, 2-methyl-3-butyl group, 3-hexyl group, 2,3-dimethyl-2-butyl group, 2-methyl-3-pentyl group, 3-methyl-4-hexyl group, 3,5-dimethyl-4-pentyl group, isooctyl group, 2,4,4-trimethylpentyl group, 2-ethylhexyl group, 2,6-dimethylheptyl group, 1,5-dimethyl-3-heptyl group, 2,3,5,7-tetramethyl-4-heptyl group, 3,5-dimethylcyclohexyl group, 4-isopropylcyclohexyl group, 4-t-butylcyclohexyl group and isobornyl group. More preferred are isobutyl group, t-butyl group, 2-methyl-3-butyl group, 2,3-dimethyl-2-butyl group, 2-methyl-3-pentyl group, 3-methyl-4-hexyl group, 3,5-dimethyl-4-pentyl group, 2,4,4-trimethylpentyl group, 2-ethylhexyl group, 2,6-dimethylheptyl group, 1,5-dimethyl-3-heptyl group, 2,3,5,7-tetramethyl-4-heptyl group, 3,5-dimethylcyclohexyl group, 4-isopropylcyclohexyl group, 4-t-butylcyclohexyl group and isobornyl group.

Specific examples of the hydrocarbon structure, of $R_3$, having at least two —$CH_3$ partial structures in the formula (C-IIII) include isobutyl group, t-butyl group, 3-pentyl group, 2,3-dimethylbutyl group, 2-methyl-3-butyl group, 3-hexyl group, 2-methyl-3-pentyl group, 3-methyl-4-hexyl group, 3,5-dimethyl-4-pentyl group, isooctyl group, 2,4,4-trimethylpentyl group, 2-ethylhexyl group, 2,6-dimethylheptyl group, 1,5-dimethyl-3-heptyl group, 2,3,5,7-tetramethyl-4-heptyl group, 3,5-dimethylcyclohexyl group, 4-isopropylcyclohexyl group, and 4-t-butylcyclohexyl group. The hydrocarbon group of $R_3$ has more preferably from 5 to 20 carbon atoms and examples include 2-methyl-3-butyl group, 2-methyl-3-pentyl group, 3-methyl-4-hexyl group, 3,5-dimethyl-4-pentyl group, 2,4,4-trimethylpentyl group, 2-ethylhexyl group, 2,6-dimethylheptyl group, 1,5-dimethyl-3-heptyl group, 2,3,5,7-tetramethyl-4-heptyl group, 2,6-dimethylheptyl group, 3,5-dimethylcyclohexyl group, 4-isopropylcyclohexyl group, and 4-t-butylcyclohexyl group.

The total content of the repeating unit selected from those represented by the formulas (C-I) to (C-III) is preferably from 80 to 100 mol %, more preferably from 90 to 100 mol % based on the total repeating units in the polymer.

The following are preferred specific examples of the repeating unit represented by the formula (C-I), but the invention is not limited to or by them.

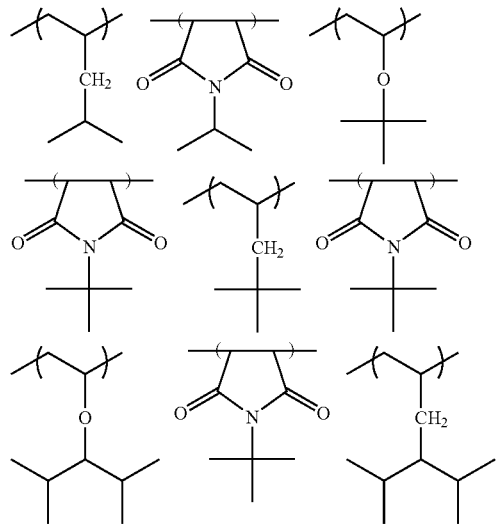

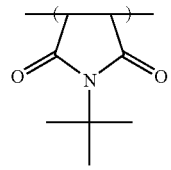

The following are preferred specific examples of the repeating unit represented by the formula (C-II), but the invention is not limited to or by them.

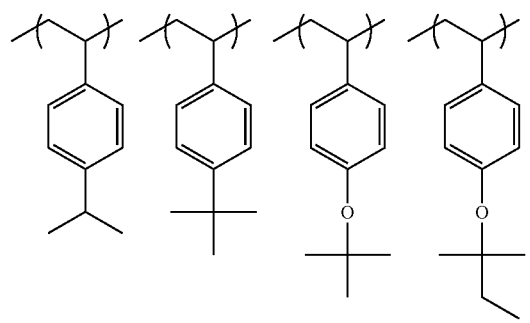

In the formula (C-III), when $P_2$ represents an oxygen atom, the carbon atom directly bonded to the oxygen atom is preferably secondary or tertiary.

The following are specific preferred examples of the repeating unit represented by the formula (C-III), but the present invention is not limited to or by them. In these examples, Rx represents a hydrogen atom or a methyl group, and Rxa and Rxb each represents a $C_{1-4}$ alkyl group.

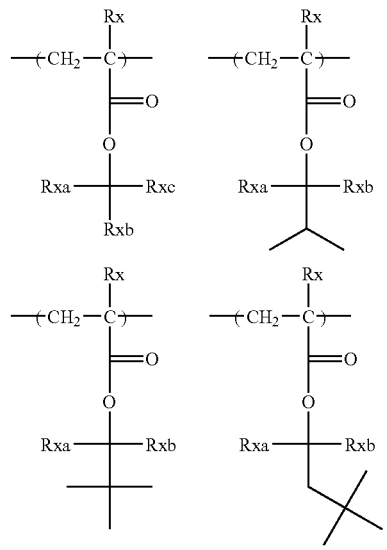

-continued
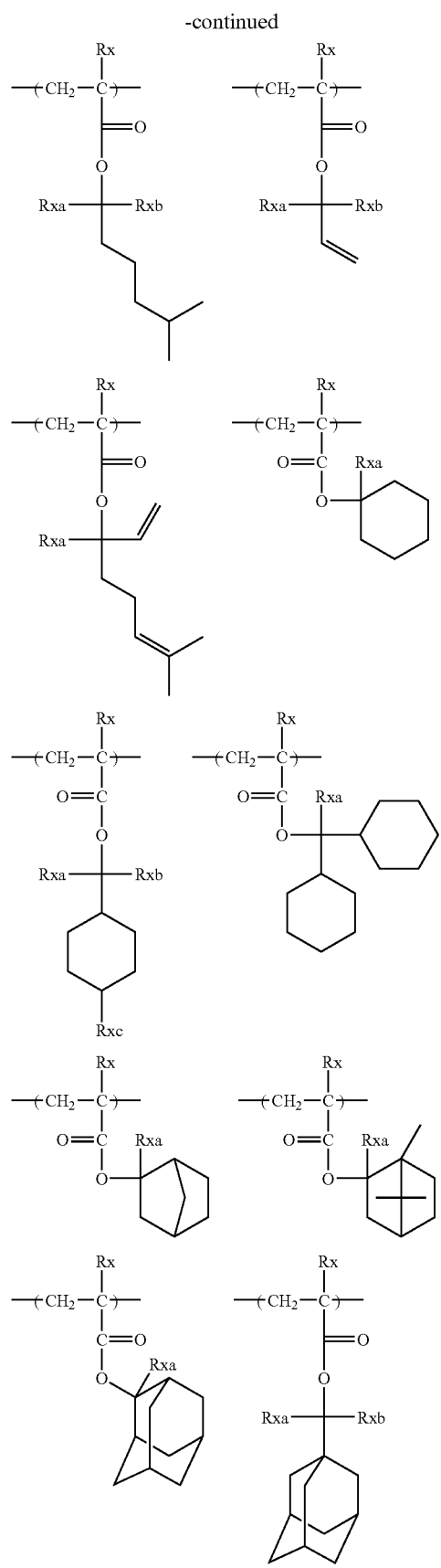
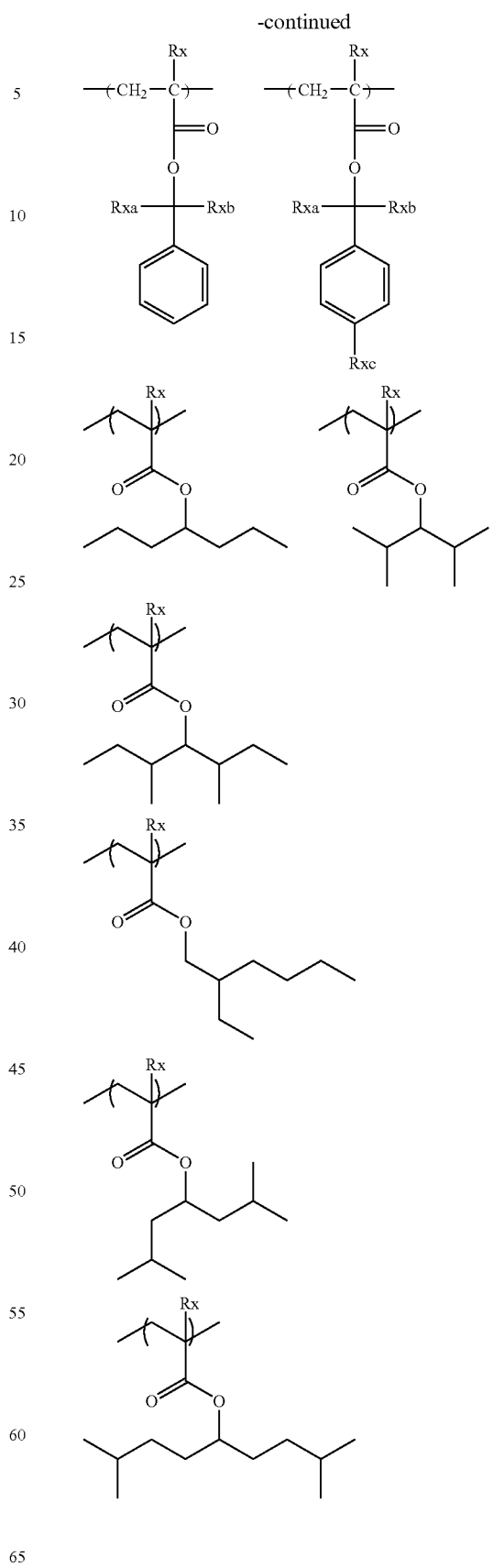

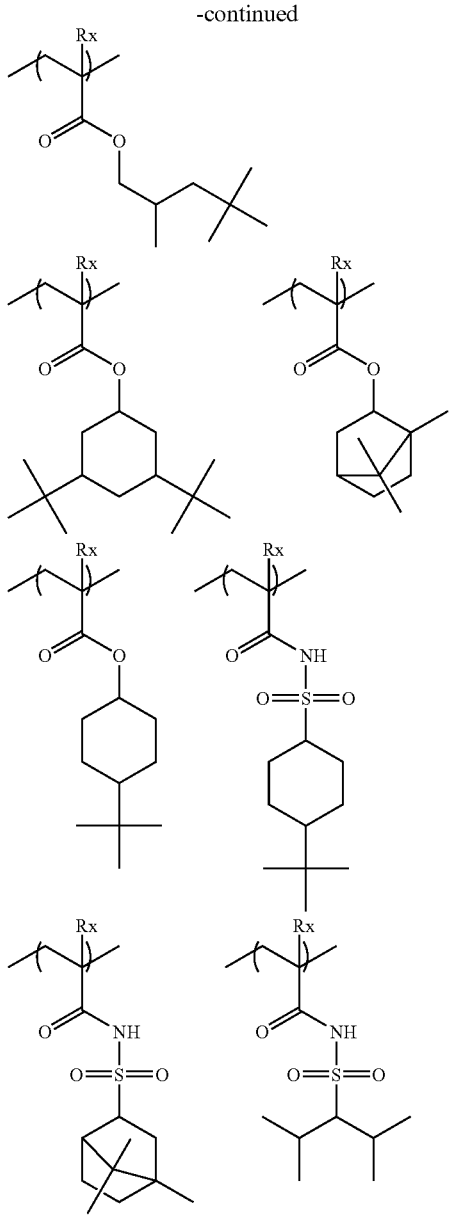

The resin of Component (C) has neither a silicon atom nor a fluorine atom.

The resin of Component (C) preferably has no elements other than carbon, hydrogen, oxygen, nitrogen, and sulfur atoms.

The resin of Component (C) has preferably a repeating unit represented by the following formula (C) further.

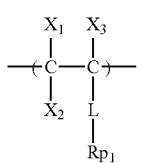

In the formula (C), $X_1$, $X_2$, and $X_3$ each independently represents a hydrogen atom, an alkyl group or a halogen atom, L represents a single bond or a divalent linking group, and $Rp_1$ represents an acid decomposable group.

The repeating unit represented by the formula (C) is preferably a repeating unit represented by the following formula (C1).

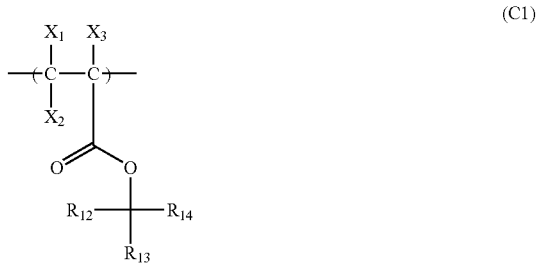

In the formula (C1), $X_1$, $X_2$, and $X_3$ each independently represents a hydrogen atom, an alkyl group or a halogen atom.

$R_{12}$, $R_{13}$ and $R_{14}$ each independently represents an alkyl group, a cycloalkyl group, an alkenyl group or an aryl group with the proviso that at least one of $R_{12}$, $R_{13}$ and $R_{14}$ represents an allyl group, or two of $R_{12}$, $R_{13}$ and $R_{14}$ may be coupled to form a ring.

The photosensitive composition containing the hydrophobic resin (HR) has improved followability of the immersion liquid because the hydrophobic resin (HR) is located eccentrically on the surface layer of the photosensitive film and improves a receding contact angle of the surface of the photosensitive film with water used as an immersion medium.

As the hydrophobic resin (HR), any resin capable of improving the receding contact angle of the surface is usable, but a resin having at least either one of a fluorine atom and a silicon atom is preferred. The receding contact angle of the photosensitive film formed using the photosensitive composition of the invention is preferably from 60° to 90°, more preferably 70° or greater.

The hydrophobic resin (HR) may be added while adjusting as needed the receding contact angle of the photosensitive film to fall within the above-described range. It is preferably from 0.1 to 10 mass %, more preferably from 0.1 to 5 mass % based on the total solid content of the photosensitive composition.

The term "receding contact angle" as defined herein means a receding contact angle measured by the extension/contraction method. More specifically, it can be measured using a full automatic contact angle meter ("DM700", trade name; product of Kyowa Interface Science). A droplet (36 μl) is formed using a syringe on a positive resist composition prepared on a silicon wafer and it is then sucked at a rate of 6 μL/sec. The contact angle which becomes stable during the suction is taken as the receding contact angle.

The hydrophobic resin (HR) is located eccentrically on the interface as described above, but different from the surfactant (E), it does not necessarily have a hydrophilic group in the molecule and contribute to uniform mixing of a polar/nonpolar substance.

The resin (HR) may further contain at least one group selected from the class consisting of the following groups (x) to (z):

(x) an alkali soluble group, (y) a group which decomposes by the action of an alkali developer and has an increased solubility in an alkali developer, and (z) a group which decomposes by the action of an acid.

Examples of the alkali soluble group (x) include groups having a phenolic hydroxyl group, a carboxylic acid group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Of these alkali soluble groups, sulfonimide group, and bis(carbonyl)methylene group are preferred.

As the repeating unit with the alkali soluble group (x), any of repeating units having the alkali soluble group bonded directly to the main chain of the resin such as repeating units by acrylic acid or methacrylic acid, repeating units having the alkali soluble group bonded to the main chain of the resin via a linking group, and repeating units having the alkali soluble group introduced into the end of the polymer chain at the time of polymerization by using an alkali-soluble-group-containing polymerization initiator or chain transfer agent is preferred.

The content of the repeating unit with the alkali soluble group (x) is preferably from 0 to 20 mol %, more preferably from 0 to 10 mol % based on the total repeating units in the polymer.

The following are specific examples of the repeating unit with the alkali soluble group (x).

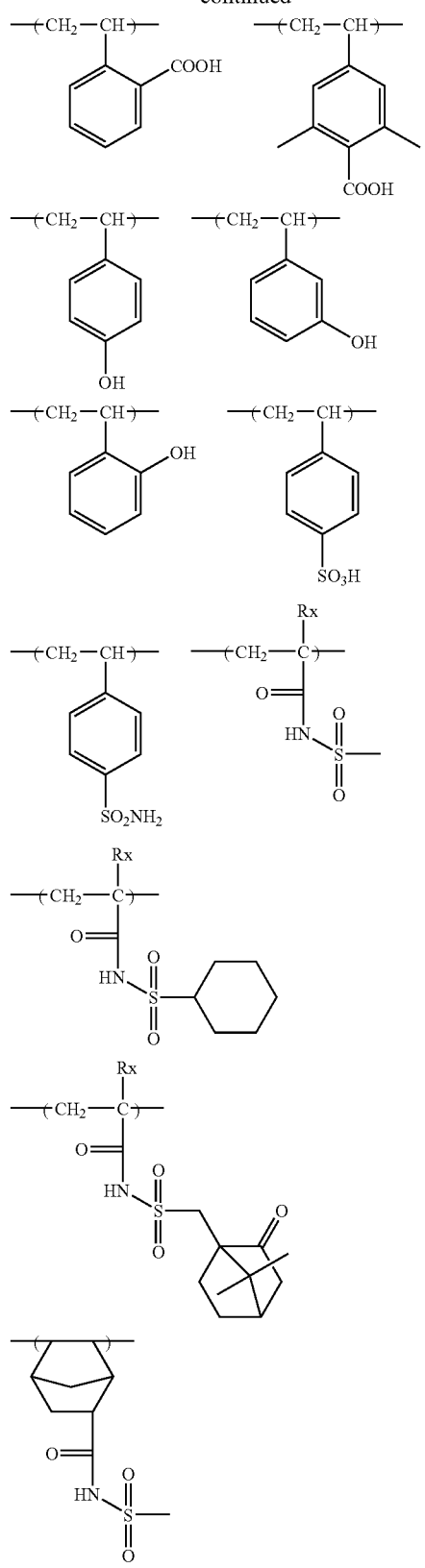

-continued

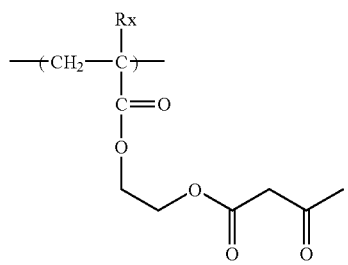
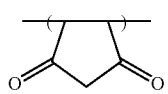

Examples of the group (y) which decomposes by the action of an alkali developer and has an increased solubility in the alkali developer include groups having a lactone structure, acid anhydrides and acid imide groups, of which the lactone group is preferred.

As a repeating unit having the group (y) which decomposes by the action of an alkali developer and has an increased solubility in the alkali developer, any of repeating units having the alkali soluble group bonded to the main chain of the resin via a linking group such as repeating unit by acrylate or methacrylate, and repeating units having the alkali soluble group introduced into the end of the polymer chain at the time of polymerization by using a polymerization initiator or chain transfer agent having the group (y) having an increased solubility in the alkali developer is preferred.

The content of the repeating unit with the group (y) having an increased solubility in the alkali developer is preferably from 0 to 20 mol %, more preferably from 0 to 10 mol % based on the total repeating units in the polymer.

The following are specific examples of the repeating unit having the group (y) having an increased solubility in the alkali developer.

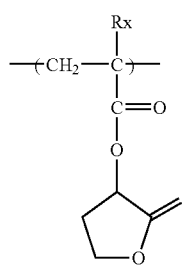
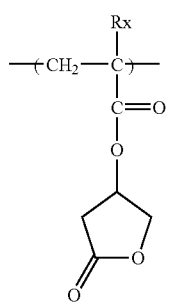
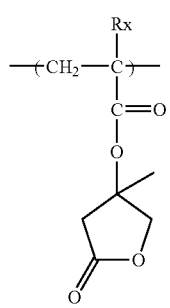
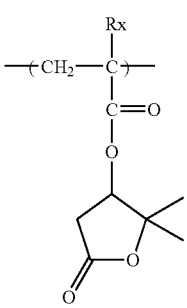

-continued

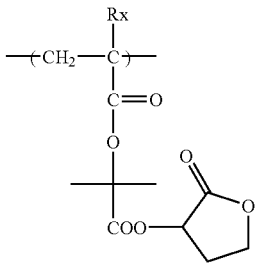
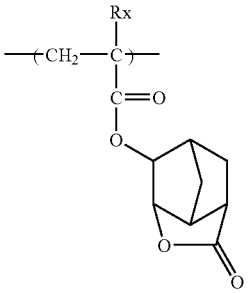
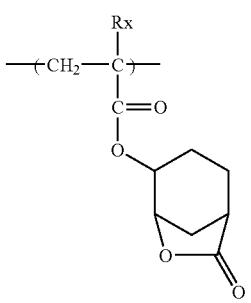
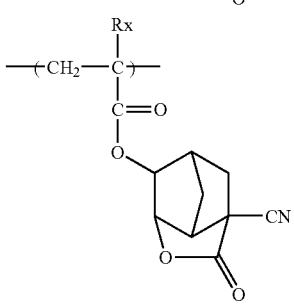
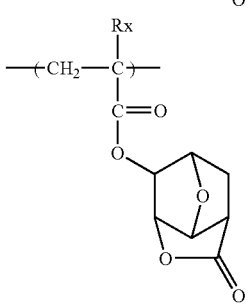
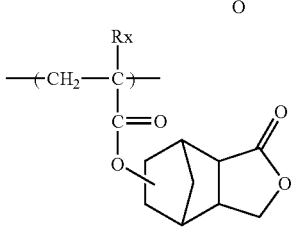
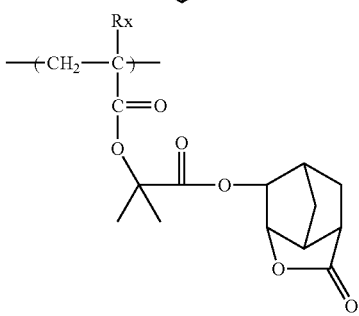

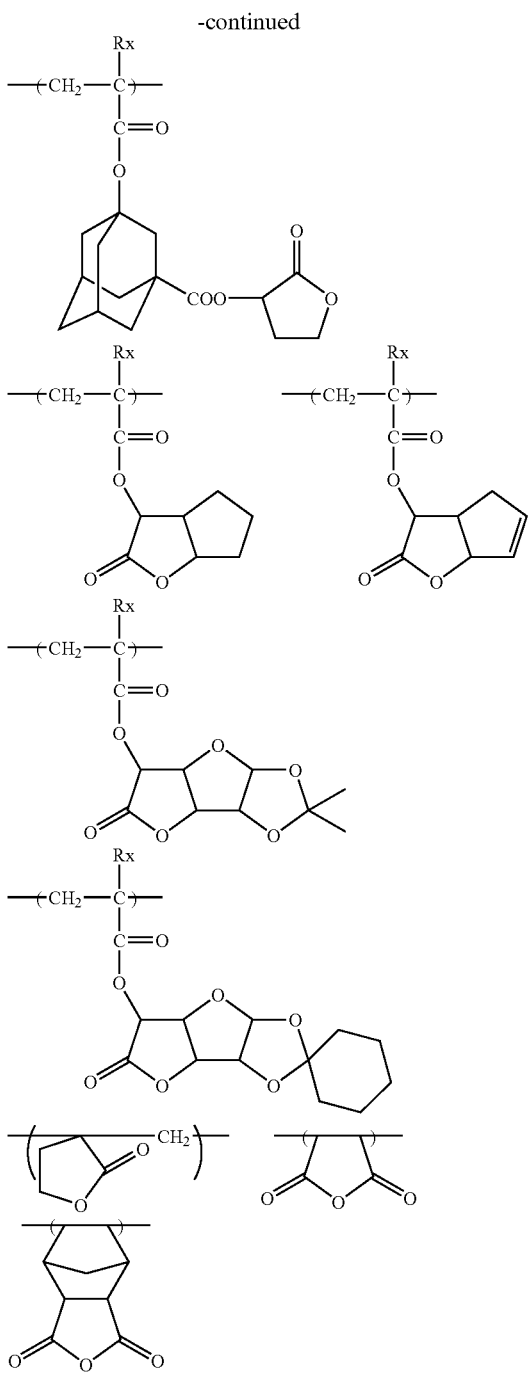

Examples of the group which decomposes by the action of an acid are similar to those given in Resin (A). The content of a repeating unit having the group (z) which decomposes by the action of an acid is preferably from 0 to 100 mol %, more preferably from 0 to 80 mol %, still more preferably from 0 to 50 mol % based on the total repeating units in the polymer.

The content of the resin of Component (C) is from 0.1 to 20 mass %, more preferably from 0.1 to 10 mass %, still more preferably from 0.1 to 5 mass % based on the solid content (total solid content constituting the resist film) of the positive resist composition.

The resin (HR) has preferably a weight average molecular weight, relative to polystyrene standards, of preferably from 1,000 to 100,000, more preferably from 2,000 to 50,000, still more preferably from 3,000 to 15,000. The resin of Component (C) has a dispersity (Mw/Mn) of preferably from 1.0 to 3.0, more preferably from 1.2 to 2.5, still more preferably from 1.2 to 2.0.

Of course, the resin (HR) has, similar to the acid decomposable resin (A), a content of impurities such as metals as small as possible and at the same time, it contains a residual monomer or oligomer component in an amount of from 0 to 10 mass %, more preferably from 0 to 5 mass %, still more preferably from 0 to 1 mass %. Such a resin can provide a resist not undergoing a time-dependent change in foreign matters in the liquid or sensitivity. From the viewpoints of resolution, resist profile, side walls of a resist pattern, and roughness, it has a molecular weight distribution (Mw/Mn, which is also called "dispersity") falling within a range preferably from 1 to 5, more preferably from 1 to 3, still more preferably from 1 to 2.

As the resin (HR), commercially available products can be used or the resin can be synthesized in a conventional manner (for example, radical polymerization). Examples of the common synthesis process include simultaneous polymerization process of dissolving monomer species and an initiator in a solvent and heating the resulting solution; and dropwise addition polymerization process of adding a solution of monomer species and an initiator dropwise to a heated solvent over from 1 to 10 hours. Of these, the dropwise addition polymerization is preferred. Examples of the reaction solvent include ethers such as tetrahydrofuran, 1,4-dioxane and diisopropyl ether, ketones such as methyl ethyl ketone and methyl isobutyl ketone, ester solvent such as ethyl acetate, amide solvents such as dimethylformamide and dimethylacetamide, and solvents, which will be described later, for dissolving the composition of the invention therein such as propylene glycol monomethyl ether acetate, propylene glycol monomethyl ether and cyclohexanone. Polymerization using the same solvents as those used for the positive resist composition of the invention is more preferred. This makes it possible to inhibit generation of particles during storage.

The polymerization reaction is performed preferably in an inert gas atmosphere such as nitrogen or argon. Polymerization is started using a commercially available radical initiator (such as azo initiator or peroxide) as the polymerization initiator, and a chain transfer agent may be used as needed. As the radical initiator, azo initiators are preferred, with azo initiators having an ester group, a cyano group or a carboxyl group being more preferred. Preferred examples of the initiator include azobisisobutyronitrile, azobisdimethylvaleronitrile and dimethyl 2,2'-azobis(2-methylpropionate). The concentration of the reaction is from 5 to 50 mass %, preferably from 30 to 50 mass %. The reaction temperature is typically from 10 to 150° C., preferably from 30 to 120° C., still more preferably from 60 to 100° C.

After completion of the reaction, the reaction product is allowed to cool to room temperature and is purified. For purification, conventional methods can be employed. Examples include purification methods under solution state such as liquid-liquid extraction for removing residual monomers or oligomer components by rinsing with water or using suitable solvents in combination, and ultrafiltration for extracting and removing components having molecular weights below a specified value, and those under solid state such as the reprecipitation method for removing the residual monomers and the like by adding a resin solution dropwise to a poor solvent and coagulating the resin in the poor solvent, and a method of rinsing the filtered resin slurry with a poor solvent. For example, the resin is precipitated as a solid by bringing, into contact with the reaction solution, a solvent (poor solvent) in which the resin is sparingly soluble or insoluble used in a volume of 10 times or less, preferably from 10 to 5 times the volume of the resin.

As the solvent (precipitation or reprecipitation solvent) used for the precipitation or reprecipitation from a polymer solution, any one is usable insofar as it is a poor solvent for the polymer. Depending on the type of the polymer, a solvent can be selected as needed from hydrocarbons, halogenated hydrocarbons, nitro compounds, ethers, ketones, esters, carbonates, alcohols, carboxylic acids, water, and mixed solvents containing these. Of these, solvents containing at least an alcohol (especially, methanol or the like) or water are preferred as a precipitation or reprecipitation solvent.

Although the using amount of the precipitation or reprecipitation solvent can be determined as needed in consideration of efficiency, yield or the like, it is usually from 100 to 10000 parts by mass, preferably from 200 to 2000 parts by mass, more preferably from 300 to 1000 parts by mass, based on 100 part by mass of the polymer solution.

Although the temperature during precipitation or reprecipitation is determined as needed in consideration of efficiency and operability, it is typically from about 0 to 50° C., preferably around room temperature (for example, about 20 to 35° C.). Precipitation or reprecipitation operation can be conducted by a known process such as batch process or continuous process while using a mixing vessel such as agitation tank.

The polymer obtained by precipitation or reprecipitation is usually subjected to conventional solid-liquid separation such as filtration or centrifugal separation, and provided for use after drying. Filtration is performed using a solvent-resistant filter material preferably under pressure.

Drying is performed under normal or reduced pressure (preferably under reduced pressure) at from about 30 to 100° C., preferably from about 30 to 50° C.

The resin, which has been once precipitated and separated, may thereafter be dissolved in a solvent again, and be brought into contact with a solvent in which the resin is sparingly soluble or insoluble. Described specifically, the process may comprise a step of, after completion of the radical polymerization reaction, bringing the polymer into contact with a solvent in which it is sparingly soluble or insoluble to precipitate the resin (step a), a step of separating the resin from the solution (step b), a step of dissolving the resin in a solvent again to prepare a resin solution A (step c), bringing the resin solution A into contact with a solvent in which the resin is sparingly soluble or insoluble used in a volume of less than 10 times (preferably not greater than 5 times) the volume of the resin solution A to precipitate a resin solid (step d), and then separating the thus precipitated resin (step e).

The following are specific examples of Resin. The molar ratio of the repeating unit(s) of each resin (corresponding to the molar ratio of the left-to-right repeating units shown in the specific examples), weight average molecular weight and dispersity are shown in the table given below.

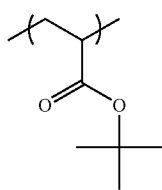
(HR-1)

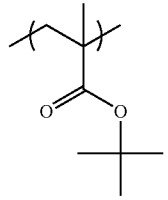
(HR-2)

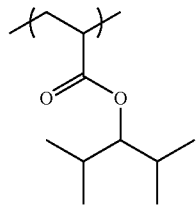
(HR-3)

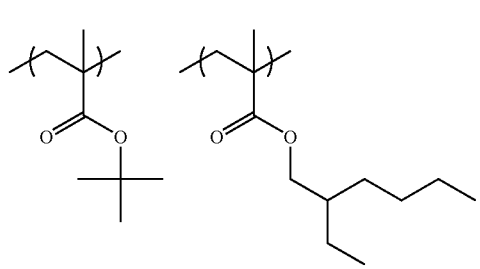
(HR-4)

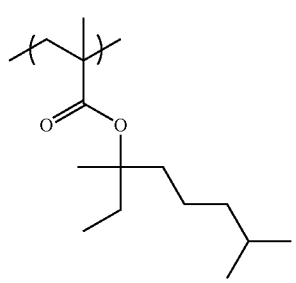
(HR-5)

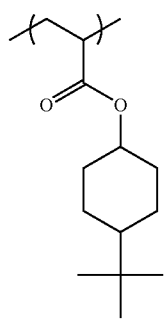
(HR-6)

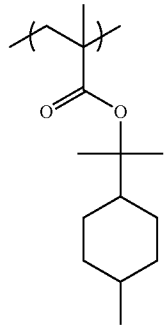
(HR-7)

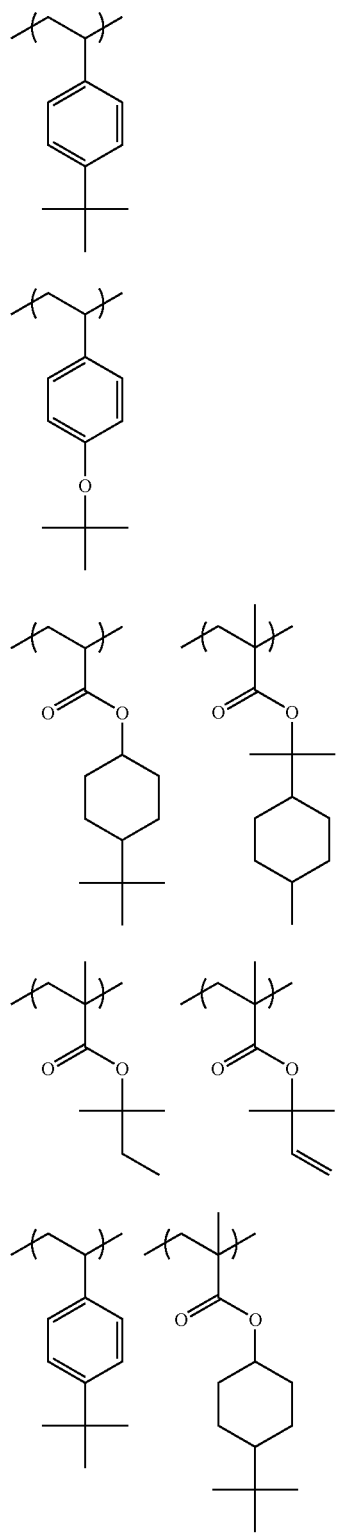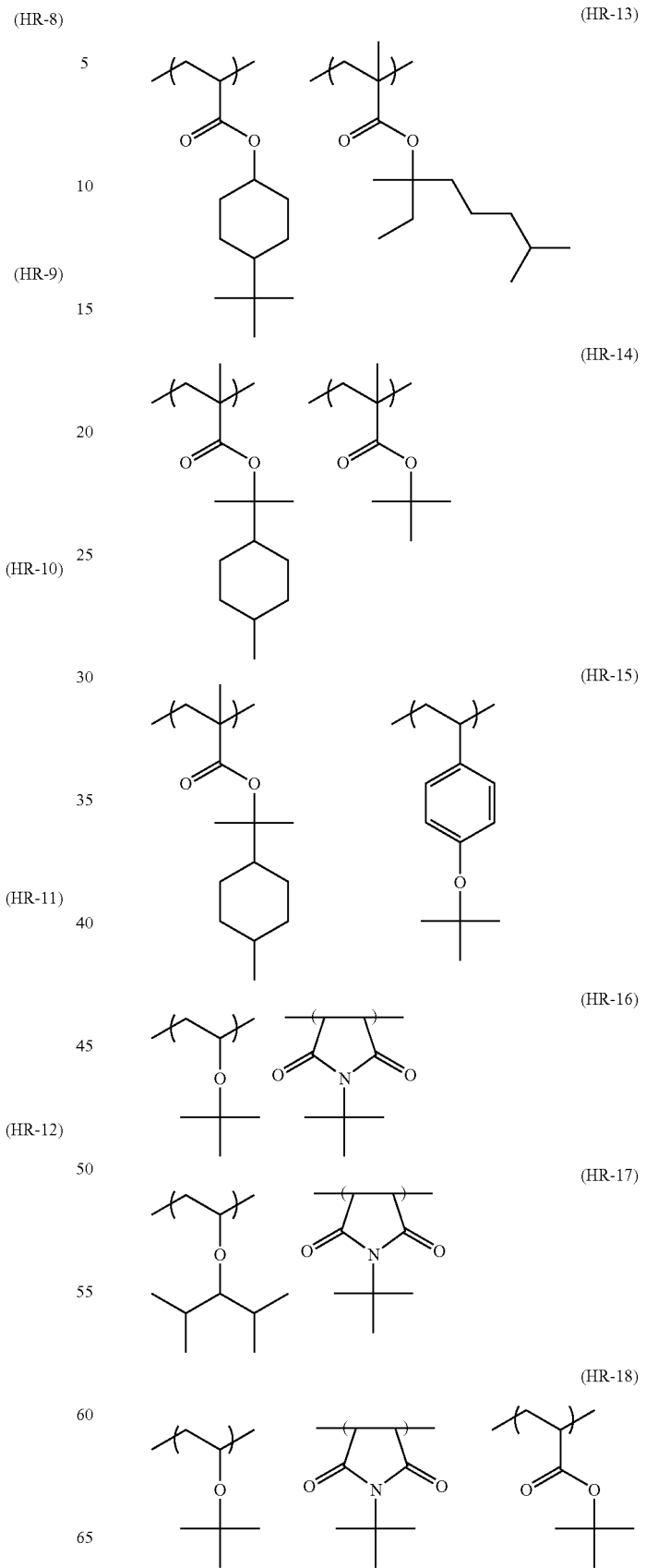

-continued
(HR-19)
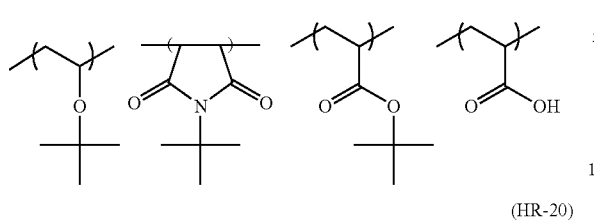
(HR-20)
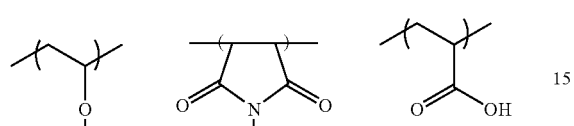
(HR-21)
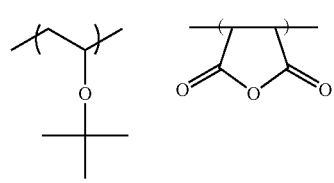
(HR-22)
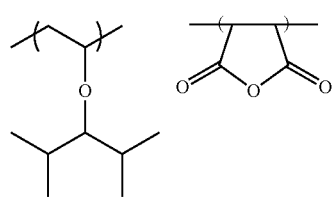
(HR-23)
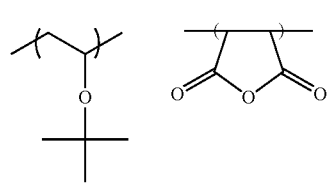
(HR-24)
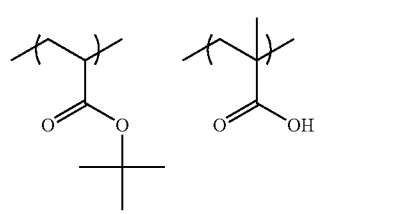
(HR-25)
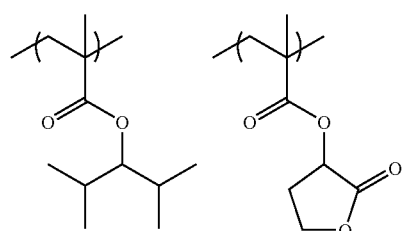
-continued
(HR-26)
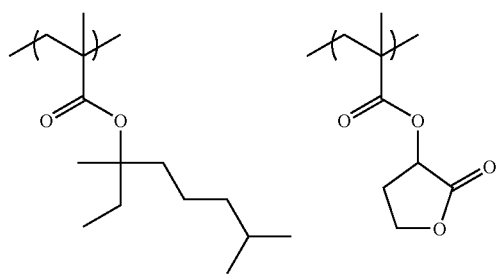
(HR-27)
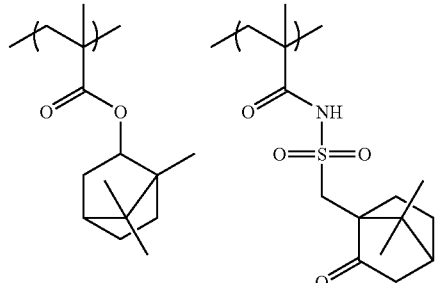
(HR-28)
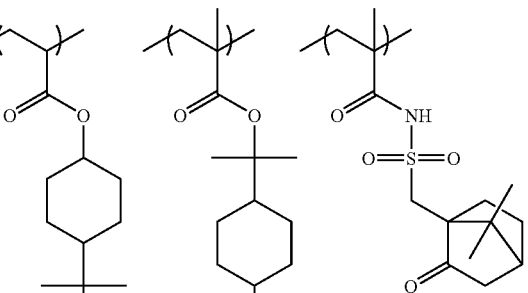
(HR-29)
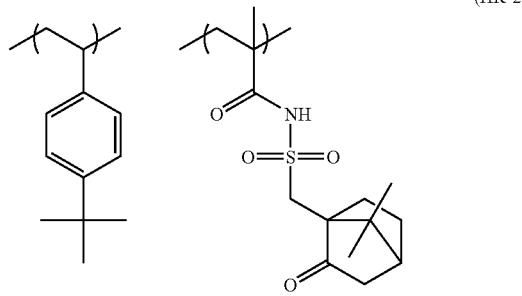
(HR-30)
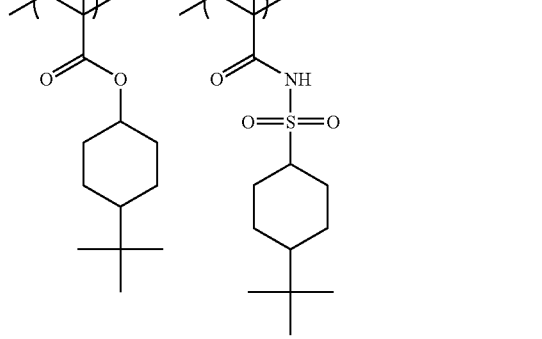

-continued

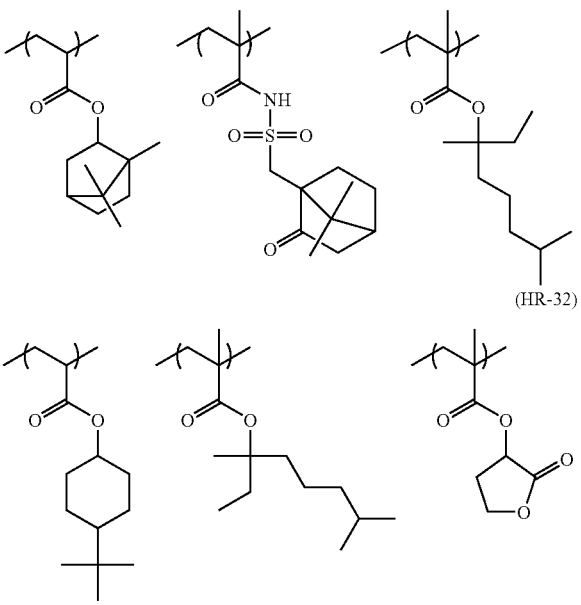

(HR-31)

(HR-32)

TABLE 1

| Resin | Composition | Mw | Mw/Mn |
|---|---|---|---|
| HR-1 | 100 | 12000 | 2.0 |
| HR-2 | 100 | 8000 | 2.0 |
| HR-3 | 100 | 10000 | 1.9 |
| HR-4 | 60/40 | 10000 | 2.3 |
| HR-5 | 100 | 18000 | 2.0 |
| HR-6 | 100 | 10000 | 1.8 |
| HR-7 | 100 | 7200 | 1.8 |
| HR-8 | 100 | 4800 | 1.6 |
| HR-9 | 100 | 8000 | 1.2 |
| HR-10 | 50/50 | 7800 | 2.5 |
| HR-11 | 80/20 | 7000 | 2.2 |
| HR-12 | 20/80 | 5000 | 2.3 |
| HR-13 | 50/50 | 8200 | 2.2 |
| HR-14 | 70/30 | 8000 | 2.2 |
| HR-15 | 80/20 | 10000 | 2.1 |
| HR-16 | 50/50 | 5600 | 1.3 |
| HR-17 | 50/50 | 4800 | 1.4 |
| HR-18 | 40/40/20 | 5600 | 1.5 |
| HR-19 | 30/30/30/10 | 7200 | 1.6 |
| HR-20 | 45/45/10 | 6100 | 1.4 |
| HR-21 | 50/50 | 6000 | 1.3 |
| HR-22 | 50/50 | 6200 | 1.3 |
| HR-23 | 40/40/20 | 7000 | 1.5 |
| HR-24 | 95/5 | 15000 | 1.8 |
| HR-25 | 90/10 | 9000 | 1.9 |
| HR-26 | 90/10 | 15000 | 2.0 |
| HR-27 | 90/10 | 10000 | 2.2 |
| HR-28 | 40/40/20 | 12000 | 2.0 |
| HR-29 | 90/10 | 8000 | 2.1 |
| HR-30 | 80/20 | 8200 | 2.1 |
| HR-31 | 40/10/50 | 8000 | 2.3 |
| HR-32 | 45/50/5 | 9000 | 2.5 |

A film sparingly soluble in an immersion liquid (which film may hereinafter be called "top coat") may be formed between the immersion liquid and the resist film formed using the resist composition of the invention in order to prevent the resist film from coming into direct contact with the immersion liquid. The functions required of the top coat include application suitability to the upper layer of the resist, transparency to radiations, in particular, one having a wavelength of 193 nm, and poor solubility in the immersion liquid. The top coat preferably does not mix with the resist and can be uniformly laid over the resist surface.

From the standpoint of transparency at 193 nm, the top coat is preferably a polymer not containing aromatic abundantly. Specific examples include hydrocarbon polymers, acrylate polymers, poly(methacrylic acid), poly(acrylic acid), poly (vinyl ether), silicon-containing polymers, and fluorine-containing polymers. The above-described hydrophobic resin (HR) is also suited as the top coat. Since release of impurities from the top coat into the immersion liquid contaminates an optical lens, the content of residual monomer components of the polymer in the top coat is preferably as small as possible.

For removing the top coat, a developer may be used. Alternatively, the top coat may be removed by using a remover separately. The remover is preferably a solvent which penetrates less into the photosensitive film. Removal using an alkali developer is preferred because it enables the removing step of the top coat simultaneously with a development step of the photosensitive film. Although the top coat is preferably acidic in consideration of the removal with an alkali developer, the top coat may be either neutral or alkaline in order to prevent intermixing with the photosensitive film.

The smaller the difference in refractive index between the top coat and the immersion liquid, the more the resolution improves. When an ArF excimer laser (wavelength: 193 nm) is used in combination with water as an immersion liquid, the top coat for ArF immersion exposure preferably has a refractive index close to that of the immersion liquid. In order to attain a refractive index closer to that of the immersion liquid, the top coat preferably contains a fluorine atom therein. From the standpoints of transparency and refractive index, the top coat is preferably thin.

It is preferred that the top coat mixes with neither the resist nor the immersion liquid.

From this standpoint, when the immersion liquid is water, the solvent used for the top coat is preferably a medium which is sparingly soluble in the solvent used for the photosensitive composition and is water-insoluble. When the immersion liquid is an organic solvent, the top coat may be either water-soluble or water-insoluble.

(D) Solvent

In the photosensitive composition of the invention, the above-described components are dissolved in a predetermined solvent.

Organic solvents are typically usable as the solvent. Examples of the solvent include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

Although in the invention, the organic solvents may be used either singly or in combination, use of a mixed solvent containing two or more solvents having respectively different functional groups is preferred. This not only enables heightening of solubility of materials and prevention of generation of particles with the passage of time but also formation of a good pattern profile. Preferred functional groups which the solvents contain include ester group, lactone group, hydroxyl group, ketone group and carbonate group. As the mixed solvents having different functional groups, mixed solvents shown below as (S1) to (S5) are preferred.

(S1) Solvents in which a hydroxyl-containing solvent and a hydroxyl-free solvent have been mixed.

(S2) Solvents in which a solvent having an ester structure and a solvent having a ketone structure have been mixed.

(S3) Solvents in which a solvent having an ester structure and a solvent having a lactone structure have been mixed.

(S4) Solvents in which a solvent having an ester structure, a solvent having a lactone structure, and a hydroxyl-containing solvent have been mixed.

(S5) Solvent in which a solvent having an ester structure, a solvent having a carbonate structure, and a hydroxyl-containing solvent have been mixed.

Use of such a mixed solvent enables both reduction of particle generation during storage of a resist solution and prevention of generation of defects during application.

Examples of the hydroxyl-containing solvent include ethylene glycol, ethylene glycol monomethyl ether, ethylene glycol monoethyl ether, propylene glycol, propylene glycol monomethyl ether, propylene glycol monoethyl ether, and ethyl lactate. Of these, propylene glycol monomethyl ether and ethyl lactate are especially preferred.

Examples of the hydroxyl-free solvent include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Of these, propylene glycol monomethyl ether acetate, ethyl ethoxypropionate, 2-heptanone, γ-butyrolactone, cyclohexanone, and butyl acetate are especially preferred, with propylene glycol monomethyl ether acetate, ethyl ethoxypropionate, 2-heptanone, and cyclohexanone being most preferred.

Examples of the solvent having a ketone structure include cyclohexanone and 2-heptanone. Of these, cyclohexanone is preferred.

Examples of the solvent having an ester structure include propylene glycol monomethyl ether acetate, ethyl ethoxypropionate and butyl acetate. Of these, propylene glycol monomethyl ether acetate is preferred.

Examples of the solvent having a lactone structure include γ-butyrolactone.

Examples of the solvent having a carbonate structure include propylene carbonate and ethylene carbonate. Of these, propylene carbonate is preferred.

For the resist composition of the invention, the mixed solvent containing at least one of propylene glycol monomethyl ether acetate, 2-heptanone, and γ-butyrolactone is especially preferred.

The hydroxyl-containing solvent and hydroxyl-free solvent are mixed at a ratio (mass ratio) of from 1/99 to 99/1, preferably from 10/90 to 90/10, still more preferably from 20/80 to 60/40. The mixed solvent containing 50 mass % or greater of the hydroxyl-free solvent is especially preferred from the standpoint of uniform application.

The solvent having an ester structure and the solvent having a ketone structure are mixed at a ratio (mass ratio) of from 1/99 to 99/1, preferably from 10/90 to 90/10, still more preferably from 40/60 to 80/20. The mixed solvent containing 50 mass % or greater of the solvent having an ester structure is especially preferred from the standpoint of uniform application.

The solvent having an ester structure and the solvent having a lactone structure are mixed at a ratio (mass ratio) of from 70/30 to 99/1, preferably from 80/20 to 99/1, still more preferably from 90/10 to 99/1. The mixed solvent containing 70 mass % or greater of the solvent having an ester structure is especially preferred from the standpoint of stability with time.

When the solvent having an ester structure, the solvent having a lactone structure, and the hydroxyl-containing solvent are mixed, the mixed solvent preferably contains from 30 to 80 wt. % of the solvent having an ester structure, from 1 to 20 wt. % of the solvent having a lactone structure and from 10 to 60 wt. % of the hydroxyl-containing solvent.

When the solvent having an ester structure, the solvent having a carbonate structure, and the hydroxyl-containing solvent are mixed, the mixed solvent preferably contains from 30 to 80 wt. % of the solvent having an ester structure, from 1 to 20 wt. % of the solvent having a carbonate structure and from 10 to 60 wt. % of the hydroxyl-containing solvent.

(E) Basic compound

It is preferred that the positive photosensitive composition of the invention contains preferably a basic compound (E) to reduce changes in the performances of it with the passage of time during from exposure to heating or control the in-film diffusion of an acid generated by the exposure.

Examples of the basic compound include nitrogen-containing basic compounds and onium salt compounds.

Preferred examples of the structure of the nitrogen-containing basic compound include compounds having partial structures represented by the following formulas (A) to (E).

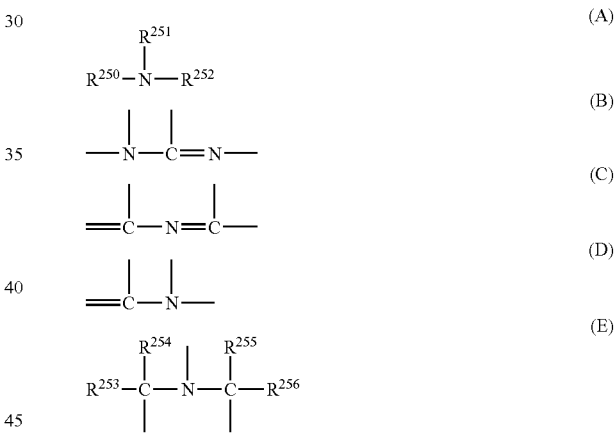

In the above formulas, $R^{250}$, $R^{251}$ and $R^{252}$ each independently represent a hydrogen atom, a $C_{1-20}$ alkyl group, a $C_{3-20}$ cycloalkyl group, or a $C_{6-20}$ aryl group, or $R^{250}$ and $R^{251}$ may be coupled together to form a ring. These groups may have a substituent. Preferred examples of the alkyl group and cycloalkyl group having a substituent include $C_{1-20}$ aminoalkyl groups and $C_{1-20}$ hydroxyalkyl groups and $C_{3-20}$ aminocycloalkyl groups and $C_{3-20}$ hydroxycycloalkyl groups, respectively.

These groups may further contain, in the alkyl chain thereof, an oxygen atom, a sulfur atom or a nitrogen atom.

In the above formula, $R^{253}$, $R^{254}$, $R^{255}$ and $R^{256}$ each independently represents a $C_{1-6}$ alkyl group or a $C_{3-6}$ cycloalkyl group.

Preferred examples of the compound include guanidine, aminopyrrolidine, pyrazole, pyrazoline, piperazine, aminomorpholine, aminoalkylmorpholine, and piperidine and they may have a substituent. More preferred examples of the compound include compounds having an imidazole structure, a diazabicyclo structure, an onium hydroxide structure, an onium carboxylate structure, a trialkylamine structure, an aniline structure or a pyridine structure, alkylamine derivatives having a hydroxyl group and/or an ether bond, and aniline derivatives having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]nona-5-ene and 1,8-diazabicyclo[5,4,0]undeca-7-ene. Examples of the compound having an onium hydroxide structure include triarylsulfonium hydroxides, phenacylsulfonium hydroxide, and sulfonium hydroxides having a 2-oxoalkyl group. Specific examples of them include triphenylsulfonium hydroxide, tris(t-butylphenyl)sulfonium hydroxide, bis(t-butylphenyl)iodonium hydroxide, phenacylthiophenium hydroxide and 2-oxopropylthiophenium hydroxide. Examples of the compound having an onium carboxylate structure include compounds having an onium hydroxide structure, an anion portion of which has been converted into a carboxylate, for example, acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl) aniline.

It is especially preferred that the resist composition of the invention contains at least one of 2,6-diisopropylaniline and tetrabutylammonium hydroxide.

These basic compounds may be used either singly or in combination. The basic compound is used in an amount of typically from 0.001 to 10 mass %, preferably from 0.01 to 5 mass %, based on the solid content in the positive photosensitive composition. The amount is preferably 0.001 mass % or greater in order to obtain a sufficient effect of the addition, while it is not greater than 10 mass % from the viewpoints of sensitivity and development properties of a non-exposed portion.

(F) Surfactant

The positive photosensitive composition of the invention contains preferably a surfactant. The surfactant contains preferably any one of or two or more of fluorine- and/silicon-containing surfactants (fluorine-containing surfactants, silicone-containing surfactants, and surfactants containing both fluorine and silicon atoms).

By containing the fluorine- and/or silicon-containing surfactant, the resulting positive photosensitive composition of the invention can provide resist patterns exhibiting good adhesion and less development defects at good sensitivity and resolution when a light source having a wavelength of 250 nm or less, especially 220 nm or less is used for exposure.

Examples of the fluorine- and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, and JP-A-2002-277862, and U.S. Pat. Nos. 5,405,720, 5,360,692, 5,529,881, 5,296,330, 5,436,098, 5,576,143, 5,294,511, and 5,824,451. It is also possible to employ the following commercially available surfactants as are.

Examples of commercially available surfactants usable here include fluorine-containing surfactants and silicon-containing surfactants such as "Eftop EF301" and "Eftop EF303" (each, trade name; product of Shin-Akita Kasei), "Fluorad FC430" and "Fluorad 431" (each, trade name; product of Sumitomo 3M), "Megaface F171", "Megaface F173", "Megaface F176", "Megaface F189" and "Megaface R08" (each, trade name; product of Dainippon Ink & Chemicals), "Surflon S-382", "Surflon SC101", "Surflon 102", "Surflon 103", "Surflon 104", "Surflon 105" and "Surflon 106" (each, trade name; product of Asahi Glass), and "Troysol S-366" (trade name; product of Troy Corporation). A polysiloxane polymer "KP341" (trade name; product of Shin-Etsu Chemical) is also usable as the silicon-containing surfactant.

In addition to the known surfactants as described above, surfactants using a fluoroaliphatic-group-containing polymer derived from a fluoroaliphatic compound prepared by the telomerization method (also called the telomer method) or the oligomerization method (also called the oligomer method) are usable. Such a fluoroaliphatic compound can be synthesized by a process described in JP-A-2002-90991.

As the fluoroaliphatic-group-containing polymer, a copolymer of a fluoroaliphatic-group-containing monomer, a poly(oxyalkylene) acrylate and/or a poly(oxyalkylene) methacrylate is preferred. In the copolymer, these monomers may be either distributed irregularly or block copolymerized. Examples of the poly(oxyalkylene) group include poly(oxyethylene) group, poly(oxypropylene) group and poly(oxybutylene) group. It may also be a unit having alkylenes different in chain length in the same chain such as block linked poly (oxyethylene, oxypropylene and oxyethylene) and block-linked poly(oxyethylene and oxypropylene). Moreover, the copolymer of a fluoroaliphatic-group-containing monomer and a poly(oxyalkylene) acrylate and/or a poly(oxyalkylene) methacrylate may be not only a binary copolymer but also a trimer or a higher copolymer obtained by simultaneous copolymerization of a monomer having two or more different fluoroaliphatic groups and two or more different poly(oxyalkylene) acrylates (or methacrylates).

Examples of commercially available surfactants include "Megaface F178", "Megaface F-470", "Megaface F-473", "Megaface F-475", "Megaface F-476" and "Megaface F-472" (each, trade name; product of Dainippon Ink & Chemicals). Further examples include copolymers of $C_6F_{13}$-containing acrylate (or methacrylate) and a poly(oxyalkylene) acrylate (or methacrylate), copolymers of a $C_6F_{13}$-containing acrylate (or methacrylate), poly(oxyethylene) acrylate (or methacrylate) and poly(oxypropylene) acrylate (or methacrylate), copolymers of $C_8F_{17}$-containing acrylate (or methacrylate) and a poly(oxyalkylene) acrylate (or methacrylate), and copolymers of $C_8F_{17}$-containing acrylate (or methacrylate), poly(oxyethylene) acrylate (or methacrylate) and poly(oxypropylene) acrylate (or methacrylate).

Examples of surfactants other than the fluorine- and/or silicon-containing surfactants include nonionic surfactants such as polyoxyethylene alkyl ethers, polyoxyethylene alkyl allyl ethers, polyoxyethylene/polyoxypropylene block copolymers, sorbitan aliphatic esters, and polyoxyethylene sorbitan aliphatic esters.

These surfactants may be used either singly or in combination.

The surfactant is used in an amount of preferably from 0.0001 to 2 mass %, more preferably from 0.001 to 1 mass %, based on the total amount of the positive photosensitive composition (excluding the solvent).

(G) A dissolution inhibiting compound having at least one group selected from alkali soluble groups, hydrophilic groups and acid decomposable groups and having a molecular weight not greater than 3000 (which may hereinafter be called "dissolution inhibiting compound") may be added.

As the dissolution inhibiting compound (G), compounds having an alkali soluble group such as carboxyl group, sulfonylimide group or hydroxyl group having, at the α position thereof, substituted with a fluoroalkyl group, compounds having a hydrophilic group such as hydroxyl group, lactone group, cyano group, amide group, pyrrolidone group or sulfonamide group, or compounds having a group which decomposes by the action of an acid to release its alkali soluble group or hydrophilic group are preferred. The group which decomposes by the action of an acid to release its alkali soluble group or hydrophilic group is preferably a carboxyl group or hydroxyl group protected with an acid decomposable group. In order to prevent reduction in the transmittance at 220 nm or less, it is preferred to use, as the dissolution inhibiting compound, a compound not containing an aromatic ring or to add an aromatic-ring-containing compound in an amount not greater than 20 wt. % based on the solid content of the composition.

Preferred examples of the dissolution inhibiting compound include carboxylic acid compounds having an alicyclic hydrocarbon structure such as adamantane(di)carboxylic acid, nobornanecarboxylic acid and cholic acid, compounds obtained by protecting such a carboxylic acid with an acid decomposable group, polyols such as saccharides, and compounds obtained by protecting the hydroxyl group of the polyol with an acid decomposable group.

In the invention, the dissolution inhibiting compound has a molecular weight not greater than 3000, preferably from 300 to 3000, more preferably from 500 to 2500.

The dissolution inhibiting compound is added in an amount of preferably from 3 to 40 mass %, more preferably from 5 to 20 mass % based on the solid content of the photosensitive composition.

The following are the specific examples of the dissolution inhibiting compound, but the invention is not limited to them.

TE-1
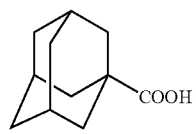

TE-2
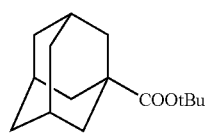

TE-3
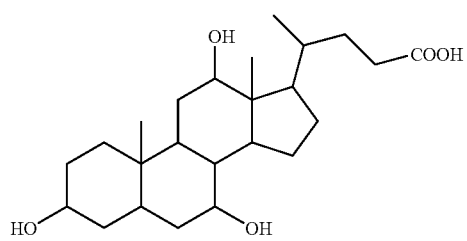

-continued

TE-4
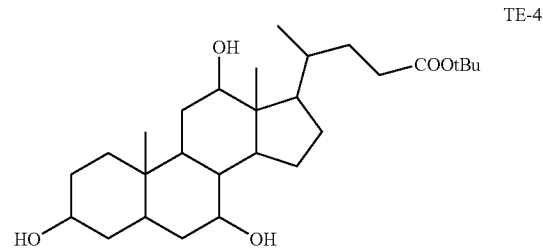

TE-5

TE-6

TE-7

TE-8

TE-9

TE-10

TE-11
HO—(CH$_2$)$_{12}$—OH

TE-12

TE-13

-continued

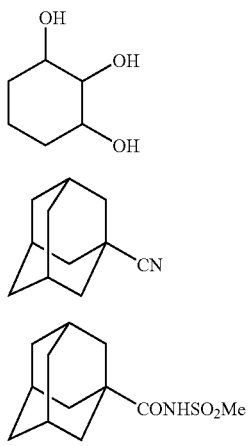

TE-14

TE-15

TE-16

<Other Additives>

The positive photosensitive composition of the invention may further contain additives such as dye, plasticizer, photosensitizer and compound accelerating dissolution in a developer as needed.

The compound usable in the invention for accelerating dissolution in a developer is a low molecular compound having a molecular weight not greater than 1,000 and having two or more phenolic OH groups or one or more carboxyl groups. The compound, if having a carboxyl group, is preferably an alicyclic or aliphatic compound.

The dissolution accelerating compound is added in an amount of preferably from 2 to 50 mass %, more preferably from 5 to 30 mass based on the acid-decomposable resin. From the viewpoints of reducing a development residue and preventing pattern deformation during development, the amount not greater than 50 mass % is preferred.

Such phenolic compounds having a molecular weight not greater than 1,000 can be easily synthesized by those skilled in the art with reference to, for example, processes described in JP-A-4-122938 and JP-A-2-28531, U.S. Pat. No. 4,916,210, and EP219294.

Specific examples of the carboxyl-containing alicyclic or aliphatic compound include, but not limited to, carboxylic acid derivatives having a steroid structure such as cholic acid, deoxycholic acid and lithocholic acid, adamantanecarboxylic acid derivatives, adamantanedicarboxylic acid, cyclohexanecarboxylic acid, cyclohexanecarboxylic acid, and cyclohexanedicarboxylic acid.

(Pattern Forming Method)

The positive photosensitive composition of the invention is used by dissolving the above-described components in a predetermined organic solvent, preferably the above-described mixed solvent, filtering the resulting solution, and applying the filtrate onto a predetermined support as described below. The filter used for filtration is preferably made of polytetrafluoroethylene, polyethylene or nylon and has a pore size of 0.1 micron or less, more preferably 0.05 micron or less, still more preferably 0.03 micron or less.

For example, the positive photosensitive composition is applied onto a substrate (such as silicon/silicon dioxide-coated substrate) as used in the fabrication of a precision integrated circuit device by an appropriate application means such as spinner or coater, and then dried to form a photosensitive film.

The photosensitive film is exposed to actinic light or radiation through a predetermined mask, preferably baked (heated), then developed and rinsed, whereby a good pattern can be obtained.

During exposure to active light or radiation, exposure (immersion exposure) is preferably performed by filling a liquid (immersion medium) having a refractive index higher than that of air between the photosensitive film and a lens. By this immersion exposure, the resolution can be enhanced. The immersion medium may be any liquid insofar as it has a refractive index higher than that of air, but pure water is preferred. In order to prevent the immersion medium and the photosensitive film from coming into direct contact during immersion exposure, an overcoat layer may be provided on the photosensitive film. This makes it possible to prevent the release of the composition from the photosensitive film to the immersion medium, thereby reducing development defects.

Prior to the formation of the photosensitive film, an antireflective film may be formed on the substrate by application in advance.

As the antireflective film, either one of an inorganic film made of titanium, titanium dioxide, titanium nitride, chromium oxide, carbon or amorphous silicon or an organic film made of a light absorber and polymer materials is usable. As the organic antireflective film, commercially available organic antireflective films such as "DUV-30 series" or "DUV-40 series" (trade name) of Brewer Science, or "AR-2", "AR-3" or "AR-5" (trade name) of Shipley are also usable.

Examples of the actinic light or radiation include infrared light, visible light, ultraviolet light, far ultraviolet light, X-ray and electron beam. Of these, far ultraviolet light having a wavelength of 250 nm or less, more preferably 220 nm or less is preferred. Specific examples include KrF excimer laser light (248 nm), ArF excimer laser light (193 nm), $F_2$ excimer laser light (157 nm), X-ray and electron beam, of which ArF excimer laser light, $F_2$ excimer laser light, EUV (13 nm) and electron beam are preferred.

In the development step, an alkali developer is used as follows. As the alkali developer for resist compositions, an aqueous alkaline solution such as an aqueous solution of an inorganic alkali such as sodium hydroxide, potassium hydroxide, sodium carbonate, sodium silicate, sodium metasilicate or aqueous ammonia, a primary amine such as ethylamine or n-propylamine, a secondary amine such as diethylamine or di-n-butylamine, a tertiary amine such as triethylamine or methyldiethylamine, an alcohol amine such as dimethylethanolamine or triethanolamine, a quaternary ammonium salt such as tetramethylammonium hydroxide or tetraethylammonium hydroxide, or a cyclic amine such as pyrrole or piperidine.

The above-described alkali developer to which an adequate amount of an alcohol or surfactant has been added may also be used.

The alkali developer has an alkali concentration of typically from 0.1 to 20 mass %.

The alkali developer has a pH of typically from 10.0 to 15.0.

EXAMPLE 1

The present invention will hereinafter be described in further detail. It should however be borne in mind that the present invention is not limited by them.

SYNTHESIS EXAMPLE

Synthesis of Resin (C)

25.63 g of tert-butyl acrylate was dissolved in propylene glycol monomethyl ether acetate to prepare 117.92 g of a solution having a solid content concentration of 20%. To the resulting solution was added 2.0 mol % (0.921 g) of a polymerization initiator "V601" (trade name, product of Wako Pure Chemical Industries). In a nitrogen atmosphere, the resulting mixture was added dropwise over 4 hours to 10.25 g of propylene glycol monomethyl ether acetate heated to 80° C. After completion of the dropwise addition, the reaction mixture was stirred at 80° C. for 2 hours. The reaction mixture was cooled to room temperature and then added dropwise to 20 times the amount, based on the amount of the reaction mixture, of methanol. A solid thus precipitated was collected by filtration to obtain 22.1 g of Resin HR-1 as an intended product.

The resin had a weight average molecular weight of 12000 and dispersity of 2.0 as determined by GPC measurement relative to polystyrene standards.

Other resins as Resin (C) were prepared similarly.

<Resist Preparation>

Components shown below in Table 2 were dissolved in solvents and solutions having a solid content concentration of 7 mass % were prepared, respectively. The resulting solutions were filtered through a polyethylene filter having a pore size of 0.1-μm to prepare positive resist solutions. The positive resist compositions thus prepared were evaluated by the following method and the results are shown in the table below.

When a plurality of components are used, their mass ratio is shown in the table.

[Imaging Performance Test] (Conditions 1)

An organic antireflective coating "ARC291" (trade name; product of Nissan Chemical) was applied onto a silicon wafer and then, baked at 205° C. for 60 seconds to form an antireflective film of 78 nm. The positive resist composition prepared above was then applied to the antireflective film and then baked at 120° C. for 60 seconds to prepare a resist film of 250 nm. The wafer thus obtained was subjected to pattern exposure with an ArF excimer laser scanner ("PAS 5500/1100", trade name; product of ASML, NA: 0.75, σ0/σ1=0.85/0.55). After heating at 120° C. for 60 seconds, development for 30 seconds with an aqueous solution (2.38 wt. %) of tetramethyl ammonium hydroxide, rinsing with purewater and spin drying were performed successively to obtain a resist pattern.

(Conditions 2)

The present conditions are for the formation of a resist pattern in accordance with immersion exposure using pure water.

An organic antireflective coating "ARC291" (trade name; product of Nissan Chemical) was applied onto a silicon wafer and then baked at 205° C. for 60 seconds to form an antireflective film of 78 nm. The positive resist composition prepared above was then applied to the antireflective film, followed by baking at 120° C. for 60 seconds to prepare a resist film of 250 nm. The wafer thus obtained was subjected to pattern exposure with an ArF excimer laser immersion scanner (NA: 0.75). As the immersion liquid, ultrapure water having an impurity concentration not greater than 5 ppb was employed. After heating at 120° C. for 60 seconds, development for 30 seconds with an aqueous solution (2.38 wt. %) of tetramethyl ammonium hydroxide, rinsing with purewater and spin drying were performed successively to obtain a resist pattern.

[Evaluation of Line Edge Roughness]

The evaluation of line edge roughness (LER) was conducted by observing an isolated pattern of 120 nm through a length-measuring scanning electron microscope (SEM), measuring, with respect to the longitudinal edge in the range of 5 μm of the line pattern, the distance from the reference line where the edge should be present at 50 points by using a length-measuring SEM ("S-8840", trade name; product of Hitachi Ltd.), determining the standard deviation, and calculating 3σ. The unit is nm. The smaller the value, the better the performance.

[Followability of Water]

Each of the positive resist compositions prepared above was applied onto a silicon wafer and baked at 115° C. for 60 seconds to form a 200-nm resist film. As illustrated in FIG. 1, 15 ml of distilled water was dropped from a pipette onto the center portion of the wafer 1 having the resist film formed thereon. Then, a 10-cm-square quartz plate 3 provided with a kite string 2 was placed on the distilled water puddle so that the entire space between the wafer 1 and the quartz plate 3 was filled with distilled water 4.

Next, the kite string 2 attached to the quartz plate 3 was wound around a rotating member of a motor 5 which rotated at a speed of 30 cm/sec while fixing the wafer 1 . The motor 5 was driven for 0.5 second to move the quartz plate 3 . After the quartz plate 3 was moved, the amount of the distilled water remaining under the quartz plate 3 was evaluated in accordance with the following criteria and employed as an indication of followability of water.

FIG. 2A to FIG. 2D schematically illustrate various patterns observed when the quartz plate was observed from above after movement. A hatched portion 6 is an area of the distilled water remaining under the quartz plate 3 , while a blank portion 7 is an area in which the distilled water has failed to follow the movement of the quartz plate 3 and air has entered therein.

As illustrated in FIG. 2A, when the distilled water remains on the whole surface of the substrate even after the quartz plate 3 was moved, the followability of water is rated A; as illustrated in FIG. 2B, when the area in which air has entered does not exceed about 10% of the whole substrate area, the followability of water is rated B; as illustrated in FIG. 2C, when the area in which air has entered is 20% or more but less than 50% of the whole substrate area, the followability of water is rated C; and as illustrated in FIG. 2D, when the area in which air has entering is about 50% or more of the whole substrate area, the followability of water is rated D.

TABLE 2

| | Composition | | | | | | Results | | |
|---|---|---|---|---|---|---|---|---|---|
| | Resin (2 g) | Acid generator (mg) | Solvent (mass ratio) | Basic Compound (mg) | Resin (C) (mg) | Surfactant (mg) | LER (Conditions 1) | LER (Conditions 2) | Followability of water |
| Comp. Ex. 1 | RX | P-13 (80) | SL-1/SL-4 60/40 | N-1 (7) | — | W-1 (3) | 19 | 18 | D |
| Comp. Ex. 2 | RX | P-13 (80) | SL-1/SL-4 60/40 | N-1 (7) | HR-1 (80) | W-1 (3) | 16 | 16 | B |
| Ex. 1 | RA-1 | P-13 (80) | SL-1/SL-4 60/40 | N-1 (7) | HR-1 (80) | W-1 (3) | 14 | 14 | B |
| Ex. 2 | RA-1 | P-11 (80) | SL-1/SL-4 60/40 | N-1 (7) | HR-1 (80) | W-1 (3) | 13 | 13 | B |
| Ex. 3 | RA-1 | P-11 (80) | SL-1/SL-2 60/40 | N-1 (7) | HR-1 (80) | W-1 (3) | 12 | 12 | B |
| Ex. 4 | RA-1 | P-11 (80) | SL-1/SL-3 60/40 | N-1 (7) | HR-1 (80) | W-1 (3) | 12 | 12 | B |
| Ex. 5 | RA-1 | P-11 (80) | SL-1/SL-2 60/40 | N-2 (7) | HR-1 (80) | W-1 (3) | 11 | 11 | A |
| Ex. 6 | RA-1 | P-11 (80) | SL-1/SL-2 60/40 | N-3 (7) | HR-1 (80) | W-1 (3) | 11 | 11 | B |
| Ex. 7 | RA-1 | P-1 (80) | SL-1/SL-4 60/40 | N-1 (7) | HR-1 (80) | W-1 (3) | 12 | 12 | B |
| Ex. 8 | RA-1 | P-2 (80) | SL-1/SL-4 60/40 | N-1 (7) | HR-1 (80) | W-1 (3) | 12 | 12 | B |
| Ex. 9 | RA-1 | P-3 (80) | SL-1/SL-4 60/40 | N-1 (7) | HR-19 (80) | W-1 (3) | 10 | 9 | B |
| Ex. 10 | RA-1 | P-4 (80) | SL-1/SL-4 60/40 | N-1 (7) | HR-19 (80) | W-1 (3) | 11 | 12 | A |
| Ex. 11 | RA-1 | P-5 (80) | SL-1/SL-4 60/40 | N-1 (7) | HR-19 (80) | W-1 (3) | 12 | 12 | B |
| Ex. 12 | RA-1 | P-6 (80) | SL-1/SL-4 60/40 | N-1 (7) | HR-19 (80) | W-1 (3) | 11 1 | 10 | B |
| Ex. 13 | RA-1 | P-7 (80) | SL-1/SL-4 60/40 | N-1 (7) | HR-19 (80) | W-1 (3) | 12 | 12 | B |
| Ex. 14 | RA-1 | P-8 (80) | SL-1/SL-4 60/40 | N-1 (7) | HR-19 (80) | W-1 (3) | 10 | 9 | B |
| Ex. 15 | RA-1 | P-9 (80) | SL-1/SL-4 60/40 | N-1 (7) | HR-19 (80) | W-1 (3) | 13 | 12 | B |
| Ex. 16 | RA-1 | P-10 (80) | SL-1/SL-4 60/40 | N-1 (7) | HR-19 (80) | W-1 (3) | 13 | 12 | B |
| Ex. 17 | RA-1 | P-12 (80) | SL-1/SL-4 60/40 | N-1 (7) | HR-19 (80) | W-1 (3) | 13 | 12 | B |
| Ex. 18 | RA-2 | P-1 (80) | SL-1/SL-2 60/40 | N-5 (7) | HR-19 (80) | W-1 (3) | 11 | 10 | B |
| Ex. 19 | RA-3 | P-2 (80) | SL-1/SL-2 60/40 | N-2 (7) | HR-04 (80) | W-1 (3) | 12 | 11 | A |
| Ex. 20 | RA-4 | P-3 (80) | SL-1/SL-2 60/40 | N-3 (7) | HR-10 (80) | W-1 (3) | 11 | 11 | B |
| Ex. 21 | RA-5 | P-4 (80) | SL-2/SL-4/SL-6 40/59/1 | N-2 (9) | HR-15 (35) | W-1 (3) | 9 | 9 | B |
| Ex. 22 | RA-6 | P-5 (100) | SL-2/SL-4 70/30 | N-6 (7) | HR-21 (60) | W-4 (4) | 10 | 10 | A |
| Ex. 23 | RA-7 | P-6 (40/60) | SL-2/SL-4 60/40 | N-1 (7) | HR-25/HR-10 (20/30) | W-1 (3) | 11 | 10 | A |
| Ex. 24 | RA-8 | P-7 (20/80) | SL-1/SL-2 50/50 | N-2 (6) | HR-22 (80) | W-4 (3) | 11 | 11 | B |
| Ex. 25 | RA-9 | P-8 (110) | SL-1/SL-2 30/70 | N-5 (7) | HR-25 (60) | W-5 (5) | 8 | 8 | A |
| Ex. 26 | RA-10 | P-9 (120) | SL-3/SL-4/SL-6 40/59/1 | N-4 (7) | HR-29 (90) | W-1 (3) | 7 | 7 | B |
| Ex. 27 | RA-11 | P-10/P-9 (40/60) | SL-2/SL-3 60/40 | N-2 (6) | HR-30 (80) | W-2 (3) | 9 | 9 | B |
| Ex. 28 | RA-12 | P-12/P-9 (100/10) | SL-2/SL-3 60/40 | — | HR-31 (10) | W-4 (5) | 10 | 9 | A |

The symbols employed in Table 2 each has the following meaning.

The structures and the like of Acid decomposable resin (A) employed in Examples will be shown below.

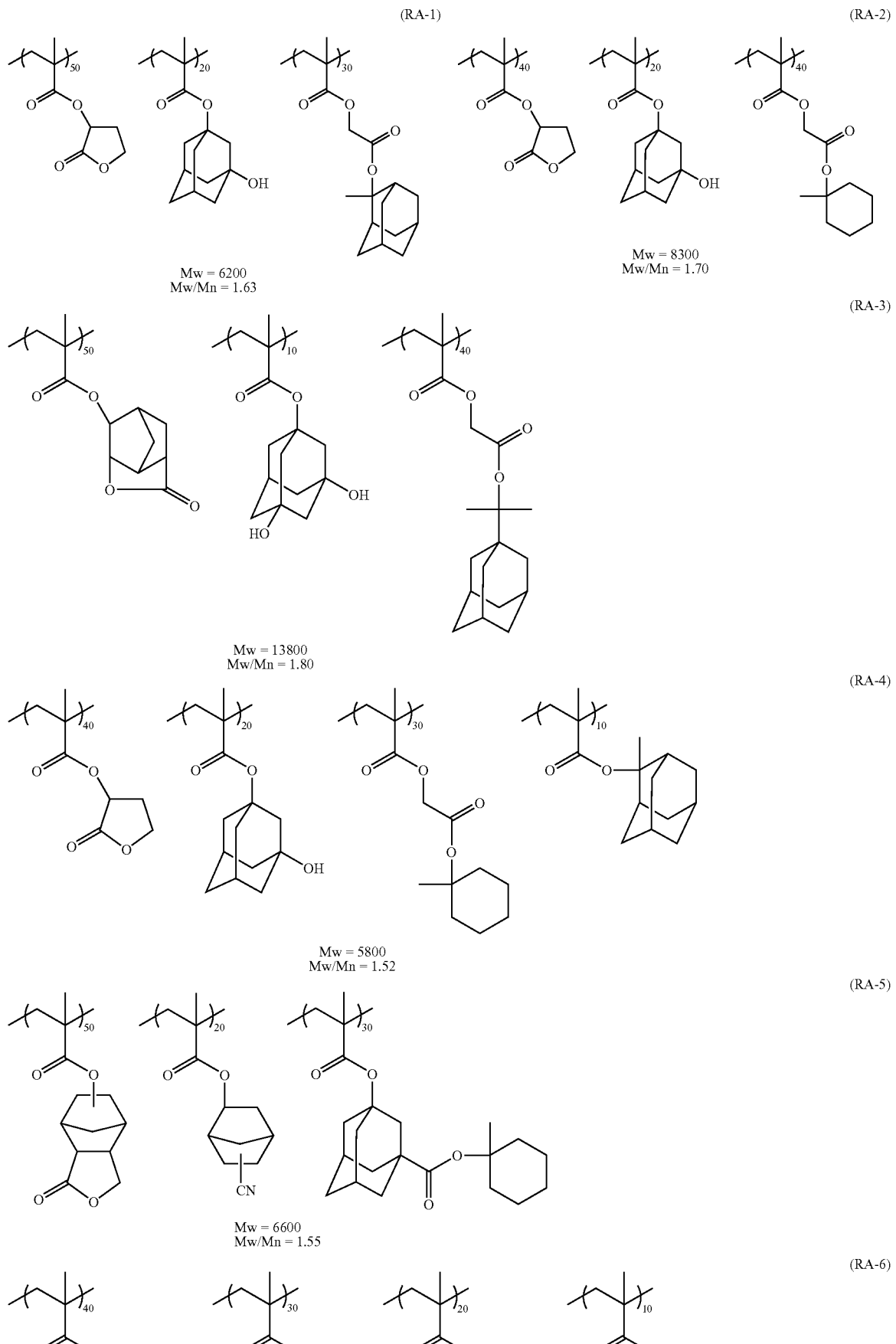

The structures of Compound (B) used in Examples will be shown below.
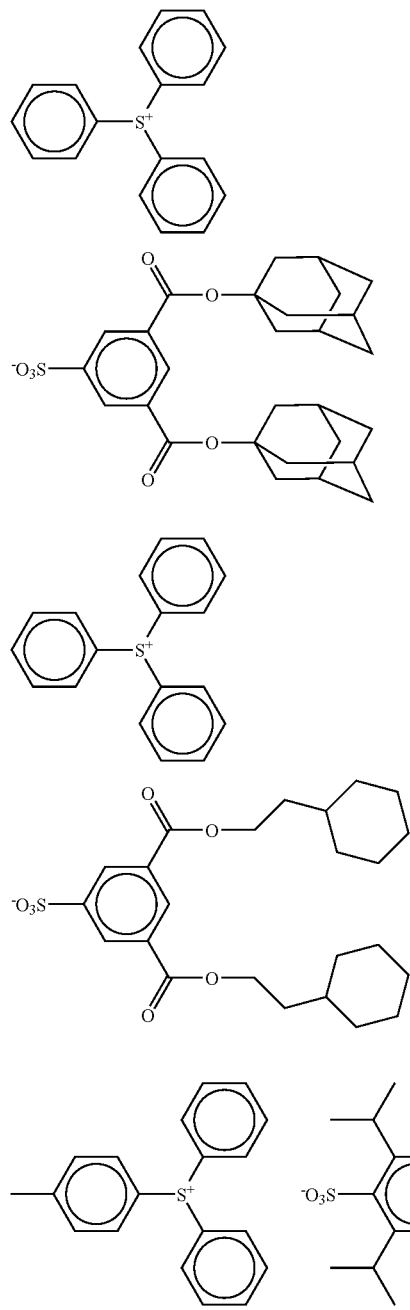
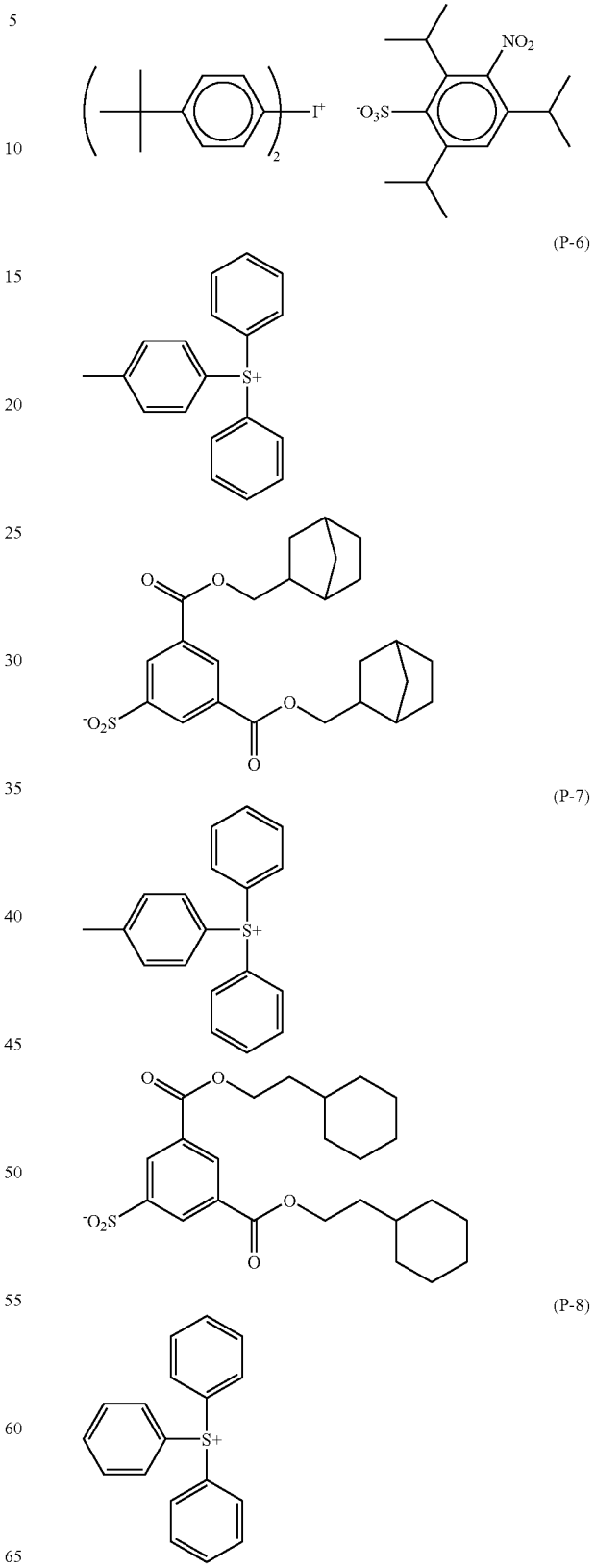

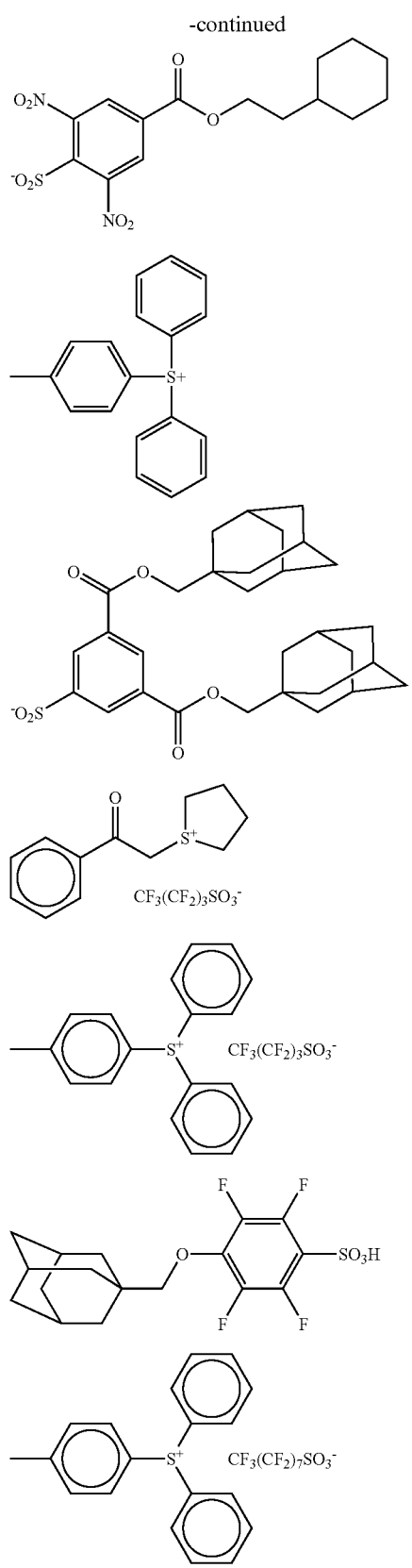

N-1: N,N-dibutylaniline
N-2: Tetrabutylammonium hydroxide
N-3: 2,6-Diisopropylaniline
N-4: Tri-n-octylamine
N-5: N,N-Dihydroxyethylaniline
N-6: N,N-dihexylaniline
W-1: "Megaface F176" (trade name; product of Dainippon Ink & Chemicals) (fluorine-containing)
W-2: "Megaface R08" (trade name; product of Dainippon Ink & Chemicals) (fluorine- and silicon-containing)
W-3: Polysiloxane polymer "KP-341" (trade name; product of Shin-Etsu Chemical) (silicon-containing)
W-4: "Troysol S-366" (trade name; product of Troy Corporation)
W-5: "PF656" (trade name; product of OMNOVA, fluorine-containing)
W-6: "PF6320" (trade name; product of OMNOVA, fluorine-containing)
SL-1: Cyclohexanone
SL-2: Propylene glycol monomethyl ether acetate
SL-3: 2-Heptanone
SL-4: Propylene glycol monomethyl ether
SL-5: γ-Butyrolactone
SL-6: Propylene carbonate It is apparent from the results shown in Table 2 that the photosensitive compositions of the invention are excellent in followability of water during immersion exposure and have reduced line edge roughness.

The invention provides a positive resist composition causing less line edge roughness due to normal exposure or immersion exposure and excellent in followability of water during immersion exposure; and a pattern forming method using the composition.

The entire disclosure of each and every foreign patent application from which the benefit of foreign priority has been claimed in the present application is incorporated herein by reference, as if fully set forth.

What is claimed is:
1. A positive photosensitive composition comprising:
(A) a resin that has an acid decomposable repeating unit represented by formula (I) and increases its solubility in an alkali developer by action of an acid;
(B) a compound generating an acid in irradiation with actinic light or radiation;
(C) a resin that contains neither fluorine nor silicon and has at least one repeating unit selected from repeating units represented by formulas (C-I) to (C-III); and
(D) a solvent, wherein, in the formula (I),
$Xa_1$ represents a hydrogen atom, an alkyl group, a cyano group or a halogen atom,
$Ry_1$ to $Ry_3$ each independently represents an alkyl group or a cycloalkyl group, and at least two of $Ry_1$ to $Ry_3$ may be coupled to form a ring structure, and
Z represents a divalent linking group,

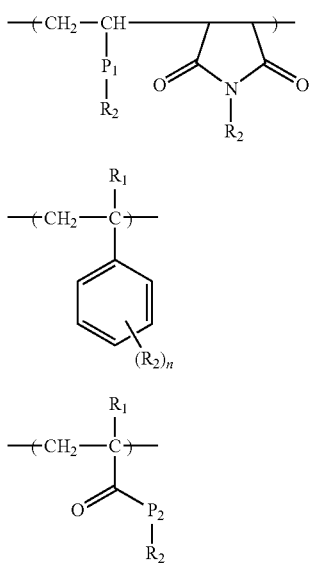

wherein, in the formulas (C-I) to (C-III),
$R_1$s each independently represents a hydrogen atom or a methyl group,
$R_2$s each independently represents a hydrocarbon group having at least one —$CH_3$ partial structure,
$P_1$ represents a single bond or a linking group having an alkylene group, an ether group or two or more thereof,
$P_2$ represents a linking group selected from —O—, —NR— (in which R represents a hydrogen atom or an alkyl group) and —$NHSO_2$—, and
n stands for an integer from 1 to 4; and
wherein the amount of the resin (C) is from 0.1 to 5 mass % based on total solids content of the composition.

2. A positive resist composition according to claim 1,
wherein Z in the formula (I) is a divalent linear hydrocarbon group or a divalent cyclic hydrocarbon group.

3. A positive resist composition according to claim 1,
wherein the resin (A) further has a repeating unit having at least one group selected from a lactone group, a hydroxyl group, a cyano group and an acid group.

4. A positive resist composition according to claim 1,
wherein the compound (B) comprises a compound generating an acid represented by formula (BII):

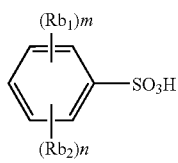

wherein, in the formula (BII),
$Rb_1$ represents a group having an electron withdrawing group,
$Rb_2$ represents an organic group having no electron withdrawing group,
m and n each stands for an integer from 0 to 5 with the proviso that m+n≦5, when m stands for 2 or greater, a plurality of $Rb_1$s may be the same or different, and
when n stands for 2 or greater, a plurality of $Rb_2$s may be the same or different.

5. A positive resist composition according to claim 4,
wherein in the formula (BII), m stands for from 1 to 5 and the electron withdrawing group of $Rb_1$ is at least one atom or group selected from a fluorine atom, a fluoroalkyl group, a nitro group, an ester group, and a cyano group.

6. A positive resist composition according to claim 1,
wherein the resin (C) further has a repeating unit represented by formula (C):

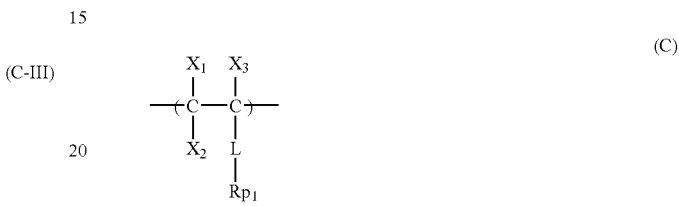

wherein, in the formula (C),
$X_1$, $X_2$ and $X_3$ each independently represents a hydrogen atom, an alkyl group, or a halogen atom,
L represents a single bond or a divalent linking group, and
$Rp_1$ represents an acid decomposable group.

7. A positive resist composition according to claim 6,
wherein the repeating unit represented by the formula (C) is a repeating unit represented by formula (C1).

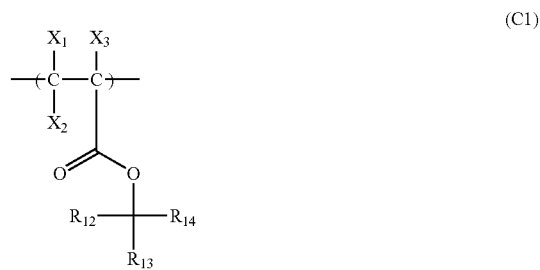

wherein, in the formula (C1),
$X_1$, $X_2$ and $X_3$ each independently represents a hydrogen atom, an alkyl group, or a halogen atom, and
$R_{12}$, $R_{13}$ and $R_{14}$ each independently represents an alkyl group, a cycloalkyl group, an alkenyl group, or an aryl group with the proviso that at least one of $R_{12}$, $R_{13}$ and $R_{14}$ represents an alkyl group, or two of $R_{12}$, $R_{13}$ and $R_{14}$ may be coupled to form a ring.

8. A positive resist composition according to claim 1, for use in exposure to light having a wavelength of 200 nm or less.

9. A pattern forming method comprising:
forming a resist film with a positive resist composition as claimed in claim 1; and
exposing and developing the resist film.

10. A pattern forming method according to claim 9,
wherein the resist film is exposed via an immersion liquid.

* * * * *